United States Patent
Maeda

(10) Patent No.: US 7,137,092 B2
(45) Date of Patent: Nov. 14, 2006

(54) LAYOUT METHOD OF SEMICONDUCTOR INTEGRATED CIRCUIT, LAYOUT STRUCTURE THEREOF, AND PHOTOMASK FOR FORMING THE LAYOUT STRUCTURE

(75) Inventor: Jun Maeda, Mihama-ku (JP)

(73) Assignee: Kawasaki Microelectronics, Inc., Chiba (JP)

( * ) Notice: Subject to any disclaimer, the term of this patent is extended or adjusted under 35 U.S.C. 154(b) by 161 days.

(21) Appl. No.: 10/914,162

(22) Filed: Aug. 10, 2004

(65) Prior Publication Data

US 2005/0044522 A1 Feb. 24, 2005

(30) Foreign Application Priority Data

Aug. 21, 2003 (JP) .............................. 2003-297545

(51) Int. Cl.
*G06F 17/50* (2006.01)

(52) U.S. Cl. .............................. 716/8; 716/10; 716/19; 10/19

(58) Field of Classification Search .............. 716/8–11, 716/18–19
See application file for complete search history.

(56) References Cited

U.S. PATENT DOCUMENTS

| | | | |
|---|---|---|---|
| 5,278,105 A | 1/1994 | Eden et al. | |
| 5,656,834 A | 8/1997 | Grzyb et al. | |
| 5,705,301 A | 1/1998 | Garza et al. | |
| 5,723,233 A | 3/1998 | Garza et al. | |
| 5,847,421 A | 12/1998 | Yamaguchi | |
| 5,885,856 A | 3/1999 | Gilbert et al. | |
| 6,189,136 B1 | 2/2001 | Bothra | |
| 6,194,252 B1 * | 2/2001 | Yamaguchi | ................. 438/129 |
| 6,260,177 B1 * | 7/2001 | Lee et al. | ....................... 716/2 |
| 6,553,553 B1 * | 4/2003 | Komaki | ........................ 716/10 |
| 6,563,148 B1 | 5/2003 | Kawashima et al. | |
| 6,567,964 B1 | 5/2003 | Shin et al. | |
| 6,603,162 B1 | 8/2003 | Uchiyama et al. | |
| 6,635,935 B1 | 10/2003 | Makino | |
| 6,693,315 B1 | 2/2004 | Kuroda et al. | |
| 6,925,627 B1 * | 8/2005 | Longway et al. | ............. 716/13 |

(Continued)

FOREIGN PATENT DOCUMENTS

JP A-7-335844 12/1995

(Continued)

OTHER PUBLICATIONS

Diagram of a Portion of a Standard Cell Array; Kawasaki Microelectronics, 2002.

*Primary Examiner*—Stacy A. Whitmore
(74) *Attorney, Agent, or Firm*—Oliff & Berridge, PLC

(57) ABSTRACT

A plurality of standard cells 10 are arranged to form a channel-less standard cell array 1, which has vertical and horizontal sides. A plurality of first proximity dummy cells 20 are arranged along each of the vertical sides of the standard cell array to form a first proximity dummy bands 20 such that the upper and lower sides of the first proximity dummy cells are in contact with each other and such that the left or right side of each of the first proximity dummy cells is in contact with the vertical side of the standard cell array 1. Furthermore, a plurality of second proximity dummy bands are arranged along each of the horizontal sides of the standard cell array to form a second proximity dummy bands such that the upper or lower side of each of the second proximity dummy cells is in contact with the horizontal side of the standard cell 1.

28 Claims, 24 Drawing Sheets

U.S. PATENT DOCUMENTS

| | | | |
|---|---|---|---|
| 6,996,764 B1* | 2/2006 | Yamada | 714/755 |
| 2001/0004122 A1 | 6/2001 | Ito | |
| 2001/0056569 A1* | 12/2001 | Komaki | 716/10 |
| 2002/0199162 A1* | 12/2002 | Ramaswamy et al. | 716/8 |
| 2003/0135835 A1* | 7/2003 | Komaki | 716/10 |
| 2004/0044983 A1* | 3/2004 | Dillon et al. | 716/21 |

FOREIGN PATENT DOCUMENTS

| | | |
|---|---|---|
| JP | A-9-289251 | 11/1997 |
| JP | A-2001-144171 | 5/2001 |
| JP | A-2002-009161 | 1/2002 |
| JP | A-2002-313937 | 10/2002 |

* cited by examiner

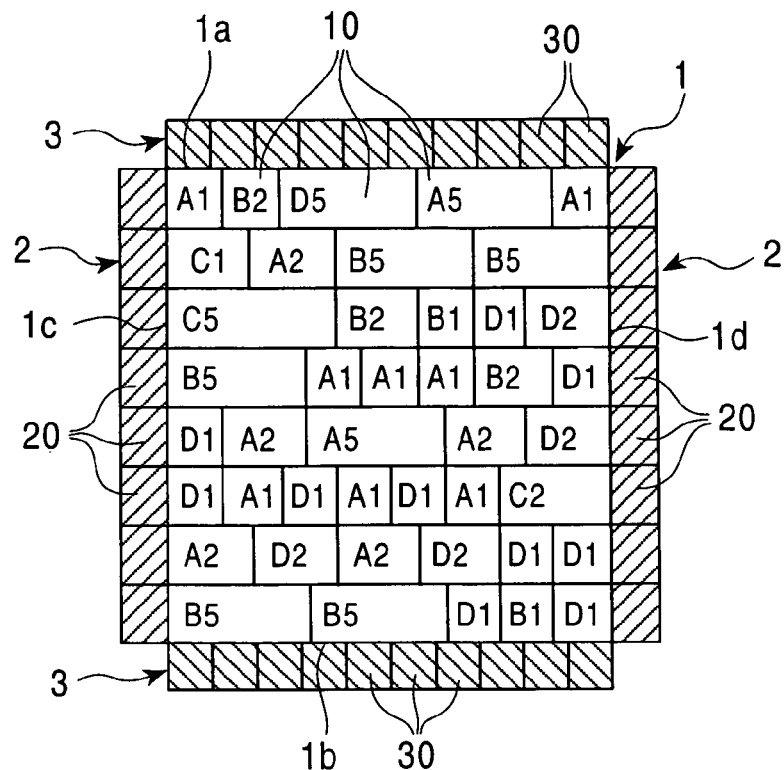

WIDTH OF CELL =
UNIT WIDTH (CONTACT PITCH) × 3

WIDTH OF CELL = UNIT WIDTH × 3

WIDTH OF CELL = UNIT WIDTH × 5

LAYOUT METHOD OF SEMICONDUCTOR INTEGRATED CIRCUIT, LAYOUT STRUCTURE THEREOF, AND PHOTOMASK FOR FORMING THE LAYOUT STRUCTURE

BACKGROUND OF THE INVENTION

1. Field of Invention

The present invention relates to a layout method of a semiconductor integrated circuit, performed on a computer, a layout structure of a semiconductor integrated circuit designed with the layout method, and a photomask used for manufacturing a semiconductor integrated circuit having the layout structure.

2. Description of Related Art

For designing layouts of semiconductor integrated circuits, standard cell methods have been widely used with the advance of CAD (Computer Aided Design) tools. According to a standard cell method, a plurality of standard cells having circuit patterns for realizing basic logical functions such as an NAND gate, a flip-flop, and the like, are designed, and operations of the standard cells are verified beforehand. Thus, designed and verified standard cells are registered in a library. The user selects specific standard cells for realizing desired logical functions from the library, and arranges these cells so as to be electrically interconnected to one another on a CAD tool, whereby a semiconductor integrated circuit having desired logical functions is thus designed.

With conventional techniques, in general, a plurality of standard cell rows, each of which is formed of a plurality of standard cells, are formed. Then, the plurality of standard cell rows is arranged with wiring channels between them, whereby a two-dimensional array of the standard cells (which will be referred to as "standard-cell array" hereafter) is thus formed. However, recently available multilevel interconnections of five layers or more, for example, allows the interconnection of the standard cells without forming the wiring channels. Thus, "channel-less" type standard cell arrays, in which the standard cells are two-dimensionally arranged in rows and columns without the wiring channels are becoming widespread. See Japanese Unexamined Patent Application Publication No. 2002-313937 (Patent Document 1), for example.

Hereafter, the direction wherein a plurality of standard cells is arranged so as to form a standard cell row will be referred to as the horizontal direction in this application. Moreover, the direction perpendicular to the horizontal direction in the same plane, i.e., the direction wherein the plurality of standard cell rows are arranged so as to form a standard cell array, will be referred to as "vertical direction". Furthermore, the dimension of the standard cell in the horizontal direction will be referred to as a "width", and the dimension in the vertical direction will be referred to as "height" hereafter.

The standard cells forming a channel-less type standard cell array disclosed in Patent Document 1 have the same common height, and different widths that correspond to their functions. According to Patent Document 1, the standard cells are arranged along a plurality of parallel lines, whereby a plurality of standard cell rows with the same "width H" (which corresponds to the "height" in this application) are formed. The spaces between the adjacent standard cell rows are removed by sharing the power supply wiring and the ground wiring with the adjacent standard cell rows. Thus, a channel-less type standard cell array is formed.

On the other hand, the process margin is constantly decreasing with the rapid advance of fine patterning used for manufacturing semiconductor integrated circuits. In particular, while processing in an area where the patterns having the same dimension are arranged with a uniform density can be made with relative ease, it is generally extremely difficult to make processing in an area with sufficient precision where the patterns have low uniformity.

For example, the portion within a standard cell array contains device patterns of the standard cells, e.g., gate layer patterns, with high density. Accordingly, the patterns are arranged with high uniformity in this area. However, the patterns are arranged in the area outside of the standard cell array at a very low density compared with the area within the standard cell array. Accordingly, it is difficult to achieve processing of device patterns with sufficient precision in the outer-most portions of the standard cell array.

In a case where exposing light irradiates a semiconductor substrate having a positive-type photo resist layer, through a mask having a mask pattern, ideally, the exposing light does not irradiate the area where the mask pattern is provided. Therefore, the resist layer on these areas is not exposed.

However, in reality, some of the exposing light reaches even the area on the semiconductor substrate where the mask pattern is provided, due to scattering of the exposing light passing through the space between the mask patterns. As a result, the resist in the area, which is not to be exposed, is partially exposed. With the decrease of the pattern dimension, such unintended exposure of the resist layer becomes a significant problem.

Even in such a situation, the region having high uniformity of pattern density, e.g., the region within the inner portion of the standard cell array, can be processed with sufficient precision. That is, correction of the mask pattern by giving consideration to the resist pattern deformations due to the scattered light, or an optical proximity correction (OPC), can be effectively performed to the region having high uniformity of pattern density. In addition, the optimization of exposure conditions may also be effective for the region having high uniformity of pattern density.

However, at the outermost portion of the standard cell array, a greater amount of the unintended exposure occurs because of the scattering of the exposing light that passes through the area outside of the standard cell array, which has a low pattern density. As a result, a greater deformation of the resist pattern occurs at the outermost portion of the standard cell array compared to the internal portion. Even in such a region, the mask pattern could be extensively corrected correspondingly to the large resist pattern deformation. However, such extensive correction generally leads to a reduction of process margin. That is, this leads to the problem of the resist pattern becoming susceptible to significant dimensional deviation due to deviation in the exposure light intensity, the deviation of the focus, and so on, over the exposed area. As a result, the resist pattern formed at the outermost portion of the standard cell array has in general a much poorer precision compared to the inner portion of the standard cell array.

A technique is known in which "dummy" patterns are arranged in regions having small pattern density, i.e., the regions having no device patterns, in order to improve the flatness of the surface of a semiconductor integrated circuit. See Japanese Unexamined Patent Application Publication No. 2002-9161 (Patent Document 2), for example. The dummy pattern provides no logical function for the semiconductor integrated circuit.

With the technique disclosed in Patent Document 2, two data are separately created on a CAD tool. The first one is a data in which the dummy pattern cells each having a dummy pattern are arranged over the entire chip area where the device structures of the semiconductor integrated circuit is to be formed. The second one is a data in which device patterns for realizing logical functions of the semiconductor integrated circuit, such as active region patterns, well patterns, gate electrode patterns, and so on, are arranged in the same chip area. Subsequently, these two data of the chip area are superimposed by logical synthesizing, whereby a data of the chip area, in which both of the device patterns and the dummy cells are arranged, is created. It should be noted that, in the logical synthesizing, the dummy cells that overlap the device patterns are deleted. In general, on the chip area thus designed, the dummy cells are arranged so as to surround the device patterns.

However, in the technique disclosed in Patent Document 2, there is a need to maintain a margin between the dummy pattern and the device pattern for ensuring an electrical isolation between the two patterns and for accounting for any error in the mask alignment. Accordingly, dummy cells are deleted over a region larger than the region where the device patterns are arranged by a certain margin. This procedure leads to the creation of a gap between the device pattern and the dummy cell.

Furthermore, there is no relationship between the layout of the dummy cells and the layout of the device pattern. That is, there is no relationship between the grids used in the CAD tool on which the dummy cells are placed and the grids on which the device patterns are placed. Accordingly, the size of the gap between the device pattern and the dummy cell remaining after they are superimposed on each other differs for each device pattern.

Accordingly, even if the dummy pattern arranging technique disclosed in Patent Document 2 is applied to a standard cell array disclosed in Patent Document 1, gaps with varying sizes will be formed between the standard cells arranged in the outermost portion of the standard cell array and the dummy cells.

In such a layout, while the uniformity of pattern density is improved as compared to a layout having no dummy pattern, the uniformity is not enough to be used in advanced fine patterning technology. Accordingly, the combination of these conventional technologies presents difficulties in achieving processing with the high precision required for further advanced fine-patterning technology.

Furthermore, a great amount of calculations are required for the logical synthesizing in the technique disclosed in Patent Document 2. Accordingly, an extremely long time is required for the layout design.

SUMMARY OF THE INVENTION

This invention has been made in order to solve the aforementioned problems. It is an object of this invention to provide a layout method, or a method of forming, on a computer system, a layout structure of a semiconductor integrated circuit which suppresses the deviation in dimensions of fine patterns. It is also an objective of this invention to provide a layout structure of a semiconductor integrated circuit designed with the above-mentioned layout method, and a photomask used for manufacturing a semiconductor integrated circuit having the above-mentioned layout structure.

It is a further object of this invention to provide a layout method for designing a layout structure of semiconductor integrated circuit in a short period of time with little or no logical synthesizing.

In order to solve the aforementioned problems, a method of forming a layout structure of a semiconductor integrated circuit according to an exemplary embodiment of this invention, includes preparing a first plurality of standard cells having respective logical functions, a first proximity dummy cell, and a second proximity dummy cell in a library.

According to various exemplary embodiments, each of the first plurality of standard cells includes standard cell patterns in a plurality of layers arranged in a standard cell frame having an upper, a lower, a left, and a right side. The first plurality of standard cells have a common height defined by the distances between the upper and the lower sides of the standard cell frames. The first proximity dummy cell includes a first proximity dummy pattern, which does not contribute to a logical function of the semiconductor integrated circuit, in at least one of the plurality of layers arranged in a first proximity dummy cell frame having an upper, a lower, a left, and a right side. The first proximity dummy cell has a height defined by a distance between the upper and the lower sides of the first proximity dummy cell frame of $k_1$ times the common height of the standard cells, where $k_1$ is an integer that is not less than one. The second proximity dummy cell includes a second proximity dummy pattern, which does not contribute to the logical function of the semiconductor integrated circuit, in the at least one of the plurality of layers arranged in a second proximity dummy cell frame having an upper, a lower, a left, and right side.

According to various exemplary embodiments, the method also includes selecting a second plurality of standard cells required for realizing the logical function of the semiconductor integrated circuit from the first plurality of standard cells, forming a channel-less type standard cell array by arranging one or more of each of the second plurality of standard cells in rows and columns, an outer perimeter of the standard cell array having vertical and horizontal sides each formed with the sides of the frames of the standard cells arranged in the outermost portion of the standard cell array.

According to various exemplary embodiments, the method further includes: forming first proximity dummy bands by arranging a plurality of the first proximity dummy cells along each of at least some of the vertical sides of the standard cell array such that the upper and the lower sides of the frames of the plurality of first proximity dummy cells are in contact with each other and such that one of the left and the right sides of the frame of each of the plurality of proximity dummy cells is in contact with a corresponding portion of the vertical sides of the standard cell array, and forming second proximity dummy bands along each of at least some of the horizontal sides of the standard cell array by arranging a plurality of the second proximity dummy cells such that one of the upper and the lower sides of the frame of each of the plurality of second proximity dummy cells is in contact with a corresponding portion of the horizontal sides of the standard cell array.

The term "proximity dummy pattern" used here means a pattern which is formed in one or more of the plurality of layers in which the standard cell patterns are arranged, and does not contribute to the logical function of the semiconductor integrated circuit. The proximity dummy pattern is formed on a semiconductor substrate using the same photomask used for forming the standard cell pattern in the same layer. The term "channel-less type standard cell array" means a standard cell array in which a plurality of standard cell rows are closely arranged in the vertical direction without forming any channel regions between them.

In some exemplary cases, the channel-less type standard cell array is formed of the second plurality of standard cells alone, which are two-dimensionally arranged in rows and columns without any spaces between them. In this case, each standard cell row is formed of the standard cells alone, which are arranged in the horizontal direction without any spaces between them.

On the other hand, in some exemplary cases, at least some of the standard cell rows are formed of one or more auxiliary cells as well as of the plurality of standard cells. An auxiliary cell fill the space where the standard cells are not arranged and adjusts the length of the standard cell row. In this case, the channel-less type standard cell array is formed not only with the plurality of standard cells but also with one or more types of auxiliary cells, which are two dimensionally arranged in rows and columns.

Accordingly, while the horizontal side of the standard cell array is formed with the upper or lower sides of the frames of the standard cells arranged in the outer-most portion of the standard cell array, the horizontal side is not always formed with the upper or lower sides of the frames of the standard cells alone. The horizontal side of the standard cell array may also be formed with the upper or lower sides of the frames of the auxiliary cells in combination with the sides of the frames of the standard cells.

In the same way, while the vertical side of the standard cell array is formed with the left or right sides of the frames of the standard cells, the vertical side is not always be formed of the left or right sides of the frames of the standard cells alone. The vertical side of the standard cell array may also be formed with the left or right sides of the frames of the auxiliary cells in combination with the sides of the frames of the standard cells. Examples of the auxiliary cells include a cell for connecting the power-supply wiring patterns of the standard cells, a cell for increasing the capacitance between the power-supply wirings, and the like.

According to various exemplary embodiments in the method of forming a layout structure of semiconductor integrated circuit of this invention, the first proximity dummy bands and the second proximity dummy bands are formed by arranging a plurality of the first proximity dummy cells and a plurality of the second proximity dummy cells along the vertical sides and the horizontal sides of the standard cell array such that one of the sides of the frame of each of the proximity dummy cells is in contact with a corresponding portion of the sides of the standard cell array. Such an arrangement of the proximity dummy cells can be performed using an automatic placing/routing function of a CAD tool, which is also used to arrange the standard cells. That is, the layout method does not require any logical synthesizing, thereby reducing the time for designing the layout structure.

According to various exemplary embodiments, the first proximity dummy cell, which is to be arranged along the vertical side of the standard cell array, preferably has a height of $k_1$ times the common height of the standard cell, where $k_1$ is an integer not less than one. In practice, the height of the first proximity dummy cell is preferably made to be equal to the common height of the standard cells. In such cases, the automatic placing/routing function of the CAD tool easily arranges the plurality of first proximity dummy cells along the vertical side of the standard cell array such that the upper and lower sides of the frames of the plurality of first proximity dummy cells are in contact with each other.

Furthermore, because the proximity dummy cells are arranged such that one of the sides of the frame of each of the proximity dummy cells is in contact with a corresponding portion of the sides of the standard cell array, the proximity dummy cells are arranged along the sides of the standard cell array without forming any gaps between them. Accordingly, the proximity dummy pattern can be arranged near the pattern of the standard cell at the outer-most portion of the standard cell array with a generally constant positional relationship, which is similar to the positional relationship between the patterns of adjacent ones of the standard cells at the inner portion of the standard cell array.

As a result, the pattern density at the outermost portion of the standard cell array can be increased so as to be generally the same as that in the inner portion of the standard cell array. Accordingly, the uniformity of pattern density can be improved over the entire portion of the standard cell array. Furthermore, the pattern regularity, which will be described later, may also be improved. Thus, at the time of forming the layout structure of a semiconductor integrated circuit on a semiconductor substrate designed by the layout method according to various exemplary embodiments of this invention, the first and the second proximity dummy bands keep the influence by the scattering of the exposing light generally constant over the entire area of the standard cell array. As a result, processing precision is improved and the deviation in the pattern dimension is reduced.

According to various exemplary embodiments, in order to improve the uniformity of pattern density over the entire area of the standard cell array, it is preferable to arrange the proximity dummy cells and form the proximity dummy bands along the entire length of the side or sides of the standard cell array. Especially, it is preferable to arrange the proximity dummy cells along the entire length of the side or sides that extend the entire height or width of the standard cell array. It is further preferable to arrange the proximity dummy cells and form the proximity dummy bands along all of the sides of the standard cell array. That is, according to various exemplary embodiments, it is most preferable to form the proximity dummy bands along the entire lengths of all of the sides of the standard cell array, so that the proximity dummy bands surround the entirety of the outer perimeter of the standard cell array.

For example, when the standard cell array is formed in a rectangular shape, having vertical sides that extend the entire height of the standard cell array and horizontal sides that extend the entire width of the standard cell array, it is preferable to arrange the proximity dummy cells along the entire length of the vertical sides and the horizontal sides of the standard cell array. However, in the actual semiconductor integrated circuit, the standard cell array may be arranged in combination with other components. According to various exemplary embodiments, some of the sides, or some portions of some of the sides, of the standard cell array may face patterns of other components. In such cases, the object of this invention may be accomplished even if the proximity dummy bands are not formed along the entire lengths of all of the sides of the standard cell array.

According to various exemplary embodiments, the standard cell includes the standard cell pattern in a plurality of layers. On the other hand, the proximity dummy pattern of the proximity dummy cell needs not be arranged in all of the layers in which the standard cell patterns are arranged. It is generally sufficient to arrange the proximity dummy pattern in one or some of the layers that requires high precision processing. In practice, the proximity dummy pattern is preferably arranged in at least the gate layer.

The proximity dummy cell is prepared to include a proximity dummy pattern having suitable shape and size for improving the uniformity of pattern density and, preferably, also for improving the regularity of the pattern, when a plurality of the proximity dummy cells is arranged along the side of the standard cell array. In general, the proximity dummy pattern may be made to be similar to the pattern of the standard cell in the same layer in order to achieve this object.

For the gate layer, for example, in many cases, the standard cell has one or more line patterns extending in the vertical direction. Accordingly, the proximity dummy pattern preferably includes one or more line patterns extending in the vertical direction. The proximity dummy pattern is preferably formed with generally the same size in the vertical direction as that of the standard cell pattern, or with a size in the vertical direction that is as large as possible according to the layout design rule. The formation of such proximity dummy pattern effectively improves the uniformity of pattern density and the pattern regularity.

It should be noted that it is well known in the art that the patterns should be arranged in the layout structure of a semiconductor integrated circuit according to the known layout design rule in order to ensure the continuity of the patterns, the electrical isolation between adjacent patterns, and the like. The layout design rule is determined according to the process technology used to manufacture the semiconductor integrated circuit. In this case, the size of the proximity dummy pattern in the vertical direction is limited by the layout design rule in order to ensure a good electrical isolation between the patterns in another proximity dummy cell or in the standard cell arranged adjacently in the vertical direction. On the other hand, the width, or the size in the horizontal direction, of the proximity dummy pattern in the gate layer is preferably larger compared to that of the standard cell pattern.

In general, the gate pattern of the standard cell has a width close to the minimum width allowed by the photolithographic technology available for the manufacturing of the semiconductor integrated circuit. In general, an optical proximity correction (OPC) is performed for the mask pattern for forming such a fine pattern so as to correct pattern deformation occurring at the time of transferring the mask pattern onto a semiconductor substrate. That is, at the time of converting the layout data on a CAD tool into the mask pattern data, the CAD tool detects portions having dimensions lower than a critical dimension, for which the OPC is required, and data processing is performed to correct the detected portions according to a given OPC rule. A great amount of calculations and time is required for the processing. Furthermore, the data processing increases the mask data size, and increases the time and cost for producing the mask.

If the proximity dummy pattern has about the same width as the standard cell pattern, data processing by the OPC is performed for the proximity dummy pattern as well. Thus, the time necessary to create the mask pattern data is increased, and consequently the mask data size increases. Accordingly, the proximity dummy pattern is preferably made to have a width larger than that of the standard cell pattern, or a width not smaller than the critical dimension, so that the OPC is not performed for the proximity dummy pattern. Thereby, the mask data size does not increase, and the cost and time for producing the mask is reduced.

However, on the other hand, if the width of the proximity dummy pattern is made too large, i.e., far larger than the width of the standard cell pattern, the improvement of the pattern regularity is compromised. Accordingly, the width of the proximity dummy pattern should preferably be made as small as possible, as long as it is not smaller than the critical dimension for the OPC. Specifically, a width of around twice the wavelength of the exposing light, or smaller, is preferable. Also, a width of around the wavelength of the exposing light, or smaller, is even more preferable.

In the method of forming a layout structure of semiconductor integrated circuit according to an exemplary embodiment of this invention, the standard cell patterns may include internal portions arranged within the standard cell frame and external portions arranged outside of the standard cell frame, and the forming of the standard cell array is performed such that the external portions of the standard cell patterns in each of the standard cells merge with the internal portions of the standard cell patterns in adjacent ones of the standard cells arranged in the standard cell array.

For the standard cells, a rule is set for the layout of patterns in various layers so that a channel-less type standard cell array can be formed by arranging the plurality of standard cells in rows and columns such that no gaps are formed between them, or such that the vertical and the horizontal sides of the frames of the standard cells can be put in contact with each other. For example, when the standard cells are arranged in rows and columns adjacent to each other, N-well and P-well patterns arranged in the standard cells according to the layout rule merge with each other at the boundaries between them. The same layout rule, or the common layout rule, is preferably applied also to the proximity dummy cells. As a result, the automatic placing/routing function of the CAD tool easily arranges the proximity dummy cells such that the sides of the proximity dummy cells are in contact with corresponding portions of the sides of the standard cell array.

Accordingly, in the method of forming a layout structure according to an exemplary embodiment of this invention, each of the standard cells prepared in the library preferably includes an N-well pattern in an N-well layer and a P-well pattern in a P-well layer arranged in the vertical direction. Moreover, the first proximity dummy cell includes a first dummy N-well pattern in the N-well layer and a first dummy P-well pattern in the P-well layer, and the second proximity dummy cell includes at least one of a second dummy N-well pattern in the N-well layer and a second dummy P-well pattern in the P-well layer.

According to various exemplary embodiments, the forming of the first proximity dummy bands is performed such that the first dummy N-well pattern and the first dummy P-well pattern in each of the plurality of first proximity dummy cells merge with the N-well pattern and the P-well pattern, respectively, in one of the standard cells arranged in the outermost portion of the standard cell array. Also, the forming of the second proximity dummy bands is performed such that the one of the second dummy N-well pattern and the second dummy P-well pattern in each of the plurality of second proximity dummy cells merges with one the N-well pattern and the P-well pattern in one or more of the standard cells arranged in the outer-most portion of the standard cell array.

The layout rule is also set, for the standard cells, for the power-supply wiring patterns in the wiring layer, active region patterns underneath the power-supply wiring patterns, the contact patterns in the contact layer for connecting the power-supply wiring patterns and the active region patterns, and so on, so that these patterns merge with each other at the boundaries between the adjacent standard cells. Applying the same layout rule to the proximity dummy cells allows the proximity dummy cells to be easily arranged along the sides of the standard cell array such that one of the sides of the frame of each of the proximity dummy cells is in contact with a corresponding portion of the sides of the standard cell array.

Accordingly, in the method of forming a layout structure of semiconductor integrated circuit according to an exemplary embodiment of this invention, each of the standard cells prepared in the library preferably includes a pair of power-supply wiring patterns in a wiring layer extending along the upper and the lower sides, respectively, of the standard cell frame and passing through the standard cell frame in the horizontal direction. Also, the second proximity dummy cell includes a dummy power-supply wiring pattern in the wiring layer. Forming of the second proximity dummy bands is performed such that the dummy power-supply wiring pattern in each of the plurality of second proximity dummy cells merges with one of the pair of power-supply wiring patterns in one of the standard cells arranged in the outer-most portion of the standard cell array.

Moreover, in the method of forming a layout structure of a semiconductor integrated circuit according to an exemplary embodiment of this invention, each of the standard cells prepared in the library preferably includes a pair of active region patterns in an active layer underneath the respective power-supply wiring patterns, and contact patterns in a contact layer that connect the active region patterns with the respective power-supply wiring patterns, the contact patterns are arranged along the upper and the lower sides of the standard cell frame. Also, the second proximity dummy cell includes dummy contact patterns in the contact layer. The forming of the second proximity dummy bands is performed such that the contact patterns in each of the plurality of second proximity dummy cells merge with the contact patterns of one or more of the standard cells arranged in the outermost portion of the standard cell array.

It should be noted that, when a side of the standard cell array, along which the plurality of proximity dummy cells are arranged, is formed with the sides of the standard cells alone, all of the proximity dummy cells arranged along the side of the standard cell array become adjacent to the corresponding standard cells. When the side of the standard cell array is formed with the sides of the standard cell and the sides of one or more auxiliary cells, however, one or some of the proximity dummy cells are adjacent to the auxiliary cells, but not adjacent to the standard cells.

Needless to say, the dummy patterns in such proximity dummy cells, which are not arranged adjacent to the standard cells, do not merge with the corresponding patterns in the standard cells. That is, only the dummy pattern or patterns in each of the proximity dummy cells which is arranged adjacent to one of the standard cells arranged in the outermost portion of the standard cell array merges with the corresponding pattern or patterns in one or more of the standard cells.

Usually, however, the common layout rule is also applied to the auxiliary cells, and the dummy patterns in such proximity dummy cells that are adjacent to the auxiliary cells merge with the corresponding patterns in the auxiliary cells.

Also preferably, forming of the standard cell array arranges the standard cells such that the upper and the lower sides of the standard cell frames are in contact with horizontal grid lines arranged in the vertical direction with a pitch equal to the common height of the standard cells. Moreover, forming of the first proximity dummy bands arranges the plurality of first proximity dummy cells such that the upper and the lower sides of the frames of the first proximity dummy cells are in contact with the horizontal grid lines.

Normally, standard cells are arranged on a CAD tool to form the standard cell array by making the upper and the lower sides of the frames of the standard cells in contact with horizontal grid lines. By making the upper and the lower sides of the first proximity dummy cells in contact with the same horizontal grid lines, automatic arrangement is enabled.

The method of forming a layout structure of a semiconductor integrated circuit according to an exemplary embodiment of this invention, preferably further includes preparing an outer dummy cell in the library. The outer dummy cell includes an outer dummy pattern, which does not contribute to the logical function of the semiconductor integrated circuit and which is different from each of the first and the second proximity dummy patterns, in the at least one of the plurality of layers arranged in an outer dummy cell frame having an upper, a lower, a left, and a right side. The method further includes forming an outer dummy region outside of the standard cell array and the first and the second proximity dummy bands by arranging a plurality of the outer dummy cells in rows and columns. Each of the first plurality of standard cells has a width defined by a distance between the left and the right sides of the standard cell frame of $m_S$ times a unit width, where $m_S$ is an integer not less than one, and the outer dummy cell has a height defined by a distance between the upper and the lower sides of the outer dummy cell frame of $k_o$ times the common height of the standard cells, where $k_o$ is an integer not less than one, and a width defined by a distance between the left and right sides of the outer dummy cell frame of $m_O$ times the unit width of the standard cells, where $m_o$ is an integer not less than one.

Forming the proximity dummy bands along the sides of the standard cell array improves the uniformity of pattern density over a short range. As a result, the dimensional deviation in the photolithographic process is reduced, and the resist pattern can be formed with high precision. However, there may be cases where arranging the proximity dummy bands alone cannot sufficiently improve the uniformity of the pattern density over a longer range when, for example, the pattern density in the region outside the proximity dummy bands is low. In such cases, dimensional variations may occur in the etching process using the resist pattern as a mask, resulting in the variation in transistor properties, and further in the variation in gate delay time.

According to an exemplary embodiment of this invention, the method of forming a layout structure of semiconductor integrated circuit further forms an outer dummy region outside of the standard cell array and the proximity dummy bands to improve the uniformity of pattern density over a long range. Thereby, the dimensional variation in the etching process and the gate delay time variation are suppressed.

Moreover, the outer dummy region may preferably be formed by arranging a plurality of outer dummy cells having a height of $k_o$ times the common height of the standard cells, where $k_o$ is an integer not less than one, and a width of $m_O$ times the unit width of the standard cells, where $m_o$ is an integer not less than one. Accordingly, arranging the outer dummy cell by using the automatic placing/routing function of a CAD tool can form the outer dummy region, without the need for logical synthesizing. Thus, the layout design can be performed within a short period of time.

A layout structure of a semiconductor integrated circuit according to an exemplary embodiment of this invention for realizing these goals includes a channel-less type standard cell array formed by arranging one or more of each of a plurality of standard cells having respective logical functions in rows and columns, an outer perimeter of the standard cell array having vertical and horizontal sides, first proximity dummy bands formed by arranging a plurality of first proximity dummy cells along each of at least some of the vertical sides of the standard cell array and second proximity dummy bands formed by arranging a plurality of second proximity dummy cells along each of at least some of the horizontal sides of the standard cell array.

According to various exemplary embodiments, each of the plurality of types of standard cells includes standard cell patterns in a plurality of layers arranged in a standard cell frame having an upper, a lower, a left, and a right side, the plurality of types of standard cells have a common height defined by distances between the upper and the lower sides of the standard cell frames. Moreover, each of the vertical and horizontal sides of the standard cell array is formed with the sides of the frames of the standard cells arranged in an outermost portion of the standard cell array. Each of the first proximity dummy cells includes a first proximity dummy pattern, which does not contribute to a logical function of the semiconductor integrated circuit, in at least one of the plurality of layers arranged in a first proximity dummy cell frame having an upper, a lower, a left, and a right side, each of the first proximity dummy cells has a height defined by a distance between the upper and the lower sides of the first proximity dummy cell frame of $k_1$ times the common height of the standard cells, where $k_1$ is an integer not less than one. Moreover, each of the second proximity dummy cells includes a second proximity dummy pattern, which does not contribute to the logical function of the semiconductor integrated circuit, in the at least one of the plurality of layers arranged in a second proximity dummy cell frame having an upper, a lower, a left, and a right side.

Each of the first proximity dummy bands is formed such that the upper and the lower sides of the frames of the plurality of first proximity dummy cells are in contact with each other and such that one of the left and right sides of the frame of each of the plurality of first proximity dummy cells is in contact with a corresponding portion of the vertical sides of the standard cell array. Moreover, each of the second proximity dummy bands is formed such that one of the upper and the lower sides of the frame of each of the plurality of second proximity dummy cells is in contact with a corresponding portion of the horizontal sides of the standard cell array.

According to various exemplary embodiments, the layout structure of semiconductor integrated circuit is a structure in which a plurality of layers of patterns making up a semiconductor integrated circuit are arranged within a chip area for forming the semiconductor integrated circuit. The layout structure is designed using a CAD tool, which is a computer system for layout design. At this stage, the layout structure is realized as a logical layout structure stored in a storage device, having a data structure that is readable by the computer system. Next, photomasks are produced based on the logical layout structure. Then, these masks are used to form a semiconductor integrated circuit on a semiconductor substrate having a physical layout structure corresponding to the logical layout structure. Accordingly, the layout structure of semiconductor integrated circuit according to an exemplary embodiment of this invention is realized as the logical layout structure in a storage device using a CAD tool, and is also realized as the physical layout structure within a semiconductor integrated circuit formed on a semiconductor substrate.

In the layout structure of semiconductor integrated circuit according to an exemplary embodiment of this invention, the first and the second proximity dummy bands are formed by arranging the plurality of first proximity dummy cells and the plurality of second proximity dummy cells along the sides of the standard cell array such that one of the sides of the frame of each of the proximity dummy cells is in contact with a corresponding portion of the sides of the standard cell array. Accordingly, no gap is formed between the sides of the standard cell array and the proximity dummy bands. When forming the semiconductor integrated circuit having the exemplary layout structure according to this invention on a semiconductor substrate, the first and the second proximity dummy bands thus improve the processing precision. Specifically, the deviation in pattern dimension can be suppressed even at the outermost portion of the standard cell array.

According to various exemplary embodiments, the proximity dummy pattern of the proximity dummy band is arranged in at least one of the layers in which the standard cell patterns are arranged. The proximity dummy pattern is made to be, for example, generally similar to the pattern of the standard cell in the same layer. Therefore, the uniformity of pattern density in that layer is improved over the entire standard cell array. Furthermore, the pattern regularity may also be improved. As a result, processing precision is effectively improved, and the deviation in pattern dimension is suppressed.

In the layout structure of semiconductor integrated circuit according to an exemplary embodiment of this invention, the standard cells in the standard cell array are preferably arranged such that the upper and the lower sides of the standard cell frames are in contact with imaginary horizontal grid lines arranged in the vertical direction with a pitch equal to the common height of the standard cells; and each of the first proximity dummy bands is formed such that the upper and the lower sides of the frames of the plurality of first proximity dummy cells are in contact with the imaginary horizontal grid lines. Therefore, automatic arrangement of the first proximity dummy cells is facilitated, and design of the layout structure within a short period of time is enabled.

Also, in the layout structure of semiconductor integrated circuit according to an exemplary embodiment of this invention, the layout structure is preferably formed on a semiconductor substrate by using a photolithographic process that utilizes an optical proximity correction (OPC). The standard cell patterns include, in the at least one of the plurality of layers, portions having dimensions that require an OPC, and the first and the second proximity dummy patterns have minimum dimensions that do not require any OPC.

That is, the proximity dummy pattern has a minimal dimension not less than the critical dimension under which the OPC is required. By keeping the dimension of the proximity dummy pattern within a range for which the OPC is not required, the increase in the mask data size, and the cost and time required for producing the mask, are reduced.

Furthermore, in the layout structure of semiconductor integrated circuit according to an exemplary embodiment of this invention, each of the first proximity dummy bands is preferably formed such that the left and the right sides of the frames of the plurality of second proximity dummy cells are in contact with each other. Therefore, the automatic arrangement of the second proximity dummy cells is facilitated.

Furthermore, in the layout structure of the semiconductor integrated circuit according to an exemplary embodiment of this invention, the first proximity dummy bands are preferably formed along all of the vertical sides and the second proximity dummy bands are formed along all of the horizontal sides of the standard cell array. Therefore, the uniformity of the dimension of the resist pattern is further improved over the entire standard cell array.

Furthermore, in the layout structure of the semiconductor integrated circuit according to an exemplary embodiment of this invention, the same proximity dummy cell is preferably used as both the first and the second proximity dummy cells. Therefore, the number of types of proximity dummy cells to be prepared is reduced.

Furthermore, in the layout structure of the semiconductor integrated circuit according to an exemplary embodiment of this invention, preferably, each of the plurality of types of standard cells has a width defined by a distance between the left and the right sides of the standard cell frame of $m_s$ times a unit width, where $m_s$ is an integer not less than one. Moreover, the standard cells in the standard cell array are arranged such that the left and right sides of the standard cell frames are in contact with imaginary vertical grid lines arranged in the horizontal direction with a pitch equal to the unit width of the standard cells. Each of the second proximity dummy cells has a width defined by a distance between the left and the right sides of the second proximity dummy cell frame of $m_2$ times the unit width of the standard cells, where $m_2$ is an integer not less than one, and each of the second proximity dummy bands is formed such that the left and the right sides of the frames of the plurality of second proximity dummy cells are in contact with the imaginary vertical grid lines. Therefore, automatic arrangement of the second proximity dummy cell is facilitated.

According to various exemplary embodiments of this invention, the unit width of the standard cells may be made to be equal to or greater than the pitch at which a plurality of contacts, for connecting patterns in different layers to each other, can be placed along the horizontal direction within the standard cell array. Also, the unit width of the standard cells may be made to be equal to or greater than the pitch at which a plurality of wiring lines in the vertical direction can be placed along the horizontal direction within the standard cell array.

Furthermore, in the layout structure of a semiconductor integrated circuit according to an exemplary embodiment of this invention, preferably, the first proximity dummy cell has a width of $m_1$ times the unit width of the standard cells, where $m_1$ is an integer not less than one. Therefore, automatic arrangement of the first proximity dummy cells is facilitated.

Furthermore, in the layout structure of semiconductor integrated circuit according to an exemplary embodiment of this invention, in general, the standard cell array includes at least one type of auxiliary cell that fills a space where the standard cells are not arranged.

Also, the layout structure of a semiconductor integrated circuit according to an exemplary embodiment of this invention preferably includes, in addition to the proximity dummy bands, an outer dummy region formed by arranging a plurality of outer dummy cells. The outer dummy cell includes an outer dummy pattern, which does not contribute to the logical function of the semiconductor integrated circuit, in the layer in which the proximity dummy pattern is arranged. The outer dummy region improves the uniformity of pattern density over a long range, and improves the processing precision in the etching process.

A photomask according to an exemplary embodiment of this invention includes a mask pattern for forming one of a plurality of layers in a layout structure of a semiconductor integrated circuit by producing a reduced image of the mask pattern on a semiconductor substrate using an exposing light having a wavelength of λ. The layout structure includes a channel-less type standard cell array formed by arranging one or more of each of a plurality of types of standard cells having respective logical functions in rows and columns, an outer perimeter of the standard cell array having vertical and horizontal sides, first proximity dummy bands formed by arranging a plurality of first proximity dummy cells along each of at least some of the vertical sides of the standard cell array, and second proximity dummy bands formed by arranging a plurality of second proximity dummy cells along each of at least some of the horizontal sides of the standard cell array.

Each of the plurality of types of standard cells includes standard cell patterns in the plurality of layers arranged in a standard cell frame having an upper, a lower, a left, and a right side, the plurality of types of standard cells have a common height defined by distances between the upper and the lower sides of the standard cell frames. Each of the vertical and horizontal sides of the standard cell array is formed with the sides of the frames of the standard cells arranged in an outermost portion of the standard cell array.

According to various exemplary embodiments, each of the first proximity dummy cells includes a first proximity dummy pattern, which does not contribute to a logical function of the semiconductor integrated circuit, in at least one of the plurality of layers arranged in a first proximity dummy cell frame having an upper, a lower, a left, and a right side, each of the first proximity dummy cells has a height defined by a distance between the upper and lower sides of the first proximity dummy cell frame of $k_1$ times the common height of the standard cells, where $k_1$ is an integer not less than one. Moreover, each of the second proximity dummy cells includes a second proximity dummy pattern, which does not contribute to the logical function of the semiconductor integrated circuit, in the at least one of the plurality of layers arranged in a second proximity dummy cell frame having an upper, a lower, a left, and a right side.

Each of the first proximity dummy bands is formed such that the upper and the lower sides of the frames of the plurality of first proximity dummy cells are in contact with each other and such that one of the left and the right sides of the frame of each of the plurality of first proximity dummy cells is in contact with a corresponding portion of the vertical sides of the standard cell array. Also, each of the second proximity dummy bands is formed such that one of the upper and the lower sides of the frame of each of the plurality of second proximity dummy cells is in contact with a corresponding portion of the horizontal sides of the standard cell array.

Using the photomask according to an exemplary embodiment of this invention enables, when forming the pattern of the standard cell array on the semiconductor substrate, to transfer the mask pattern onto the semiconductor substrate with precision, and to form a resist pattern with reduced dimensional deviation. That is, because the first and the second proximity dummy bands are formed along the sides of the standard cell array such that one of the sides of the frame of each of the proximity dummy cells is in contact with a corresponding portion of the sides of the standard cell array, no gap is formed between the side of the standard cell array and the proximity dummy cell. As a result, the uniformity of pattern density is improved even at the outermost portion of the standard cell array. Thereby, the precision of the photolithographic process is improved and the dimensional deviation in the resist pattern is reduced.

In other words, using the photomask according to an exemplary embodiment of this invention reduces the deviation in the dimension of the resist pattern, and enables manufacturing of semiconductor integrated circuits with small variations in properties, such as, for instance, gate delay time.

Also, in the photomask according to an exemplary embodiment of this invention, an optical proximity correction (OPC) is preferably performed for first portions of the mask pattern for forming the standard cell array in the layout structure, but is not performed for second portions of the mask pattern for forming the first and the second proximity dummy bands in the layout structure.

In this embodiment, OPC is performed for the mask patterns for forming patterns of the standard cell array. On the other hand, OPC is not performed for the mask patterns for forming patterns of the first and the second proximity dummy bands. Accordingly, increase in the mask data size is eliminated, and the cost and time for producing the photomasks is reduced.

In the practical photomask according to an exemplary embodiment of this invention, $\lambda$ is preferably not longer than 248 nm and OPC is performed for, within the first portions, third portions of the mask pattern for forming portions of the standard cell patterns having dimensions less than a critical dimension which is less than $\lambda$. Also, in the practical photomask according to an exemplary embodiment of this invention, minimum dimensions of the first and the second proximity dummy patterns are preferably not larger than $2\times\lambda$.

Furthermore, in the photomask according to an exemplary embodiment of this invention, the layout structure preferably includes, in addition to the standard cell array and the proximity dummy bands, an outer dummy region formed by arranging a plurality of outer dummy cells outside the standard cell array and the first and the second proximity dummy bands. Therefore, the dimensional deviation in the etching process, which uses the resist pattern, which is formed by photolithographic process using the photomask, as a mask, is reduced.

Thus, exemplary embodiments of this invention provide a method which enables to form a layout structure of a semiconductor integrated circuit on a computer in a short period of time, the layout structure of a semiconductor integrated circuit designed by the layout method, which can be formed on a semiconductor substrate with high dimensional precision, thus eliminating deviation in the pattern dimension and a photomask used for forming a semiconductor integrated circuit having the layout structure on a semiconductor substrate.

BRIEF DESCRIPTION OF THE DRAWINGS

Various exemplary embodiments of the systems and methods of this invention will be described in detail, with reference to the following figures, wherein:

FIG. 1 is a diagram illustrating an exemplary layout structure of semiconductor integrated circuit according to an exemplary embodiment of this invention;

FIG. 2 is a schematic diagram illustrating a plurality of exemplary standard cells classified with their functions and driving capabilities according to an exemplary embodiment of this invention;

DETAILED DESCRIPTION OF PREFERRED EMBODIMENTS

Figure 3:
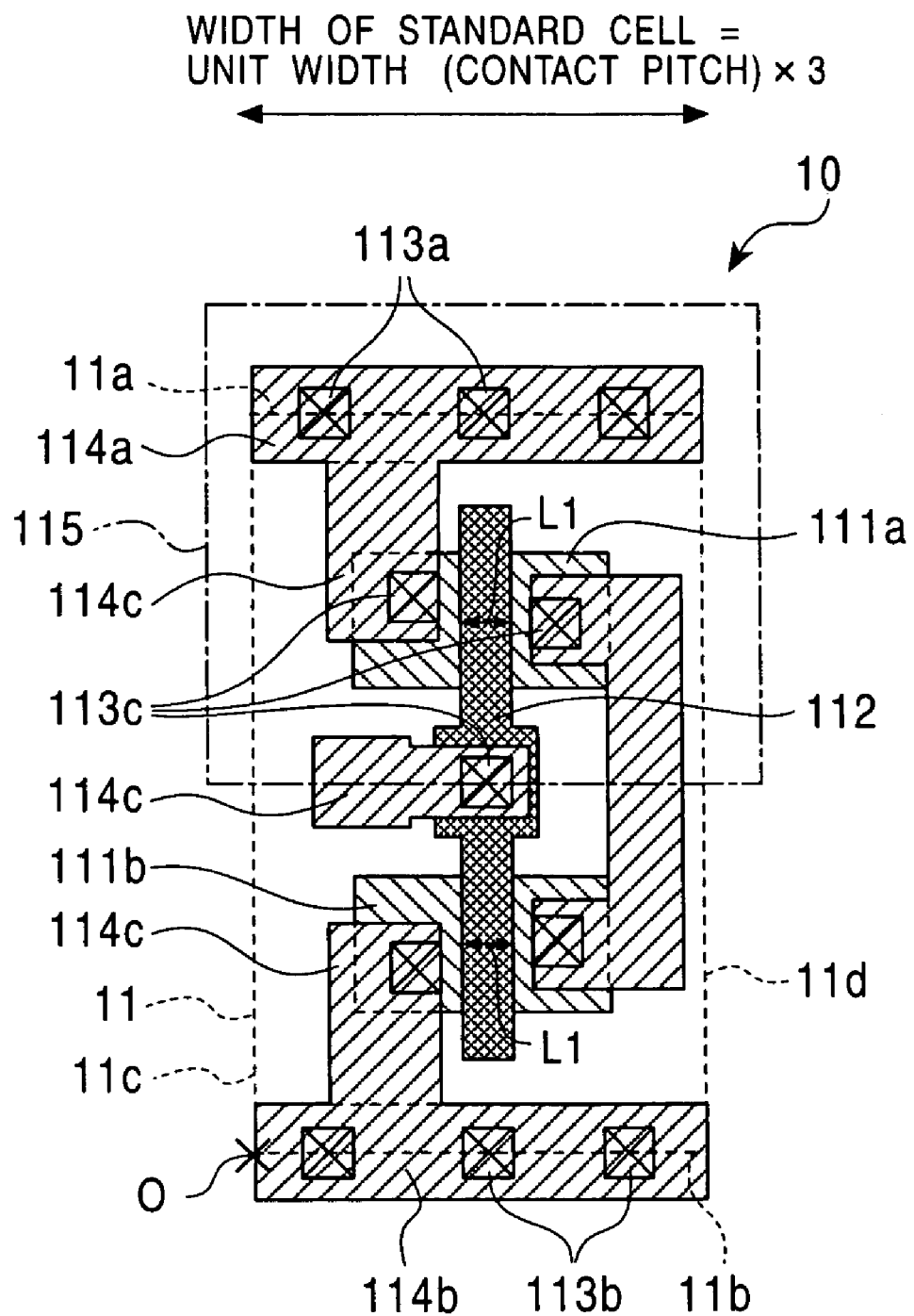
FIG. 3 is a diagram illustrating an exemplary pattern layout of a standard cell having inverter function with a unit driving capability according to an exemplary embodiment of this invention.

This invention was first described in Japanese Patent Application No. 2003-297545, which is hereby incorporated by reference in its entirety. Description will be made regarding exemplary embodiments according to this invention with reference to the drawings.

FIG. 1 is a diagram illustrating an exemplary layout structure of semiconductor integrated circuit according to an exemplary embodiment of this invention.

FIG. 1 illustrates a layout structure including a standard cell array 1, first proximity dummy bands 2 along the vertical sides of the standard cell array, and second proximity dummy cells 30 along the horizontal sides of the standard cell array. Arranging a plurality of standard cells 10 in rows and columns forms the standard cell array 1. Arranging a plurality of first proximity dummy cells 20 form the first proximity dummy bands 2, and arranging a plurality of second proximity dummy cells 30 forms the second proximity dummy bands 3.

According to various exemplary embodiments, each of the standard cells 10 has a circuit pattern (standard cell pattern) and has a basic logical function such as gate, flip-flop, or the like. The standard cell 10 has been designed and its function has been verified beforehand. On the other hand, each of the first and the second proximity dummy cells 20 and 30 have a "dummy" pattern (proximity dummy pattern) but has no logical function. In other words, the proximity dummy pattern does not contribute to the logical function of the semiconductor integrated circuit.

According to various exemplary embodiments, user designs such a layout structure using a CAD tool, which is a kind of computer system for designing a layout structure. In this step, the layout structure is created as a logical layout structure having a data structure that can be read by a computer system, and can be stored in a storage device. Next, masks for photolithographic processing are produced based upon the logical layout structure. Then, a semiconductor integrated circuit having a physical layout structure corresponding to the logical layout structure is formed on a semiconductor substrate using the masks.

According to various exemplary embodiments, physical layout structure of the semiconductor integrated circuit has a multi-layered structure. That is, patterns of a plurality of layers such as an active layer, a gate layer, a wiring layer, and so on, are stacked on a semiconductor substrate. Accordingly, the logical layout structure data stored in the storage device also includes a plurality of data sets each of which corresponds to a single-layer pattern data set.

According to various exemplary embodiments, when making the masks, the logical layout structure data including the plurality of data sets are separated by processing on a computer into a plurality of data sets, each of which corresponds to a single-layer structure data. Then, a plurality of masks for forming a physical pattern of the corresponding layers on a semiconductor substrate is produced. Accordingly, a set of masks each having a mask pattern, which corresponds to a logical pattern of a specific layer in the logical layout structure, and which is to be used to form a physical pattern of the corresponding layer on a semiconductor substrate, is made. For example, the mask pattern is formed on the surface of a quartz glass substrate, with a masking material layer of chromium.

According to various exemplary embodiments, each one of the standard cells 10 has patterns (standard cell patterns) in a plurality of layers required for realizing the logical function of the standard cell. FIG. 1 illustrates the standard cell array 1 formed of a plurality of types of standard cells 10 arranged in rows and columns. Each of the first and the second proximity dummy cells 20 and 30 has a pattern in at least one of the layers in the standard cell pattern. A plurality of first and second proximity dummy cells 20 and 30 are arranged along the upper, lower, left, and right sides of the standard cell array 1, whereby the first proximity dummy bands 2 and the second proximity dummy bands 3 are formed.

FIG. 2 illustrates a table of the types of standard cells for each function and driving capability according to various exemplary embodiments of this invention.

FIG. 2 illustrates a total of twelve types of standard cells 10 formed of the combinations of four functions and three levels of driving capabilities. According to various exemplary embodiments of this invention, function A represents a function of an inverter, function B represents a function of a buffer, function C represents a function of XOR gate, and function D represents a function of a NOR gate. Other functions of the standard cells may include a function of NAND gate, a function of a latch, a function of a counter, a function of multiplexer, and the like. Each of the standard cells 10 has the same height, or the common height, and a width corresponding to the driving capability.

Figure 4:
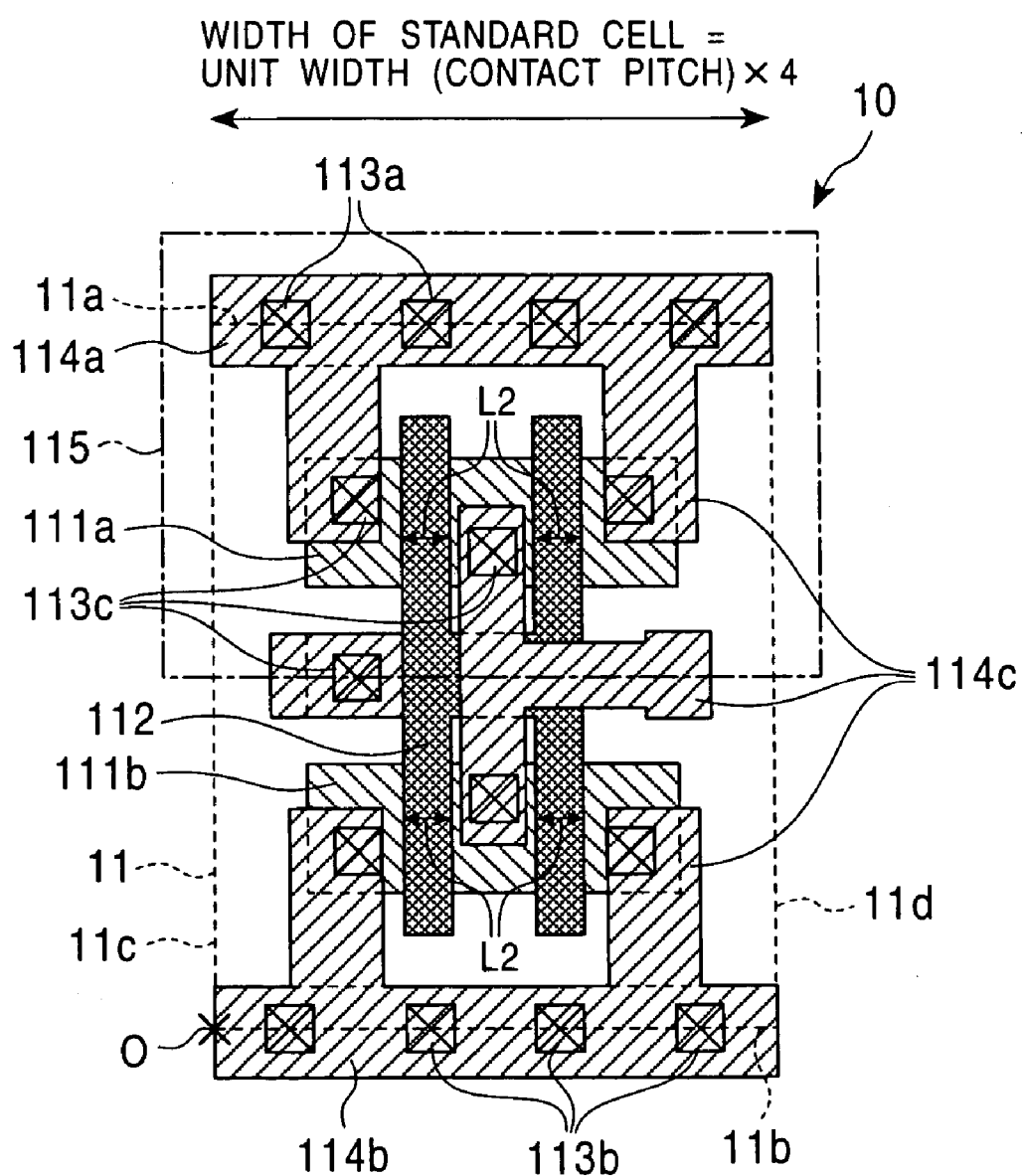
FIG. 4 is a diagram illustrating an exemplary pattern layout of a standard cell having inverter function with twice the unit driving capability according to an exemplary embodiment of this invention.
Figure 5:
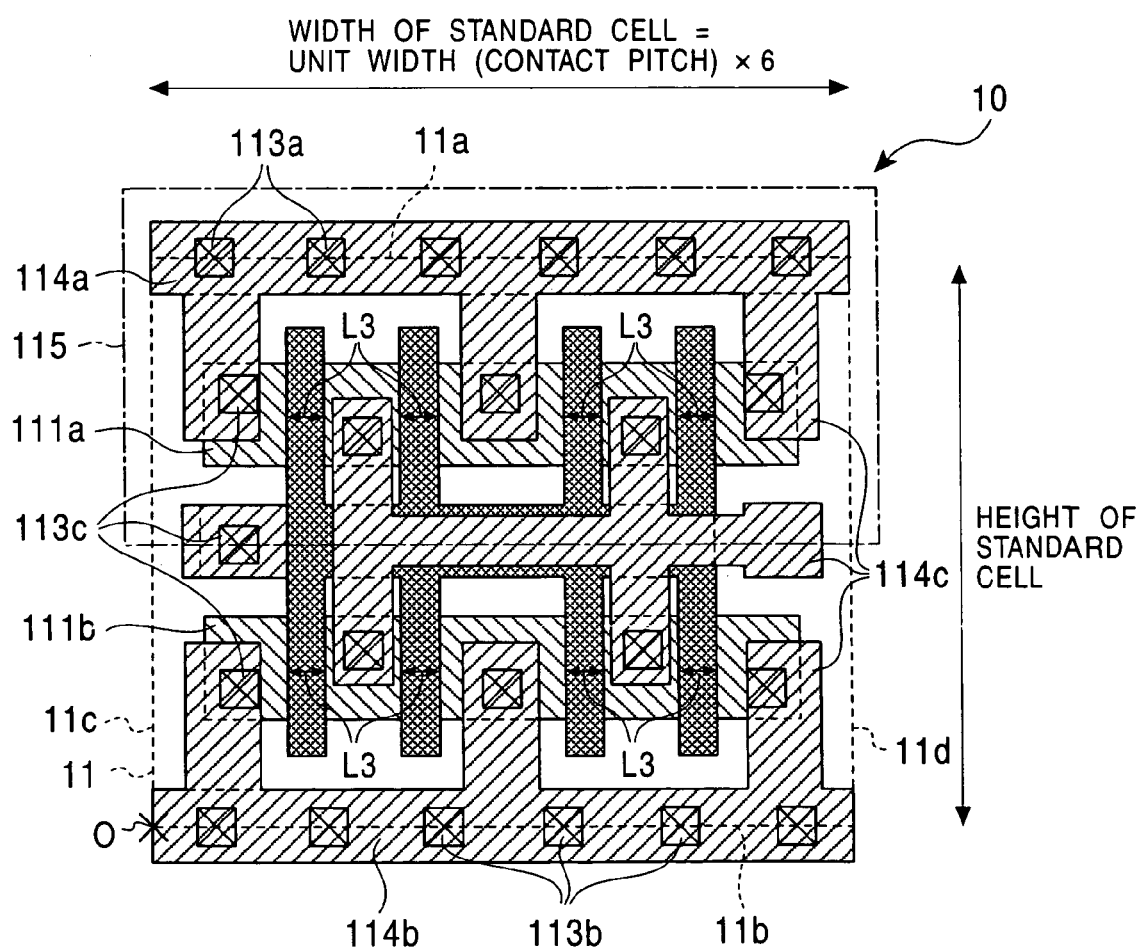
FIG. 5 is a diagram illustrating an exemplary pattern layout of a standard cell having inverter function with four times the unit driving capability according to an exemplary embodiment of this invention.

Next, a description will be made regarding a pattern layout within each standard cell. FIGS. 3 through 5 illustrate pattern layouts in a plurality of layers of three types of the standard cells having a function of an inverter according to various exemplary embodiments of this invention. The three types of standard cells have the same function as the inverter, but have differing driving capabilities, and accordingly, have widths differing from one another. That is, the standard cell shown in FIG. 3 has a unit driving capability. The standard cell shown in FIG. 4 has twice the unit driving capability. The standard cell shown in FIG. 5 has four times the unit driving capability.

The pattern layouts illustrated in FIGS. 3 through 5 include patterns in a plurality of layers. A user may combine the standard cells as shown in these pattern layouts and other components on a CAD tool, whereby the logical layout structure is formed. Then, as described above, the physical layout structure of a semiconductor integrated circuit is formed on a semiconductor substrate using the masks based upon the logical layout structure.

Accordingly, each of the pattern layouts shown in FIGS. 3 through 5 show a pattern layout in a plurality of layers in a part of the physical layout structure of a semiconductor integrated circuit formed on a semiconductor substrate, as well as the logical layout structure formed on a CAD tool. Other pattern layouts, which will be show in this specification, also show the physical layouts as well as the logical layouts.

It should be noted that, due to the limitation in the processing accuracy, the dimensions in the physical layout structure are not always completely identical to the dimensions in the corresponding logical layout structure. In addition, there are cases where the dimension in the physical layout structure is intentionally made different from that in the logical layout structure. For example, so called "trimming" procedure, in which the dimension of the resist pattern formed by the photolithographic process is decreased or trimmed by an exposure to oxygen plasma before etching a conductive material layer using the resist pattern as a mask, is performed in the formation of gate pattern. Specific dimensions of the patterns in the layout structure referred to in this specification correspond to the dimensions in the logical layout structure, if no mention to the contrary is made.

Each of the three standard cells 10 shown in FIGS. 3 through 5 have two active layer patterns and a gate layer pattern arranged within a frame 11 having an upper side 11*a*, a lower side 11*b*, a left side 11*c*, and a right side 11*d*. That is, the standard cells include a pattern of a region in the P+ active layer (a P+ active region pattern) 111*a* and a pattern of a region in the N+ active layer (N+ active region pattern) 111*b* arranged along the vertical direction, and a pattern in the gate layer (a gate pattern) 112 extending in the vertical direction overlapping the active region patterns 111*a* and 111*b*.

In the standard cells shown in these drawings, the height of the standard cell is defined by the distance between the upper and lower sides of the frame 11, and the width of the standard cell is defined by the distance between the left and right sides 11*c* and 11*d* of the frame 11. As explained above, the standard cells shown in FIGS. 3 through 5 has the common height. Furthermore, each of the standard cells 10 shown in FIGS. 3 through 5 has an N-well pattern 115. It should be noted that in the semiconductor integrated circuit formed on a semiconductor substrate, a P-well layer is formed on the semiconductor substrate in the region except for the region of the N-well pattern 115.

The mask pattern data for forming the P-well layer on a semiconductor substrate can be created by inverting the data of the N-well pattern data shown in FIGS. 3 through 5. Accordingly, there is no need to create a P-well pattern data in the logical layout structure designed on a CAD tool. However, even in such a case, the layout is designed based on the premise that the P-well pattern is formed based upon the inversed N-well pattern data.

Accordingly, it can be regarded that each of the logical layout structures shown in FIGS. 3 through 5 has a P-well pattern in the region except for the region of the N-well pattern. In each of the layout structures shown in FIGS. 3 through 5, the shown N-well pattern 115 and an unshown P-well pattern are arranged along the vertical direction. It should be noted that the N-well pattern 115 and the unshown P-well pattern are formed over the entire width of the standard cell 10.

In a semiconductor integrated circuit formed on a semiconductor substrate, a gate layer pattern overlaying an active region pattern forms a MOSFET. More specifically, on the upper portion of each standard cell, the gate layer pattern 112 is arranged over the P+ active region pattern 111*a* within the N-well pattern 115, whereby a P-channel MOSFET is formed. Furthermore, on the lower portion of each standard cell, the gate layer pattern 112 is arranged over the N+ active region pattern 112*b* within the unshown P-well pattern, whereby an N-channel MOSFET is formed. Thus, each of the inverters of the standard cells shown in FIGS. 3 through 5 includes a pair of an N-channel MOSFET and a P-channel MOSFET.

The gate length of each MOSFET is determined by the width (in the horizontal direction) of the gate pattern overlapping the active region pattern. In the logical layout structure stored in a storage device, each of the standard cells 10 shown in the drawings include a P-channel MOSFET and an N-channel MOSFET, formed with the same gate length. That is, in each one of the standard cells shown in FIGS. 3 through 5, the gate patterns 112 overlapping the P+ active region pattern 111*a* and the N+ active region pattern 111*b* are formed with the same width (the widths of L1 through L3 in the drawings).

In the standard cells for the 0.13 μm generation semiconductor integrated circuit, the width of the gate pattern L1 through L3 is 0.12 μm, for example. It should be noted that at the time of forming the physical pattern of the gate layer on a semiconductor substrate, a high level of precision to reduce the dimensional variation is required for reducing any variation in the transistor property.

On the other hand, the length (in the vertical direction) of the gate pattern 112 overlapping the active region pattern 111*a* and 111*b* determines the driving capability of the transistor. The standard cell shown in FIG. 4 includes two gate patterns, and the standard cell shown in FIG. 5 includes four gate patterns, while the standard cell shown in FIG. 3 includes only one gate pattern. In the standard cells shown in FIGS. 4 and 5, two and four gate patterns, respectively, are connected in parallel with each other. Accordingly, the MOSFETs in the standard cells shown in FIGS. 4 and 5 have respectively twice and four times the driving capability of the MOSFET in the standard cell shown in FIG. 3.

Each of the standard cells 10 shown in FIGS. 3 through 5 also includes contact patterns 113*c* in a contact layer stacked over the active region patterns 111*a* and 111*b* and the gate pattern 112. Each of the standard cells 10 further includes internal wiring patterns 114*c* in a wiring layer stacked over the contact patterns 113*c*. In the semiconductor integrated circuit formed on a semiconductor substrate, electrodes of each MOSFET are electrically connected with the internal wiring patterns 114*c* through the contact patterns 113*c*, whereby the standard cell 10 has the function of the inverter.

Furthermore, each of the standard cells 10 shown in FIGS. 3 through 5 includes contact patterns in the contact layer and power-supply wiring patterns in the wiring layer arranged along the upper and lower sides of the frame 11.

According to various exemplary embodiments, the power-supply wiring pattern includes a positive power-source wiring (Vdd) pattern 114a and a ground power-supply wiring (GND) pattern 114b. The positive power-supply wiring pattern extends along the upper side 11a of the frame 11 with its centerline matching the upper side 11a, and passes through the frame 11 in the horizontal direction. The ground power-supply wiring pattern 114b extends along the lower side 11b of the frame 11 with its centerline matching the lower side 11b, and passes through the frame 11 in the horizontal direction. That is, the positive power-supply wiring pattern 114a and the ground power-supply wiring pattern 114b extends in the horizontal direction along the upper and lower sides 11a and 11b, respectively, over the entire width of the standard cell 10. Furthermore, the standard cell 10 includes an unshown N+ active region pattern underneath the positive power-supply wiring pattern 114a, and an unshown P+ active region pattern underneath the ground power-supply wiring pattern 114b.

According to various exemplary embodiments, the contact patterns formed along the upper and lower sides of the frame 11 include contact patterns 113a formed along the upper side 11a of the frame 11, and contact patterns 113b formed along the lower side 11b of the frame 11. These contact patterns are formed with a predetermined pitch along the horizontal direction (see FIGS. 3 through 5). In the semiconductor integrated circuit formed on a semiconductor substrate, a positive power-supply voltage is applied to the N-well region through the N+ active region, the contacts 113a, and the positive power-supply wiring 114a, stacked in that order. Furthermore, the P-well region is grounded through the P+ active region, the contacts 113b, and the ground power-supply wiring 114b, stacked in that order.

According to various exemplary embodiments, the width of each of the standard cells shown in FIGS. 3 through 5 is m times a "unit width", where m is an integer not less than one. Specifically, the unit width is the pitch with which the contact patterns 113 are arranged along the upper and lower sides of the frame 11. As such, the standard cell 10 having the unit driving capability shown in FIG. 3 has a width of three times the unit width. The standard cell 10 having twice the unit driving capability shown in FIG. 4 has a width of four times the unit width, and the standard cell 10 having four times the unit driving capability shown in FIG. 5 has a width of six times the unit width. The unit width of the standard cells is not restricted to the aforementioned one. For example, a pitch on which vertical wiring (signal wiring) patterns are arranged for connecting the standard cells within the standard cell array may be employed as the unit width. In the standard cells for the 0.13 µm generation semiconductor integrated circuit, the common height and the unit width of the standard cells may be, for example, 3.2 µm and 0.42 µm, respectively. Furthermore, the origin "O", which is used as a reference point for the arrangement on a CAD tool, is determined for each standard cell 10 shown in the drawings.

According to various exemplary embodiments, the patterns in the standard cells 10 include internal portions that are arranged within the frame 11 and external portions that are arranged outside the frame 11. The internal portions of the pattern may include the active region patterns 111a and 111b, the gate pattern 112, the contact patterns 113c, the internal wiring patterns 114c, portions of the contact patterns 113a and 113b, which are arranged along the upper and lower sides 11a and 11b, within the frame 11, portions of the power-supply wiring patterns 114a and 114b within the frame 11, portions of the active region patterns arranged underneath the power-supply wiring patterns 114a and 114b within the frame 11, and portions of the N-well pattern 115 within the frame 11. On the other hand, the external portions may include portions of the contact patterns 113a and 113b outside of the frame 11, portions of the power-supply wiring patterns 114a and 114b outside of the frame 11, portions of the active region patterns underneath the power-supply wiring patterns 114a and 114b outside of the frame 11, and portions of the N-well pattern 115 outside of the frame 11. Of these patterns, the active region patterns 111a and 111b arranged within the frame, the gate pattern 112, the contact patterns 113c, and the internal wiring patterns 114c may vary based upon the function and the driving capability of each standard cell.

On the other hand, the power-supply wiring patterns 114a and 114b, the contact patterns 113a and 113b, and the unshown N+ active region pattern and P+ active-layer region pattern underneath the power-supply wiring patterns 114a and 114b, which are arranged along the upper and lower sides of the frame 11, are determined according to a common layout rule regardless of the function of the standard cell.

That is, the power-supply wiring patterns 114a and 114b extend over the entire width of the standard cell 10 in the horizontal direction along the upper and lower sides. The unshown N+ active region pattern and P+ active region pattern underneath the power-supply wiring patterns also extend over the entire width of the standard cell 10 in the same way as the power-supply wiring patterns. In addition, the contact patterns 113a and 113b between the power-supply wiring patterns and the active region patterns are arranged at a predetermined pitch along the upper and lower sides of the standard cell 10. Furthermore, the N-well pattern 115 and the unshown P-well pattern are arranged along the vertical direction in the standard cell according to the same rule regardless of the function of the standard cell. As a result, arranging desired ones of the standard cells 10 in rows and columns without making gaps between them forms the standard cell array 1.

As described above, the power-supply wiring patterns 114a and 114b, the contact patterns 113a and 113b, and the unshown N+ active region pattern and P+ active region pattern underneath the power-supply wiring patterns 114a and 114b and the N-well pattern 115 and the unshown P-well pattern are arranged according to the same rule regardless of the function of the standard cell 10. Thus, when a standard cell array 1 is formed by arranging any desired ones of the standard cells in rows and columns such that their frame sides are in contact with each other, these patterns of standard cells in each of the layers merge with each other. Detailed description about the merging of the patterns will be made below with reference to drawings.

It should be noted that the frames 11 of the standard cells 10 shown in FIGS. 3 through 5 are used for designing the standard cells 10 on a CAD tool. Furthermore, the frames 11 are used for designing the layout structure of the semiconductor integrated circuit having the standard cell array 1. That is, a CAD tool arranged the standard cells 10 with the height (the distance between the upper and lower sides 11a and 11b of the frame 11) and the width (the distance between the left and right sides 11c and 11d of the frame 11) as the references to form a standard cell array 1. It should be noted that, however, no physical structure is formed according to the frame 11 at the time of formation of the layout structure thus designed on a semiconductor substrate. That is, the frame 11 is imaginary. The frame of the proximity dummy cell or the like described later is also imaginary.

According to various exemplary embodiments, in the layout design, the plurality of types of standard cells 10 is registered in a library beforehand. A user selects and arranges, on a CAD tool, the standard cells required for realizing desired logical functions of the semiconductor integrated circuit. Because the patterns of the standard cell 10 have the external portions outside of the frame, the user can form the standard cell array simply by arranging the standard cells 10 even at the outermost portion of the standard cell array.

For example, in the standard cell array, power-supply wiring patterns extending over the entire width of the standard cell array in the horizontal direction, as well as a plurality of contact patterns arranged with a predetermined pitch for supplying electric power to the N-well patterns and the P-well patterns, are formed by arranging the standard cells 10 alone. Furthermore, within standard cell array 1, the external portions of the patterns of the standard cells merge with the internal portions of the patterns of adjacent ones of the standard cells. Thus, it is possible to arrange the standard cells 10 such that their upper, lower, left, and right sides of the frames are in contact with each other without forming gaps between them.

In the exemplary standard cells 10 shown in FIGS. 3 through 5, the unshown active region patterns underneath the power-supply wiring patterns 114*a* and 114*b* are formed with the same shapes as the power-supply wiring patterns 114*a* and 114*b*, respectively. However, the active region patterns may be formed in any shape as long as the power-supply patterns and the active region patterns overlap with each other so that the electric power can be supplied to the wells through the contact patterns 113*a* and 113*b*.

In the exemplary standard cells 10 shown in FIGS. 3 through 5, the contact patterns 113*a* and 113*b* are arranged with a predetermined pitch in the horizontal direction along the upper and lower sides 11*a* and 11*b* of the frame 11. However, the contact patterns may be arranged in various ways, as well. For example, it is possible to arrange the contact patterns on the four corners of the frame 11 of the standard cell 10 regardless of their width. In this case, the contact patterns 113*a* and 113*b* formed along the upper and lower sides 1 la and 11*b* are not arranged with a constant pitch in the horizontal direction. However, even with such a configuration, the contact patterns 113*a* and 113*b* are placed at some of the positions where the contact patterns may be placed, which is arranged in the horizontal direction with the unit width as a pitch, because the standard cells have widths of m times the unit width, where m is an integer greater than one. With such a configuration, the external portions of the power-supply wiring patterns 114*a* and 114*b* and the active region patterns underneath them are preferably modified so as to match the external portions of the contact patterns 113*a* and 113*b*, thereby enabling formation of the standard cell array simply by arranging the standard cells.

Now, further description will be made regarding formation of the standard cell array 1 with reference to FIG. 1. The exemplary standard cell array 1 shown in FIG. 1 has a configuration in which a plurality of standard cell rows, each of which are formed by arranging one or more of a plurality of types of standard cells in the horizontal direction, are arranged in the vertical direction. The standard cell rows are classified into even-numbered standard cell rows and odd-numbered standard cell rows. Among these two kinds of standard cell rows, one of them is formed by arranging the standard cells with the same pattern layouts as shown in FIGS. 3 through 5, and the other is formed by arranging the standard cells with the pattern layouts wherein the pattern layouts shown in FIGS. 3 through 5 are vertically flipped. In either case, the pattern layout of the standard cells may also be flipped in the horizontal direction.

In the exemplary standard cell array shown in FIG. 1, for example, when the standard cells in the first standard cell row from the top are arranged with the same pattern layouts as shown in FIGS. 3 through 5, the standard cells in the second standard cell row from the top is arranged with layout patterns wherein the pattern layouts shown in FIGS. 3 through 5 are vertically flipped. In the same way, the standard cells in the other odd-numbered rows from the top are arranged with the same pattern layouts as shown in FIGS. 3 through 5, and the standard cells in the other even-numbered rows from the top are arranged with layout patterns wherein the pattern layouts shown in FIGS. 3 through 5 are vertically flipped.

Figure 6:
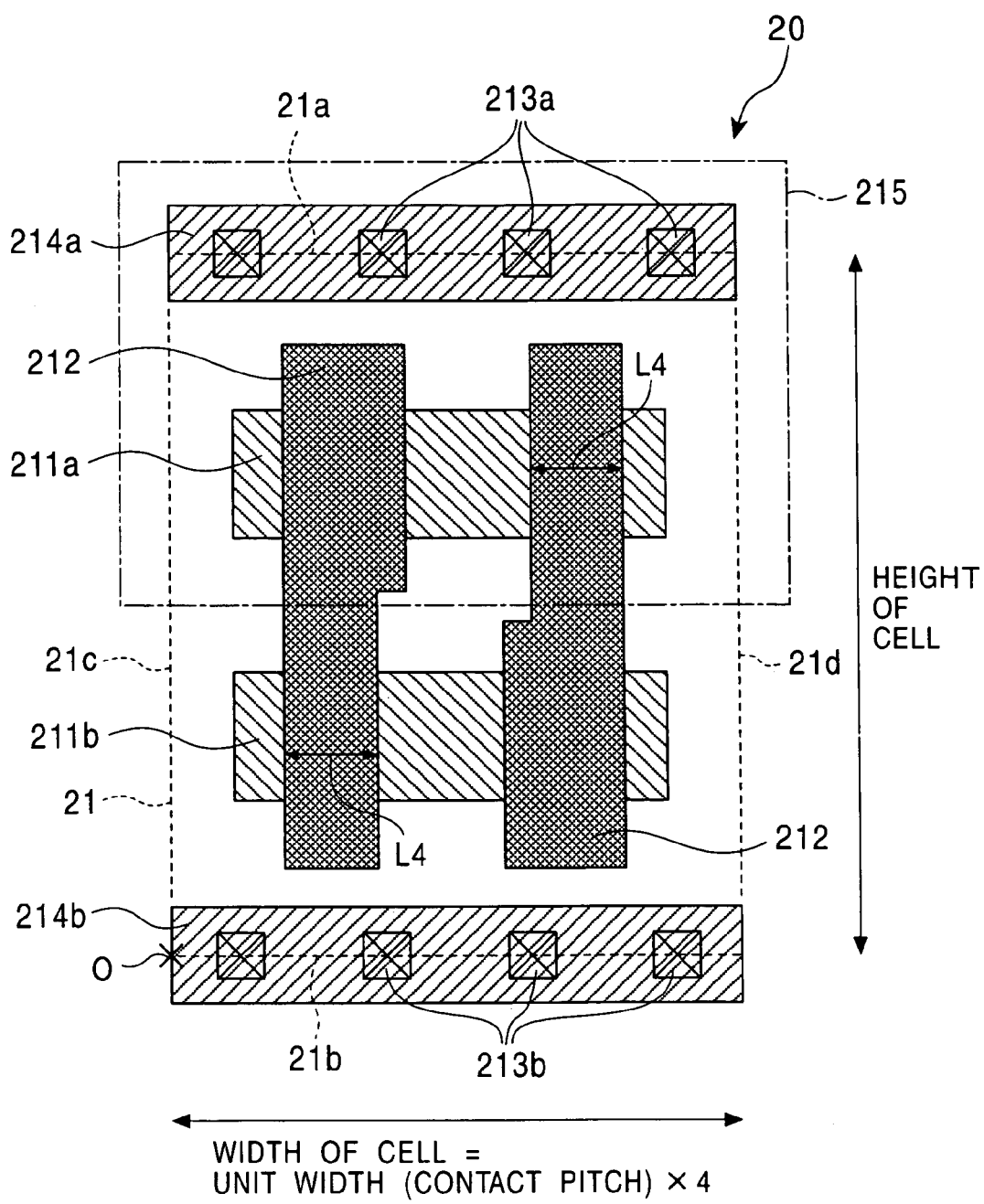
FIG. 6 is a diagram illustrating a pattern layout of an exemplary first proximity dummy cell shown in FIG. 1 according to an exemplary embodiment of this invention.

Next, description will be made regarding the proximity dummy cell. FIG. 6 is a diagram illustrating an exemplary pattern layout of the first proximity dummy cell 20 shown in FIG. 1. The exemplary first proximity dummy cell 20 shown in FIG. 6 includes a P+ active region pattern 211*a* and an N+ active region pattern 211*b* arranged in the vertical direction within a frame 21 having the upper, lower, left, and right sides 21*a* through 21*d*. The first proximity dummy cell 20 further includes two gate patterns 212 extending in the vertical direction, which are arranged in the horizontal direction.

The active region patterns 211*a* and 211*b* and the gate patterns 212 of the first proximity dummy cell 20 do not contribute to the logical function of the semiconductor integrated circuit. These patterns function merely as "dummy" patterns. In particular, the gate patterns 212 improve the uniformity of pattern density of the gate layer. In addition, the gate patterns 212 further improve the pattern regularity of the gate layer. These patterns in the proximity dummy cell will be referred to as "first proximity dummy patterns" hereafter.

According to various exemplary embodiments, the proximity dummy pattern in the gate layer 212 is formed with generally the same height (the dimension in the vertical direction) as that of the gate pattern 112 of the standard cell 10 shown in FIGS. 3 through 5, and with a width (the dimension in the horizontal direction) greater than that of the gate pattern 112 of the standard cell 10.

For example, in 0.13 μm generation semiconductor integrated circuits manufactured with the photolithographic process using an exposing light of a wavelength of 248 nm, the gate pattern 212 in the first proximity dummy cell may be designed with a minimal width (the width L4 shown in FIG. 6) of 0.20 to 0.24 μm, for example. This width is generally the same as or slightly smaller than the wavelength of the exposing light. Furthermore, the width is generally the same as or slightly smaller than twice the width of the gate pattern 112 (L1–L3) in the standard cells shown in FIGS. 3 through 5.

Figure 7:
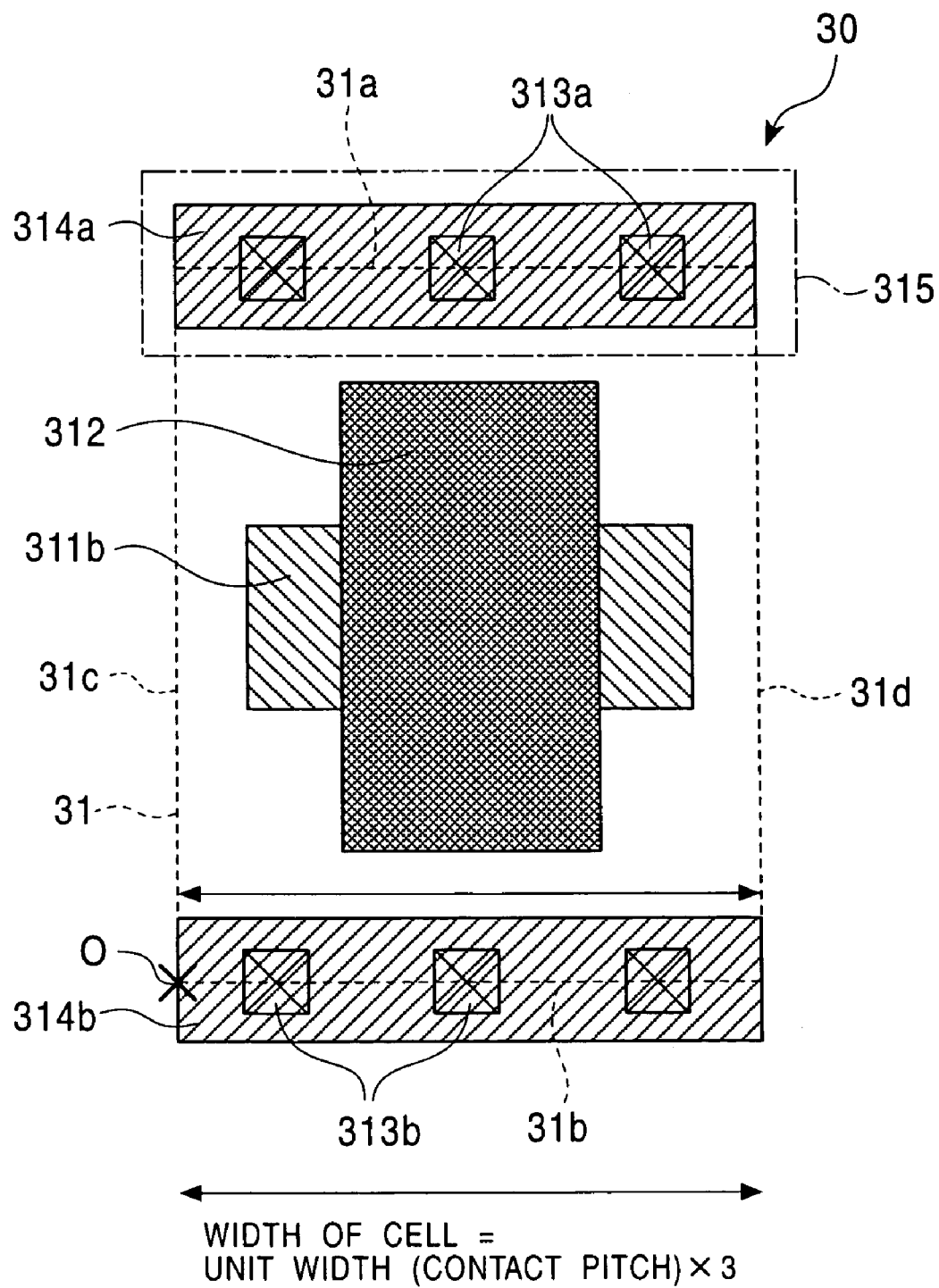
FIG. 7 is a diagram illustrating a pattern layout of an exemplary second proximity dummy cell shown in FIG. 1 according to an exemplary embodiment of this invention.

FIG. 7 is a diagram illustrating an exemplary pattern layout of the second proximity dummy cell 30 shown in FIG. 1. The exemplary second proximity dummy cell 30 includes an N+ active region pattern 311*b* within a frame 31 having an upper, a lower, a left, and a right sides 31*a* through 31*d*. Furthermore, the second proximity dummy cell 30 includes a gate pattern 312 extending in the vertical direction so as to overlap the N+ active region pattern 311*b*. Both the active region pattern 311*b* and the gate pattern 312 serve as dummy patterns, and will be referred to as "second proximity dummy patterns" hereafter.

Each of the proximity dummy cells 20 and 30 include power-supply wiring patterns, contact patterns, and unshown N+ and P+ active region patterns, and well patterns, arranged according to the same layout rule as with the standard cell. That is, the proximity dummy cell 20 (30) includes contact patterns 213*a* (313*a*) and a positive power-supply wiring pattern 214*a* (314*a*) along the upper side 21*a* (31*a*), and contact patterns 213*b* (313*b*) and a ground power-supply wiring pattern 214*b* (314*b*) along the lower side 21*b* (31*b*) of the frame. The positive power-supply wiring pattern 214*a* (314*a*) and the ground power-supply wiring pattern 214*b* (314*b*) extend in the horizontal direction over the entire width of the proximity dummy cell 20 (30).

Furthermore, the proximity dummy cell 20 (30) includes an unshown N+ active region pattern and an unshown P+ active region pattern underneath the positive power-supply wiring pattern 214*a* (314*a*) and the ground power-supply wiring pattern 214*b* (314*b*), respectively. The N+ active region pattern and the P+ active region pattern extend over the entire width of the proximity dummy cell, as well. On the other hand, the contact patterns 213*a* (313 a) and 213*b* (313*b*) are arranged with a constant pitch in the horizontal direction. Also, the proximity dummy cell 20 (30)includes an N-well pattern 215 (315) and an unshown P-well pattern, arranged in the vertical direction. The N-well pattern 215 (315) and the P-well pattern are formed so as to extend over the entire width of the proximity dummy cell 20 (30).

Similar to the case of the patterns of the standard cell, the patterns of the proximity dummy cell 20 (30) may include internal portions that are arranged within the frame 21 (31) and external portions that are arranged outside of the frame 21 (31). Furthermore, the origin "O" is determined for each of the proximity dummy cells 20 and 30.

The exemplary first proximity dummy cell 20 shown in FIG. 6 has the same height as the common height of the standard cells 10 shown in FIGS. 3 through 5, and has a width that is four times the unit width of the standard cells shown in FIGS. 3 through 5. On the other hand, the exemplary second proximity dummy cell 30 in FIG. 7 has an arbitrary height and a width of three times the unit width of the standard cells.

According to various exemplary embodiments, all the gate pattern 212 (312) and the active region pattern 211*a* and 211 b (311*b*) underneath the gate pattern 212 (312) within the exemplary proximity dummy cell shown in FIG. 6 (FIG. 7) are electrically floated. However, the gate pattern 212 (312) may be grounded or connected to the positive power-supply through contact patterns and an internal wiring pattern. The active region patterns 211*a* and 211*b* (311*b*) may also be grounded or connected to the positive power-supply through contact patterns and internal wiring patterns. The unshown active region patterns arranged along the upper and lower sides of the exemplary proximity dummy cell shown in FIG. 6 (FIG. 7) are connected to the power-supply wiring patterns 214*a* and 214*b* (314*a* and 314*b*) arranged along the same upper and lower sides through the contact patterns 213*a* and 213*b* (313*a* and 313*b*). However, the contact patterns for connecting the active region patterns to the power-supply wiring patterns may be omitted. It should be noted that the power-supply wiring patterns, the contact patterns, and the active region patterns, arranged along the upper and lower sides 21*a* and 21*b* (31*a* and 31*b*) may be formed in various shapes in the same way as with the patterns of the standard cell.

Description will be made below regarding the formation of the proximity dummy bands with reference to FIG. 1. In the layout structure of semiconductor integrated circuit shown in FIG. 1, a plurality of the first proximity dummy cells 20 such as shown in FIG. 6 are arranged along the vertical sides 1*c* and 1*d* of the standard cell array 1 to form the first proximity dummy bands 2. The plurality of first proximity dummy cells 20 are arranged along each of the vertical sides 1*c* and 1*d* of the standard cell array 1 such that the upper sides 21*a* and the lower sides 21*b* of the plurality of first proximity dummy cells 20 are in contact with each other, and one of the left and the right sides 21*c* and 21*d* of each of the plurality of first proximity dummy cells 20 is in contact with the corresponding portion of the vertical sides 1*c* and 1*d* of the standard cell array 1.

On the other hand, a plurality of the second proximity dummy cells 30 such as shown in FIG. 7 are arranged along the horizontal sides 1*a* and 1*b* of the standard cell array 1 to form the second proximity dummy bands 3. The plurality of second proximity dummy cells are arranged along each of the horizontal sides 1*a* and 1*b* of the standard cell array 1 such that the left and the right sides 31*c* and 31*d* of the frames of the plurality of second proximity dummy cells 30 are in contact with each other, and one of the upper and the lower sides 31*a* or 31*b* of the each of the plurality of second proximity dummy cells 30 is in contact with the corresponding portion of the horizontal sides 1*a* and 1*b* of the standard cell array 1.

In the exemplary layout structure of the semiconductor integrated circuit shown in FIG. 1, the first proximity dummy bands 2 and the second proximity dummy bands 3 are formed in contact with the sides of the standard cell array 1. No gap is made between the outer perimeter of the standard cell array 1 and the first and the second proximity dummy cells 20 and 30 that form the first and the second proximity dummy bands 2 and 3.

According to various exemplary embodiments, the first proximity dummy cells 20 are arranged to form the first proximity dummy bands 2 with alternating layout patterns of the layout pattern such as the one shown in FIG. 6 and the vertically-flipped layout pattern in the same way as with the standard cells 10 forming the standard cell array 1. For example, the first and the following odd-numbered cells from the top are arranged with the pattern layout shown in FIG. 6, and the second and the following even-numbered cells from the top are arranged with the vertically flipped pattern layout. Similarly, the second proximity dummy cells 30 in the second proximity dummy bands 3 may also be arranged with the vertically flipped pattern layout, depending upon the direction of the layout pattern of the standard cells 10 arranged in the uppermost row or the lowermost row of the standard cell array 1.

For example, when the uppermost row of the standard cell array 1 is formed of the standard cells 10 arranged with the pattern layouts as shown in FIGS. 3 through 5, the second proximity dummy cells 30 are arranged along the upper side of the standard cell array 1 with the vertically flipped pattern layout of the pattern layout such as shown in FIG. 7. On the other hand, when the lowermost row of the standard cell array 1 is formed of the standard cells 10 arranged with the vertically flipped pattern layouts, the second proximity dummy cells 30 is arranged along the lower side of the standard cell array 1 with the pattern layout such as shown in FIG. 7.

In some cases, the first proximity dummy cells 20 and the second proximity dummy cells 30 are arranged with the horizontally flipped, as well as vertically flipped, layout pattern, in the same way as with the standard cell 10.

Next, description will be made regarding some layout structures of semiconductor integrated circuits that are different from the layout structure shown in FIG. 1. The layout structures described below also correspond to the layout structures of the semiconductor integrated circuit according to this invention, and the same components will be denoted by the same reference numerals in the following description.

Figure 8:
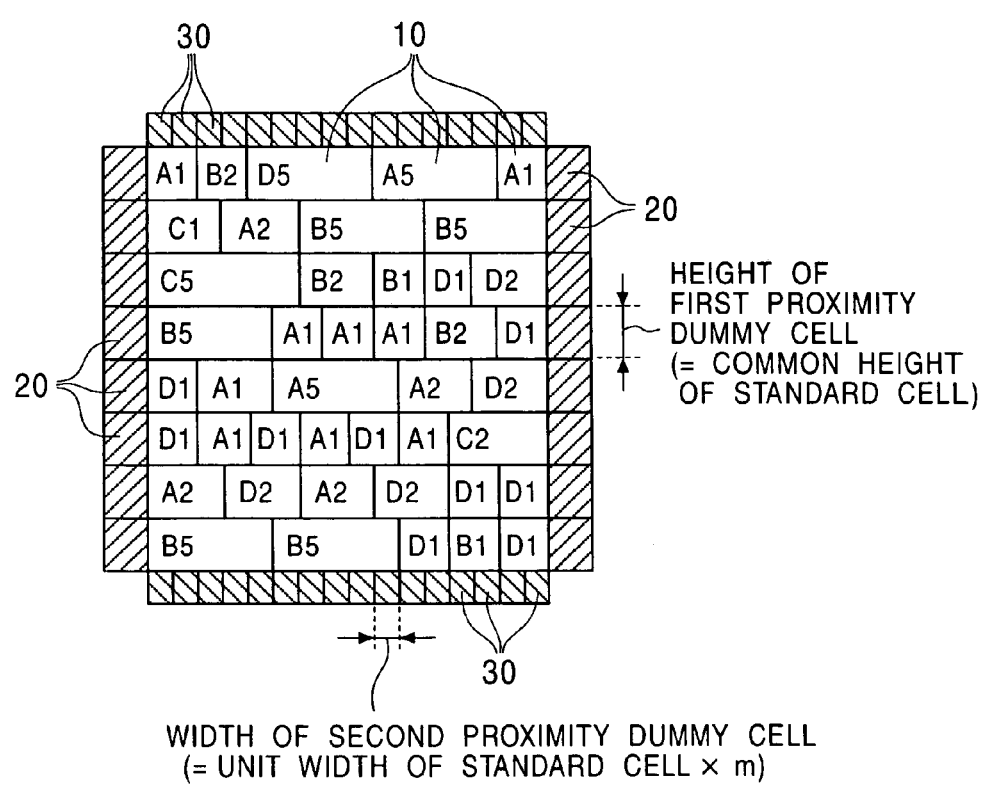
FIG. 8 is a diagram illustrating an exemplary layout structure of semiconductor integrated circuit employing proximity dummy cells with different sizes according to an exemplary embodiment of this invention.
Figure 9:
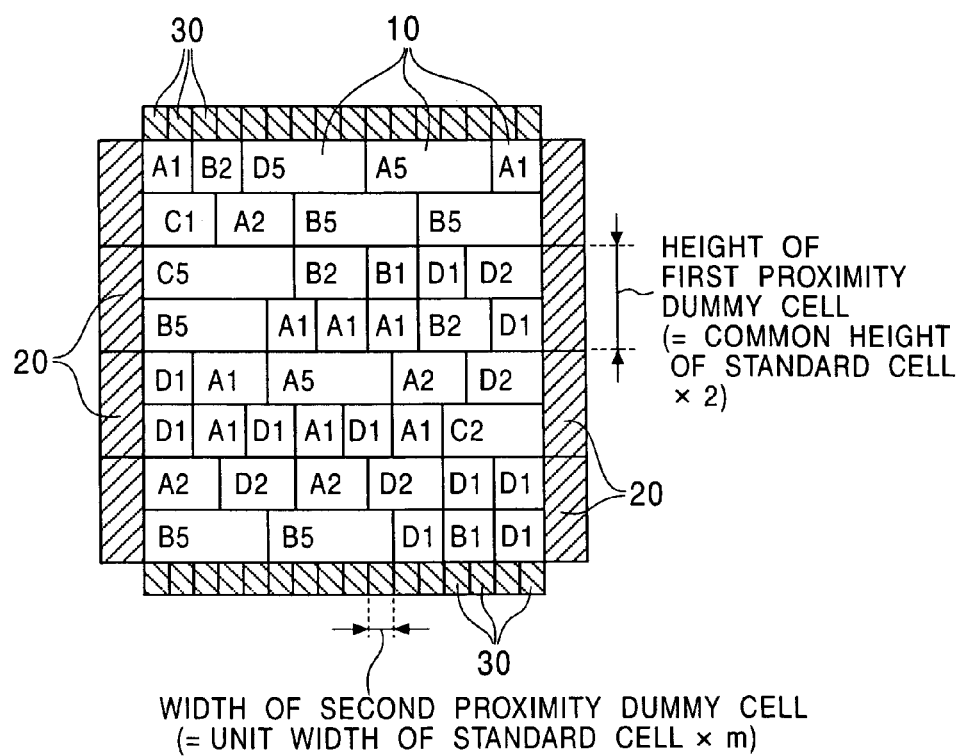
FIG. 9 is a diagram illustrating another exemplary layout structure of semiconductor integrated circuit employing proximity dummy cells with different sizes according to an exemplary embodiment of this invention.
Figure 10:
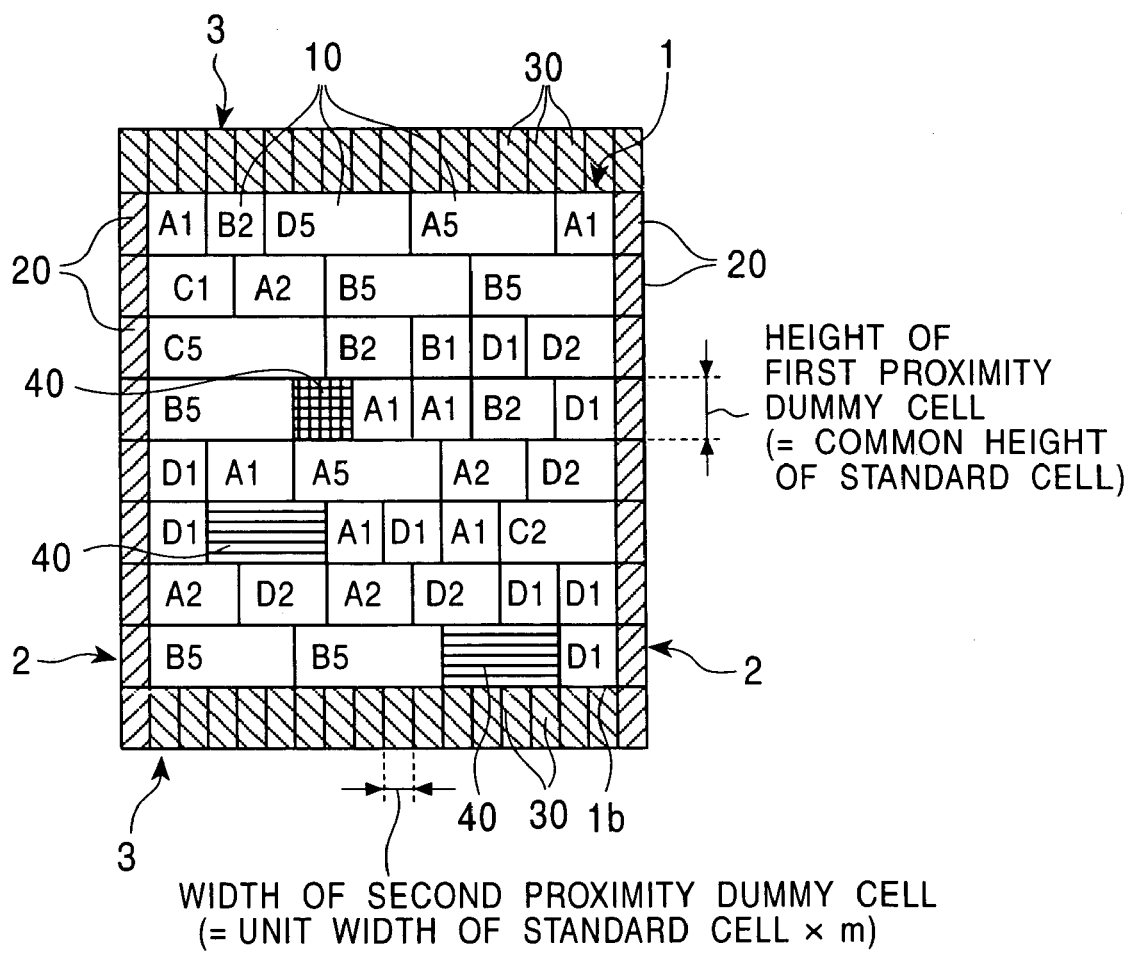
FIG. 10 is a diagram illustrating still another exemplary layout structure employing proximity dummy cells with different sizes according to an exemplary embodiment of this invention.

FIGS. 8 through 10 are diagrams showing exemplary layout structures with different frame sizes of the proximity dummy cells. In the layout structure of semiconductor integrated circuit shown in FIG. 8, the first proximity dummy cell 20 has a height equal to the common height of the standard cells 10, and an arbitrary width. The second proximity dummy cell 30 has an arbitrary height and a width of m times the unit width of the standard cells 10 (see FIG. 3), where m is an integer not lower than one.

In the layout structure of the semiconductor integrated circuit shown in FIG. 9, the first proximity dummy cell 20 has a height that is twice as large as the common height of the standard cells 10, and a width of m times the unit width of the standard cells 10, where m is an integer not less than one. The second proximity dummy cell 30 has an arbitrary height and a width of m times the unit width of the standard cells 10, where m is an integer not less than one.

In this case, a cell having a structure in which the layout pattern similar to that of the cell shown in FIG. 6 and the vertically flipped layout pattern thereof are arranged in the vertical direction may be used as the first proximity dummy cell, for example. Such a proximity dummy cell includes a total of three power-supply wiring patterns, i.e., two positive power-supply wiring patterns and a ground power-supply wiring pattern, or a positive power-supply wiring pattern and two ground power-supply wiring patterns, which are alternately arranged in the vertical direction so as to extend over the entire width of the proximity dummy cell. An active region pattern is arranged underneath each of the power-supply wiring patterns so as to extend over the entire width of the proximity dummy cell. Furthermore, contact patterns are arranged overlapping each of the power-supply wiring patterns with a fixed pitch in the horizontal direction.

When the number of standard cell rows arranged in the vertical direction so as to form the standard cell array is an odd number, a combination of the first proximity dummy cells having twice the height of the common height of the standard cells and at least one proximity dummy cell having the same height as the standard cell, such as the one shown in FIG. 6, forms the first proximity dummy band 2.

In the exemplary layout structure of semiconductor integrated circuit shown in FIG. 10, both the first proximity dummy cell 20 and the second proximity dummy cell 30 have the same height as the standard cell 10, and a width of m times the unit width of the standard cells 10, where m is an integer not less than one. In this case, the first proximity dummy cell 20 and the second proximity dummy cell 30 may have the same proximity dummy pattern. That is, the first and the second proximity dummy cells 20 and 30 may be the same type having the same frame size and the same proximity dummy pattern. Therefore, it is possible to reduce the number of types of cells which are to be prepared in the library.

Furthermore, the standard cell array 1 shown in FIG. 10 contains three auxiliary cells 40. One of the auxiliary cells 40 is arranged in the outermost portion of the standard cell array 1, and forms a part of the lower side 1b of the standard cell array 1. The auxiliary cell 40 is arranged with the side, which forms a part of the lower side 1b, in contact with the upper sides of the frames of the corresponding second proximity dummy cells 30. Thus, even in the layout structure of semiconductor integrated circuit shown in FIG. 10, the standard cell array 1 and the proximity dummy cells 20 and 30 are arranged without forming a gap between them.

FIG. 10 illustrates the standard cell array 1 containing two types of auxiliary cells 40. Each auxiliary cell 40 is arranged in order to adjust the lateral dimension of the standard cell row extending in the horizontal direction. Each of the auxiliary cells includes auxiliary cell patterns in one or more of the layers in which the standard cell patterns are arranged. The auxiliary cell patterns are arranged in an auxiliary cell frame having an upper, a lower, a left, and a right side. The auxiliary cell has a height, which is the distance between the upper and the lower sides of the frame, equal to the common height of the standard cell, and a width, which is the distance between the left and the right sides of the frame, of $m_a$ times the unit width of the standard cells, where $m_a$ is an integer not less than one. Thus, the auxiliary cell can be arranged with the standard cells to form the standard cell rows.

In the simplest cases, a cell including only a P-well pattern and an N-well pattern arranged along the vertical direction, and power-supply wiring patterns, contact patterns, and active region patterns arranged along the upper and lower sides according to the common layout rule as the standard cells shown in FIGS. 3 through 5, may be used as the auxiliary cell, for example. The auxiliary cell having such a structure is inserted into the space within the standard cell row, whereby the power-supply wiring patterns extending over the entire width of the standard cell array 1, the active region patterns underneath the power-supply wiring patterns, and the contact patterns for connecting between the power-supply wiring patterns and the active region patterns are formed.

Accordingly, similarly to the case of the external portions of the standard cell pattern, external portions of the auxiliary cell patterns merge with internal portions of the standard cell patterns in the adjacent standard cells arranged in the standard cell array. Furthermore, when another auxiliary cell is arranged adjacent to an auxiliary cell, the external portions of the auxiliary cell patterns also merge with internal portions of the auxiliary cell pattern in the adjacent auxiliary cell. While the primary function of the auxiliary cell is to connect the power-supply wiring patterns as described above, the auxiliary cell may further have additional functions. For example, the auxiliary cell may have a structure, in addition to the patterns arranged according to the common layout rule, in which a capacitor formed with an active region pattern and a gate pattern overlapping the active region pattern is connected between the positive power-supply wiring pattern and the ground power-supply wiring pattern. Such a structure increases the capacitance between the power-supply wiring patterns and reduces the noise. The gate pattern arranged in the auxiliary cell can also function to improve the uniformity of pattern density of the gate layer.

Usually, the auxiliary cell do not contribute to the logical function of the semiconductor integrated circuit. In other words, the auxiliary cell pattern does not usually contribute to the logical function of the semiconductor integrated circuit. For example, the capacitor connected between the power-supply wiring patterns does not, at least directly, contribute to the logical function of the semiconductor integrated circuit.

However, it is also possible to make one or more of the auxiliary cells contribute to the logical function of the semiconductor integrated circuit, by using auxiliary cells having auxiliary cell patterns that contribute to the logical function of the semiconductor integrated circuit. For example, patterns of a gate-array basic cell may be used as the auxiliary cell patterns. The auxiliary cell having the basic cell patterns can be programmed by adding wiring patterns in wiring layers to have various logical functions, and can be used to modify the logical functions formed by the basic cells.

According to various exemplary embodiments, in the layout structures of semiconductor integrated circuits shown in FIG. 1, and FIGS. 8 through 10, standard cells 10 have the same height (common height), and the first proximity dummy cell 20 has a height of k times the common height of the standard cell 10, where k in an integer not less than one. The second proximity dummy cell 30 may be of the same type as with the first proximity dummy cell 20, or may be of a different type, i.e., may have a different frame size.

According to various exemplary embodiments, in the layout structures of semiconductor integrated circuits shown in FIG. 1 and FIGS. 8 through 10, all the first proximity dummy cells 20 forming the first proximity dummy band 2 have the same structure, and all the second proximity dummy cells 30 forming the second proximity dummy band have the same structure. However, the first proximity dummy cells 20 forming the first proximity dummy band 2 may include two or more types of dummy cells having different proximity dummy patterns and/or different frame sizes, as long as the height of each of the types of first proximity dummy cells is k times the common height of the standard cells (k is an integer not less than one). Also, the second proximity dummy cells 30 forming the second proximity dummy band 3 may include two or more types of dummy cells having different second proximity dummy pattern and/or different frame sizes.

Figure 11:
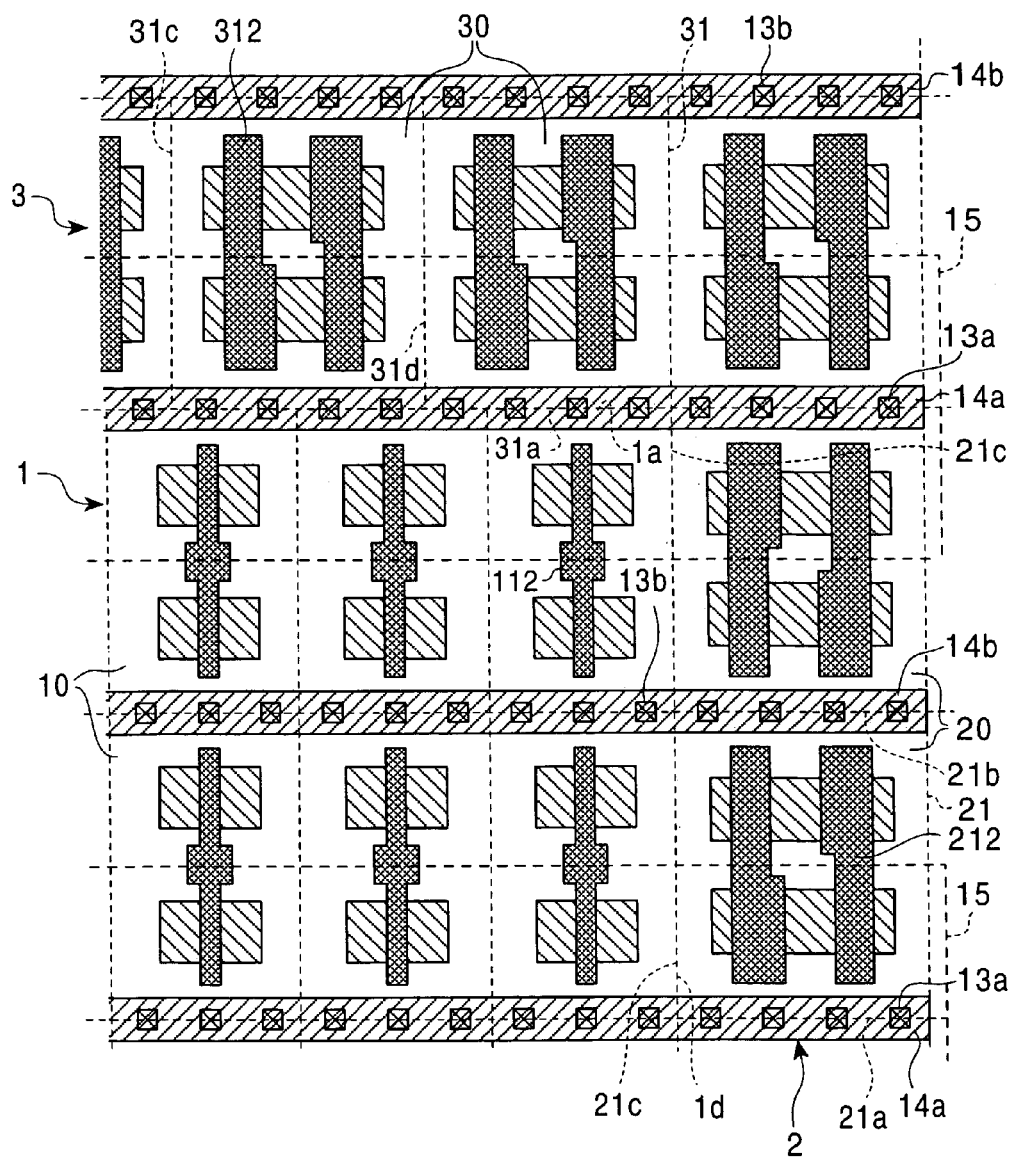
FIG. 11 is a diagram illustrating a part of an exemplary layout structure of semiconductor integrated circuit according to this invention according to an exemplary embodiment of this invention.

Next, a detailed description will be made for the exemplary layout structure of a semiconductor integrated circuit in which the first and second proximity dummy bands are formed along the vertical and horizontal sides of the standard cell array. FIG. 11 is a diagram illustrating the upper-right portion of an exemplary standard cell array in a layout structure of a semiconductor integrated circuit according to this invention. FIG. 11 also illustrates the upper-right portion of the proximity dummy bands formed around the standard cell array. The upper-right portion of the standard cell array 1 shown in FIG. 11 includes the standard cells 10 having the inverter function and the unit driving capability shown in FIG. 3.

On the other hand, all the first proximity dummy cells 20 and the second proximity dummy cells 30 have the same height equal to the common height of the standard cells 10 and the width of four times the unit width of the standard cells 10. In particular, in the exemplary layout structure shown in FIG. 11, the proximity dummy cell shown in FIG. 6, which is explained as an example of the first proximity dummy cell, is used both for the first proximity dummy cell 20 and for the second proximity dummy cell 30. As shown in FIG. 3, the standard cell 10 also includes, in addition to the active region patterns and the gate pattern that form MOSFETs shown in FIG. 11, the contact patterns 113c arranged over the active region patterns and the gate pattern and internal wiring patterns 114c. However, descriptions of such contact patterns and internal wiring patterns are omitted in FIG. 11. In the same way, descriptions of the contact patterns 113c and the internal wiring patterns 114c will be omitted in FIGS. 13, 18, and 19.

As described above, in the standard cell array 1, the standard cells 10 are arranged in the vertical direction with alternating layout patterns of the non-flipped ones and the vertically flipped ones. For example, in the standard cell array 1 shown in FIG. 11, each standard cell 10 forming the first row from the top is arranged with the layout pattern shown in FIG. 3. On the other hand, each standard cell 10 forming the second row from the top is arranged with the vertically flipped layout pattern, and so on in the same way.

According to various exemplary embodiments, the proximity dummy cell 20 (30) arranged along the left or right side (upper or lower side) of the standard cell array 1 needs to be arranged with the layout pattern matching that of the adjacent standard cell 10. Accordingly, the proximity dummy cell 20 (30) is arranged with the vertically flipped layout pattern as necessary. That is, the first proximity dummy band 2 is formed of the first proximity dummy cells 20 arranged in the vertical direction with alternating layout patterns of the non-flipped ones and the vertically flipped ones in the same way as with the standard cells 10 arranged in the standard cell array 1. For example, the first proximity dummy cell 20 positioned adjacent to the odd-numbered standard cell row from the top is arranged with the layout pattern shown in FIG. 6. On the other hand, the first proximity dummy cell 20 positioned adjacent to the even-numbered standard cell row from the top is arranged with the vertically flipped layout pattern.

In the exemplary layout structure of semiconductor integrated circuit of which a portion is shown in FIG. 11, the first proximity dummy band 2 is formed by arranging the plurality of first proximity dummy cells 20 along the right side of the standard cell array 1 with alternating layout patterns of the non-flipped ones and the vertically flipped ones. Specifically, a plurality of the first proximity dummy cells 20 are arranged such that the upper sides 21a and the lower sides 21b of the frames 21 of the first proximity dummy cells are in contact with each other, and such that the left sides 21c of the frames of the first proximity dummy cells 20 are in contact with the right side 1d of the standard cell array 1.

The second proximity dummy cells 30 for forming the second proximity dummy band 3, may also be arranged with the vertically flipped layout pattern, depending upon the orientations of the standard cells arranged along the upper- or lower-most rows in the standard cell array 1. For example, when the standard cells forming the upper-most row of the standard cell array 1 are arranged in the layout pattern shown in FIG. 3, the second proximity dummy cells 30 arranged along the upper side 1a of the standard cell array 1 are arranged with the vertically flipped layout pattern.

In the exemplary layout structure shown in FIG. 11, a plurality of the second proximity dummy cells 30 are arranged along the upper side 1a of the standard cell array 1 such that the left sides 31c and the right sides 31d of the frames 31 of the second proximity dummy cells 30 are in contact with each other, and such that the upper sides 31a of the second proximity dummy cells 30 are in contact with the upper side 1a of the standard cell array 1, whereby the second proximity dummy band 3 is formed. In the exemplary layout structure shown in FIG. 11, each of the second proximity dummy cells 30 has the same structure as the dummy cell shown in FIG. 6, and is arranged with the vertically flipped layout pattern. Accordingly, the "upper" side 31a of the second proximity dummy cell 30 contacts the upper side 1a of the standard cell array 1.

The proximity dummy cell arranged at the upper-right corner of the standard cell array 1 shown in FIG. 11 serves as the first proximity dummy cell as well as the second proximity dummy cell. Furthermore, an arrangement may be made wherein no proximity dummy cell is arranged at such a position, as in FIG. 1.

As described above, according to this exemplary embodiment, the proximity dummy cells 20 (30) are arranged such that one of the sides of the frame 21 (31) of each proximity dummy cell 20 (30) contacts a corresponding portion of the sides of the standard cell array 1. In other words, the proximity dummy cells 20 and 30 are arranged along the outer perimeter of the standard cell array 1 without forming gaps between the outer perimeter of the standard cell array and the frames of the proximity dummy cells. Thus, the proximity dummy patterns are arranged near the patterns of the standard cells arranged in the outer-most portion of the standard-cell array 1, thereby improving the uniformity of pattern density and the regularity of the patterns.

At the inner portion of the standard cell array, each standard cell is surrounded by the adjacent standard cells arranged in the standard cell. Therefore, the pattern density is high. At the outermost portion of the standard cell array, on the other hand, the region where no pattern is arranged surrounds the standard cell array if the proximity dummy bands are not formed. Therefore, the pattern density decreases at the outer portion of the standard cell array. As a result, there is a large non-uniformity of the pattern density between the inner portion and the outer portion of the standard cell array.

By forming the proximity dummy bands along the sides of the standard cell array, the standard cells in the outermost portion of the standard cell array are also surrounded by the proximity dummy patterns. As a result, the pattern density in the outer portion of the standard cell array is increased, and the uniformity of pattern density over the entire portions of the standard cell array is improved.

Furthermore, as shown in FIG. 11, the inner portion of the standard cell array includes the gate patterns of the standard cells arranged in the horizontal direction. The gate patterns of the standard cells are arranged in the horizontal direction, and each of the gate patterns extends in the vertical direction. Thus, high pattern regularity in the horizontal direction is produced. On the other hand, when the proximity dummy bands are not formed, the standard cells at the left-most and right-most portions of the standard cell array face the regions where no pattern is arranged. As a result, the pattern regularity in the horizontal direction is deteriorated at the outer portion of the standard cell array.

When the proximity dummy bands are formed, the dummy gate patterns of the proximity dummy cells arranged along the left and right sides of the standard cell array improve the pattern regularity in the gate layer along the horizontal direction at the left- and right-most portions of the standard cell array. Furthermore, pattern regularity in the gate layer formed by the dummy gate patterns of the proximity dummy cells arranged along the upper and lower sides of the standard cell array improves the pattern regularity in the gate layer at the upper- and lower-most portions of the standard cell array. As a result, the high pattern regularity in the gate layer is maintained over the entire portions of the standard cell array.

It should be noted that the proximity dummy cell has generally the same gate pattern as the standard cell, but does not have completely the same gate pattern. Accordingly, the outer portion of the standard cell array has different pattern density and different pattern regularity as compared with those of the inner portion of the standard cell array. However, as will be explained later, it has been confirmed that the exemplary embodiment of this invention provides sufficient effect on at least a 0.13 μm generation semiconductor integrated circuit.

Next, a detailed description is made regarding merging of patterns in i) standard cells, ii) proximity dummy cells, and iii) a standard cell and a proximity dummy cell, arranged adjacent with each other, with reference to FIG. 11.

As described above, each of the standard cells and the proximity dummy cells include the N-well pattern and the P-well pattern arranged in the vertical direction, the power-supply wiring patterns extending along the upper and lower sides and the contact patterns and the active region patterns underneath the power-supply wiring patterns, which are arranged according to the common layout rule. Accordingly, by arranging a plurality of standard cells and proximity dummy cells such that their upper, lower, left, and right sides are in contact with each other, patterns in the adjacent cells merge into a single pattern. Thus, formation of small patterns with dimensions that do not satisfy the layout design rule, and/or formation of small spaces between adjacent patterns with dimensions that do not satisfy the layout design rule are prevented over the entire areas including the proximity dummy bands.

First, a description of the N-well pattern and the P-well pattern is made. Each standard cell 10 has the N-well pattern and the P-well pattern arranged in the vertical direction as shown in FIGS. 3 through 5. In the same way, each of the first proximity dummy cell 20 and the second proximity dummy cell 30 has the N-well pattern and the P-well pattern arranged in the vertical direction, as shown in FIG. 6. The N-well pattern and the P-well pattern are formed over the entire width in the horizontal direction of each of the standard cells, the first and the second proximity dummy cells.

Within the standard cell array 1, a plurality of standard cell rows is arranged in the vertical direction. The standard cells 10 are arranged in the vertical direction with alternating layout patterns of the non-flipped one and the vertically flipped one for each row. In the same way, in the first proximity dummy band 2, the first proximity dummy cells 20 are arranged in the vertical direction with alternating layout patterns of the non-flipped ones and the vertically flipped ones so as to match the orientation of the layout pattern of the adjacent standard cell 10. Further, in the second proximity dummy band 3, the second proximity dummy cells 30 are arranged with the vertically flipped layout pattern as necessary, depending upon the orientation of the layout pattern of the standard cells 10 arranged in the upper- and lower-most rows of the standard cell array 1.

As a result, the N-well patterns in the standard cells and the proximity dummy cells arranged adjacent with each other in the vertical and horizontal directions merge into continuous N-well patterns 15 (regions surrounded by bold dotted lines in the drawing), each extending in the horizontal direction over the entire width of the standard cell array and the proximity dummy bands. In the same way, P-well patterns, not shown, in the standard cells and the proximity dummy cells merge into continuous P-well patterns, also not shown (regions other than the N-well patterns), each extending in the horizontal direction over the entire width of the standard cell array and the proximity dummy bands. The continuous N-well patterns 15 and the continuous P-well patterns are alternately arranged in the vertical direction over the entire standard cell array.

Next, a description is made of the positive power-supply wiring pattern and the ground power-supply wiring pattern. Each standard cell 10 has the positive power-supply wiring pattern extending along the upper side in the horizontal direction, and the ground power-supply wiring pattern extending along the lower side in the horizontal direction over the entire width of the standard cell as shown in FIGS. 3 through 5. Similarly, each of the first proximity dummy cell 20 and the second proximity dummy cell 30 have the positive power-supply wiring pattern extending along the upper side in the horizontal direction, and the ground power-supply wiring pattern extending along the lower side in the horizontal direction over the entire width of the proximity dummy cell, as shown in FIG. 6.

The standard cells and the proximity dummy cells are arranged with the non-flipped layout pattern or the vertically flipped layout pattern as necessary. As a result, the positive power-supply wiring patterns and the ground power-supply wiring patterns in the standard cells and the proximity dummy cells arranged adjacent with each other in the vertical and horizontal directions merge into continuous positive power-supply wiring patterns 14a, and continuous ground power-supply wiring patterns 14b, each extending in the horizontal direction over the entire width of the standard cell array and the proximity dummy bands. The continuous positive power-supply wiring patterns 14a and the continuous ground power-supply wiring patterns 14b are alternately arranged in the vertical direction over the standard cell array.

In the same way, the N+ active region pattern and the P+ active region pattern underneath the power-supply wiring patterns in the standard cells and the proximity dummy cells arranged adjacent with each other merge into continuous N+ active region patterns and P+ active region patterns (not shown) each extending in the horizontal direction over the entire width of the standard cell array and the proximity dummy bands. According to various exemplary embodiments, the continuous N+ active region patterns and the continuous P+ active region patterns are alternately arranged in the vertical direction over the standard cell array.

Next, a description of the contact pattern is made. Each standard cell 10 has the contact patterns arranged along the upper and lower sides with a constant pitch in the horizontal direction underneath the power-supply wiring patterns as shown in FIGS. 3 through 5. Similarly, each of the first proximity dummy cells 20 and the second proximity dummy cells 30 have the contact patterns arranged along the upper and lower sides with the same constant pitch in the horizontal direction underneath the power-supply wiring patterns, as shown in FIG. 6. The standard cells and the proximity dummy cells are arranged with the non-flipped layout pattern or the vertically flipped layout pattern, as necessary. As a result, the contact patterns in the standard cells and the proximity dummy cells arranged adjacent with each other merge into contact patterns 13a and 13b arranged in the horizontal direction with the constant pitch over the entire width of the standard cell array and the proximity dummy bands.

As shown in FIG. 10, the standard cell array 1 may include one or more auxiliary cells arranged at the outer-most portion of the standard cell array. Therefore, a side of the standard cell array may be formed with sides of auxiliary cells in combination with the sides of the standard cells. When a proximity dummy cell is arranged adjacent to an auxiliary cell, same as the case that the proximity dummy cell is arranged adjacent to a standard cell, the patterns in these adjacently arranged proximity dummy cell and the auxiliary cell merge with each other, because the auxiliary cell also includes the patterns according to the common layout rule.

Alternatively, in the proximity dummy cells 20 and 30, the contact patterns arranged along the upper and lower sides for connecting the active region pattern and the power-supply wiring pattern may be omitted. For example, when the contact patterns are omitted from the first proximity dummy cell 20, the merged contact patterns 13a and 13b are not arranged within the first proximity dummy bands 2. That is, the contact patterns 13a and 13b underneath the power-supply wiring patterns 14a and 14b are arranged only within the standard cell array 1.

Even in this case, the layout design rule is satisfied. In addition, as explained above, the N-well patterns and the P-well patterns in the standard cells and in the proximity dummy cells merge into the continuous N-well patterns 15 and P-well patterns (not shown), each extending in the horizontal direction over the entire width of the standard cell array 1 and the first proximity dummy bands 2. Accordingly, electric power can be supplied to the N-well patterns and the P-well patterns through the power-supply wiring patterns and the contact patterns arranged within the standard cell array 1.

By omitting the contact patterns arranged along the upper and lower sides, it is possible to reduce the data size of the proximity dummy cell, leading to the reduction of the total data size of the layout structure and that of the mask data.

In the exemplary layout structure of the semiconductor integrated circuit shown in FIG. 11, the dummy cell shown FIG. 6, which has a pair of power-supply wiring patterns 214a and 214b, a pair of unshown active region patterns underneath the power-supply wiring patterns, and two groups of contact patterns 213a and 213b arranged along the upper and lower sides of the frame, is used both as the first proximity dummy cell 20 and as the second proximity dummy cell 30. Among those patterns arranged along both of the horizontal sides, however, only those arranged along one of the horizontal sides are utilized to merge with corresponding patterns in the standard cell (or standard cells) arranged in the upper-most (or lower-most) portion of the standard cell array. Therefore, it is possible to use a dummy cell, in which the power-supply wiring patter, active region pattern, and contact patterns are arranged along only one of the horizontal sides, as the second proximity dummy cell. One of the well patterns can also be omitted in such second proximity dummy cell.

In the exemplary layout structure of the semiconductor integrated circuit shown in FIG. 11, only the standard cells and proximity dummy cells are arranged. In general, however, layout structures of practical semiconductor integrated circuits further include outer circuit cells such as input/output cells and various other components. Furthermore, in the exemplary layout structure shown in FIG. 11, only the power-supply wiring patterns are shown. However, layout structures of practical semiconductor integrated circuits include various kinds of wiring patterns such as signal wiring patterns for connecting the standard cells with each other, and for connecting the standard cells with the outer circuit cells. These multiple kinds of wiring patterns are arranged in multiple layers. Furthermore, interlayer contact patterns are also arranged at positions as necessary for connecting the wiring patterns arranged in different layers.

Figure 12:
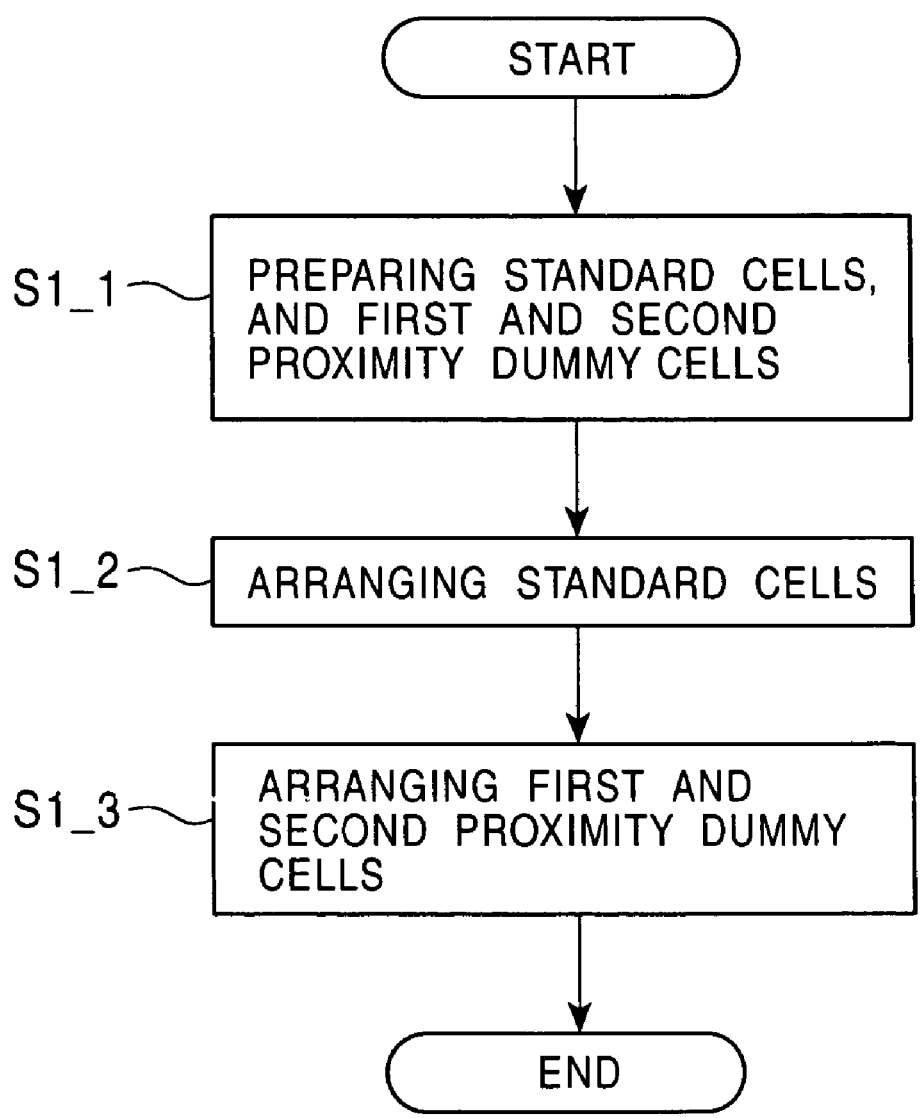
FIG. 12 is a flowchart illustrating a layout method of semiconductor integrated circuit according to an exemplary embodiment of this invention.

Next, a description of a layout method, or a method for designing the layout structure of semiconductor integrated circuit described above using a CAD tool is made. FIG. 12 is a flowchart illustrating an exemplary embodiment of a layout method of semiconductor integrated circuit according to this invention. Accordingly to various exemplary embodiments, in order to design a semiconductor integrated circuit using a CAD tool, in step S1_1, various types of cells are prepared and registered in a library beforehand. The cells to be prepared and registered include a plurality of types of standard cells such as the exemplary standard cells 10 shown in FIGS. 3 through 5, at least one type of first proximity dummy cell, such as the exemplary first proximity dummy cell 20 shown in FIG. 5, at least one type of second proximity dummy cell, such as the exemplary second proximity dummy cell 30 shown in FIG. 7.

When using the same proximity dummy cell as the first proximity dummy cell 20 and as the second proximity dummy cell 30 as in the case shown in FIG. 11, it is sufficient to prepare and register the same proximity dummy cell alone as the first and the second proximity dummy cells. It is also possible to prepare and register different cells for each of the first proximity dummy cell 20 and the second proximity dummy cell 30. Furthermore, a plurality of types of cells may be prepared for each of the first proximity dummy cell 20 and the second proximity dummy cell 30.

Next, in Step S1_2, the user selects a plurality of types of the standard cells from the library on the CAD tool for realizing the logical functions required for the semiconductor integrated circuit. A plurality of standard cells including one or more of each of the selected plurality of types of standard cells is two-dimensionally arranged. In Step S1_2, a channel-less type standard cell array is formed on the CAD tool as shown in FIG. 1. The outer perimeter of the standard cell array 1 has the vertical sides and horizontal sides each formed with the sides of the standard cells.

Next, in Step S1_3, the user selects the first proximity dummy cell and the second proximity dummy cell from the library on the CAD tool. Then, a plurality of the first proximity dummy cell is arranged along the vertical sides of the stand cell array, and a plurality of the second proximity dummy cells is arranged along the horizontal sides of the standard cell array. Therefore, the first proximity dummy bands and the second proximity dummy bands are formed on the CAD tool as shown in FIG. 1.

According to various exemplary embodiments, the plurality of first proximity dummy cells is arranged along each of the vertical sides of the standard cell array such that the upper and the lower sides of the frames of the plurality of first proximity dummy cells are in contact with each other, and such that one of the left and right sides of the frame of each of the plurality of first proximity dummy cells is in contact with a corresponding portion of the vertical sides of the standard cell array. Also, the plurality of second proximity dummy cells are arranged along each of the horizontal sides of the standard cell array such that one of the upper and the lower sides of the frame of each of the plurality of second proximity dummy cells is in contact with a corresponding portion of the horizontal sides of the standard cell array.

As described above, each of the standard cells and the proximity dummy cells includes the N-well pattern and the P-well pattern, the power-supply wiring patterns extending along the upper and lower sides, and the contact patterns and the active region patterns underneath the power-supply wiring patterns arranged according to the common pattern layout rule. Accordingly, these patterns in the adjacent cells merge into continuous patterns simply by arranging the standard cells and the proximity dummy cells with vertically flipped layout pattern and/or with horizontally flipped layout pattern, as necessary, such that their sides are in contact with each other. Thus, formation of small patterns with dimensions that do not satisfy the layout design rule, and/or formation of small spaces between adjacent patterns with dimensions that do not satisfy the layout design rule are prevented over the entire regions including the standard cell array and the proximity dummy bands.

Thus, a user can form a standard cell array having the first and the second proximity dummy bands 2 and 3 only by automatically arranging the standard cells 10 and the proximity dummy cells 20 and 30, with their heights and the widths as the measures. In other words, the logical synthesis described in Patent Document 2, is not required. Thus, the layout method according to this invention decreases the calculation amount required for the layout design, thereby enabling the design of the layout of a semiconductor integrated circuit in a short period of time.

In general, in Step S1_1, a plurality of types of auxiliary cells are prepared and registered in the library as well as the plurality of types of standard cells. In Step S1_2, one or a plurality of types of the auxiliary cells are selected and arranged as well as the plurality of types of standard cells, whereby a standard cell array is formed.

Some of the auxiliary cells may include gate patterns having shapes and dimensions that can be used as the proximity dummy patterns. For example, the auxiliary cell for increasing the capacitance between the power-supply wirings, which has a gate pattern for forming a capacitance, may be used as a proximity dummy cell if the gate pattern has the shape and dimension suitable for a proximity dummy pattern. In such cases, it is not necessary to prepare one or more proximity dummy cells separately from the auxiliary cells.

Usually, however, it is more preferable to prepare one or more proximity dummy cells separately from the auxiliary cells so that the one or more proximity dummy cells different from any of the auxiliary cells can be arranged to form the proximity dummy bands. For example, the auxiliary cell for increasing the capacitance between the power-supply wirings has contact patterns for connecting the active region patterns and the gate patterns to the power-supply wiring patterns. Therefore, even in a case that the same gate pattern as that in the auxiliary cell is used as a proximity dummy pattern, it is more preferable to prepare a separate proximity dummy pattern that does not have the contact patterns in order to reduce the data size. In this case, the difference in the pattern in one of the layers (i.e., the contact layer) makes the proximity dummy cell different from the auxiliary cell.

Furthermore, with practical layout design of a semiconductor integrated circuit, following the formation of the layout structure as shown in FIG. 11 through the steps shown in FIG. 12, wiring is made for connecting the standard cells, and for connecting the standard cells and the outer circuit cells or the like, using the automatic placing/routing function of the CAD tool. That is, signal wiring patterns and the interlayer contact patterns for connecting between the wiring patterns in different layers, for providing functions required for the semiconductor integrated circuit, are automatically arranged.

Figure 13:
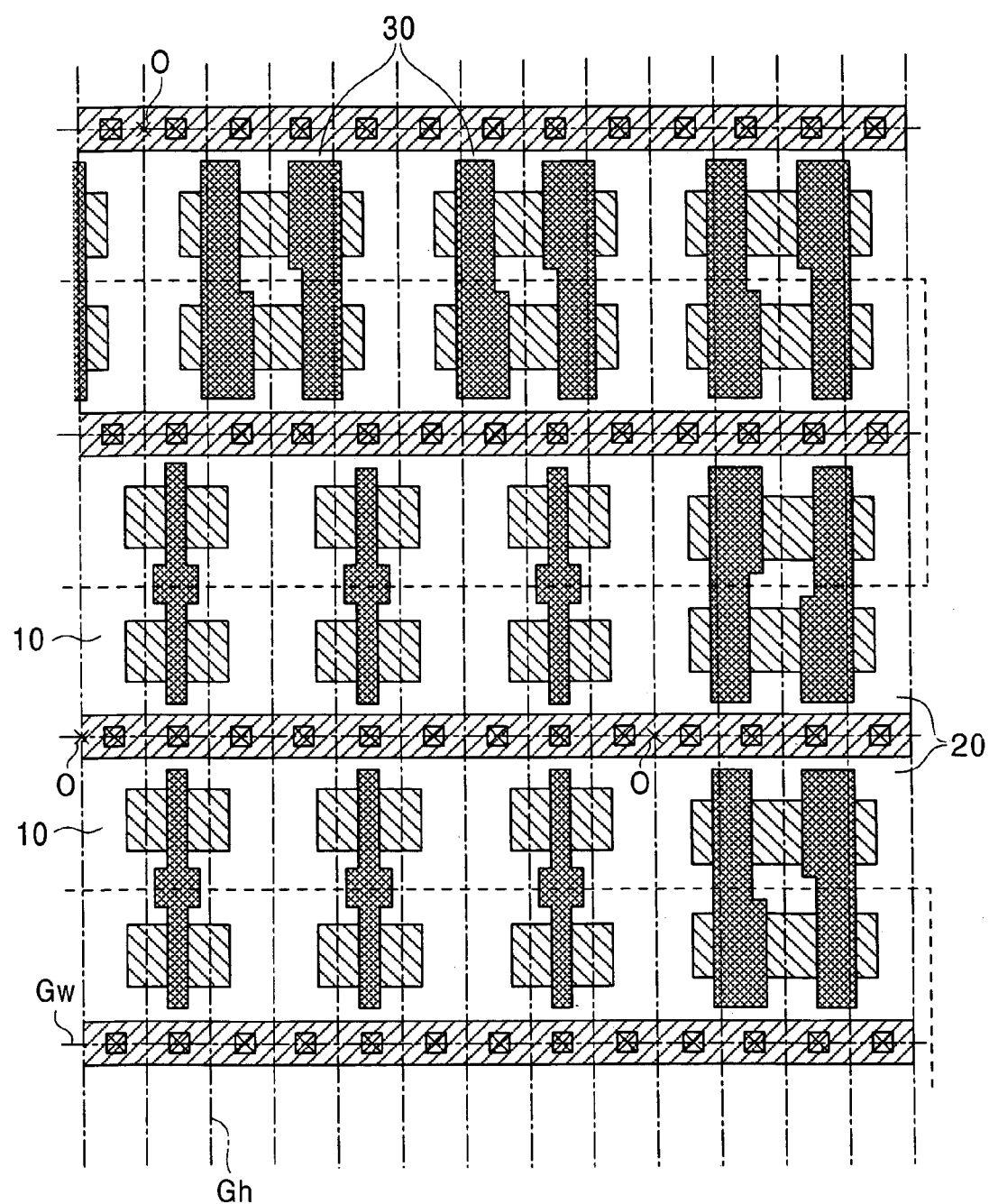
FIG. 13 is a diagram illustrating grid lines on a CAD tool, which are superimposed on the layout structure shown in FIG. 11 according to an exemplary embodiment of this invention.

FIG. 13 is a diagram illustrating the same layout structure shown in FIG. 11. In this figure, however, grid lines serving as a scale for automatically arranging the standard cells 10 and the proximity dummy cells 20 and 30 on the CAD tool are also shown. FIG. 13 shows horizontal grid lines Gw and vertical grid lines Gh. The horizontal grid lines Gw are arranged in the vertical direction with a pitch equal to the common height of the standard cells. The vertical grid lines Gh are arranged in the horizontal direction with a pitch equal to the unit width of the standard cells. The user arranges, using the CAD tool, the standard cells 10 and the proximity dummy cells 20 and 30 with the grid lines Gw and Gh as a scale. That is, the standard cell 10 and the proximity dummy cells 20 and 30 are arranged such that the origin of each cell is placed on the intersection of the grid line Gw and the grid line Gh.

According to the exemplary embodiment shown in FIG. 13, the proximity dummy cells 20 and 30 have the same height equal to the common height of the standard cells, and a width of m times the unit width of the standard cells (m is an integer not less than one). Accordingly, all the cells 10, 20, and 30 are arranged such that their upper, lower, left, and right sides are in contact with the corresponding horizontal and vertical grid lines. Thus, the user can easily arrange the proximity dummy cells 20 and 30 using the automatic placing/routing function of the CAD tool.

More generally, the proximity dummy cells having the height of k times the common height of the standard cells (k is an integer not less than one), and a width of m times the unit width of the standard cells (m is an integer not less than one) can be easily arranged using the automatic placing/routing function of the CAD tool such that all of their sides are in contact with the corresponding horizontal and vertical grid lines.

As described above, the grid lines Gw and Gh shown in FIG. 13 are used as a scale on the CAD tool for arranging the standard cells 10 and the proximity dummy cells 20 and 30. It should be noted that any physical structure is not formed according to the grid lines Gw and Gh at the time of forming the layout structure on a semiconductor substrate. That is, in the layout structure of semiconductor integrated circuit, the grid lines Gw and Gh are imaginary lines.

Even in a case in which the first proximity dummy cell 20 has a width that is not equal to m time the unit width of the standard cells (m is an integer not less than one), automatic arrangement can still be made. That is, the first proximity dummy cell may be automatically arranged by, for example, placing the origin of the dummy cell, which is horizontally flipping, if necessary, on one of the intersections between the vertical grid lines Gh, which overlaps the vertical side of the standard cell array, and the horizontal grid lines Gw. In the same way, even in a case in which the second proximity dummy cell has a height that is not equal to k times the common height of the standard cells (k is an integer not less than one), automatic arrangement can still be made. However, it is preferable to use a first proximity dummy cells having a width of m times the unit width of the standard cells (m is an integer not less than one), and a second proximity dummy cell having a height of k times the common height of the standard cells (k is an integer not less than one), in order to simplify the automatic arrangement.

In the case of employing a second proximity dummy cell having a width that is not equal to m times the unit width of the standard cells (m is an integer not less than one), on the other hand, the following operation needs to be performed, for example. A plurality of second proximity dummy cells are arranged with a pitch equal to the width of the dummy cell in the horizontal direction so as to form a proximity dummy row with an overall length (width) matching or approximately matching the entire width of the standard cell array. After vertically and/or horizontally flipping it, as necessary, the thus formed proximity dummy row is arranged such that the origin of the first one of the second proximity dummy cell in the row is positioned at the corner of the standard cell array.

Accordingly, the second proximity dummy cell is preferably formed with a width of m times the unit width of the standard cells (m is an integer not less than one) in order to facilitate formation of the second proximity dummy band by using the automatic placing/routing function of the CAD tool. However, even in the case that such operation is needed, the layout structure can be designed without using the logical synthesis. Furthermore, the layout structure thus formed has the advantages of improved uniformity of pattern density and improved pattern regularity, as well.

In the exemplary layout structure shown in FIG. 11, the second proximity dummy band 3 is formed by arranging a plurality of second proximity dummy cells 30 such that one of the upper side 31a and the lower side 31b of the frame 31 of each second proximity dummy cell 30 is in contact with the horizontal side of the standard cell array 1, and the left and right sides 31c and 31d of the frames of the second proximity dummy cells are in contact with each other. However, it is not always necessary that the left and the right sides 31c and 31d of the second proximity dummy cells in the second proximity dummy band 3 are in contact with each other.

That is, for example, even if the second proximity dummy cell 30 has a width that is not equal to m times the unit width of the standard cells (m is an integer not less than one), there may be cases where the second proximity dummy cells 30 can be arranged with a pitch of m times the unit width of the standard cells. Such an arrangement can be made by placing the second proximity dummy cell such that the origin of each second proximity dummy cell 30 is placed on one of the intersections of the respective vertical grid lines and the horizontal grid lines. Such an arrangement does not make the left and right sides 31c and 31d of the frames of the second proximity dummy cells in contact with each other.

More specifically, an arrangement may be made where with m as an integer of 1 or more, when the width of the second proximity dummy cell is greater than m times the unit width of the standard cells and is smaller than (m+1) times the unit width, the second proximity dummy cell may be arranged with a pitch of (m+1) times the unit width, as long as the layout design rule is satisfied. For example, in a case in which the external portion of the N-well pattern of the second proximity dummy cell extends sufficiently in the horizontal direction, the N-well patterns of the second proximity dummy cell may be merged into a continuous pattern simply by automatically arranging the second proximity dummy cells with the pitch of (m+1) times the unit width of the standard cells. Continuous patterns may also be formed in other layers by sufficiently extending the external portions of the patterns of the second proximity dummy cell.

If the uniformity of the pattern density and the pattern regularity are not sufficiently improved due to the gaps introduced between the second proximity dummy cells, there is no advantage in providing the second proximity dummy band. In the case described above, however, the width of the gap is smaller than the unit width of the standard cell. Accordingly, by appropriately designing the second proximity dummy pattern, the uniformity of pattern density and the pattern regularity can be sufficiently improved.

In this case, it is also possible to consider that the second proximity dummy cell effectively having a width of (m+1) times the unit width of the standard cells is prepared, and the second proximity dummy band is formed by arranging a plurality of the second proximity dummy cells such that the left and right sides of the frames are in contact with each other. That is, although a frame having a width that is not equal to m times the unit width of the standard cells is used during the designing of the second proximity dummy cell, it can be considered that an imaginary frame having the width of (m+1) times the unit width of the standard cells is used during the arranging of the plurality of second proximity dummy cells to form the second proximity dummy band.

In the case in which the N-well patterns in the second proximity dummy cells arranged in the horizontal direction with the pitch of (m+1) times the unit width of the standard cells do not merge with each other, the following exemplary method may be employed. That is, a combined cell including the second proximity dummy cell and a connecting cell for connecting the N-well patterns of the adjacent ones of the second proximity dummy cells, is prepared. Then, a plurality of the combined cell is arranged with the pitch of (m+1) times the unit width of the standard cells to form the second proximity dummy band.

By adjusting the width of the connecting cell, it is possible to adjust the width of the combined cell to (m+1) times the unit width of the standard cells. Thereby, it becomes possible to automatically arrange the combined cells with the pitch of (m+1) times the unit width such that the left and the right sides of the frames of the combined cells are in contact with each other.

Even in the case where the second proximity dummy cell and the connection cell are separately prepared, it can be considered that, in effect, the combined cell having the width of (m+1) times the unit width of the standard cells is prepared as the second proximity dummy cell for forming the second proximity dummy band.

Figure 14:
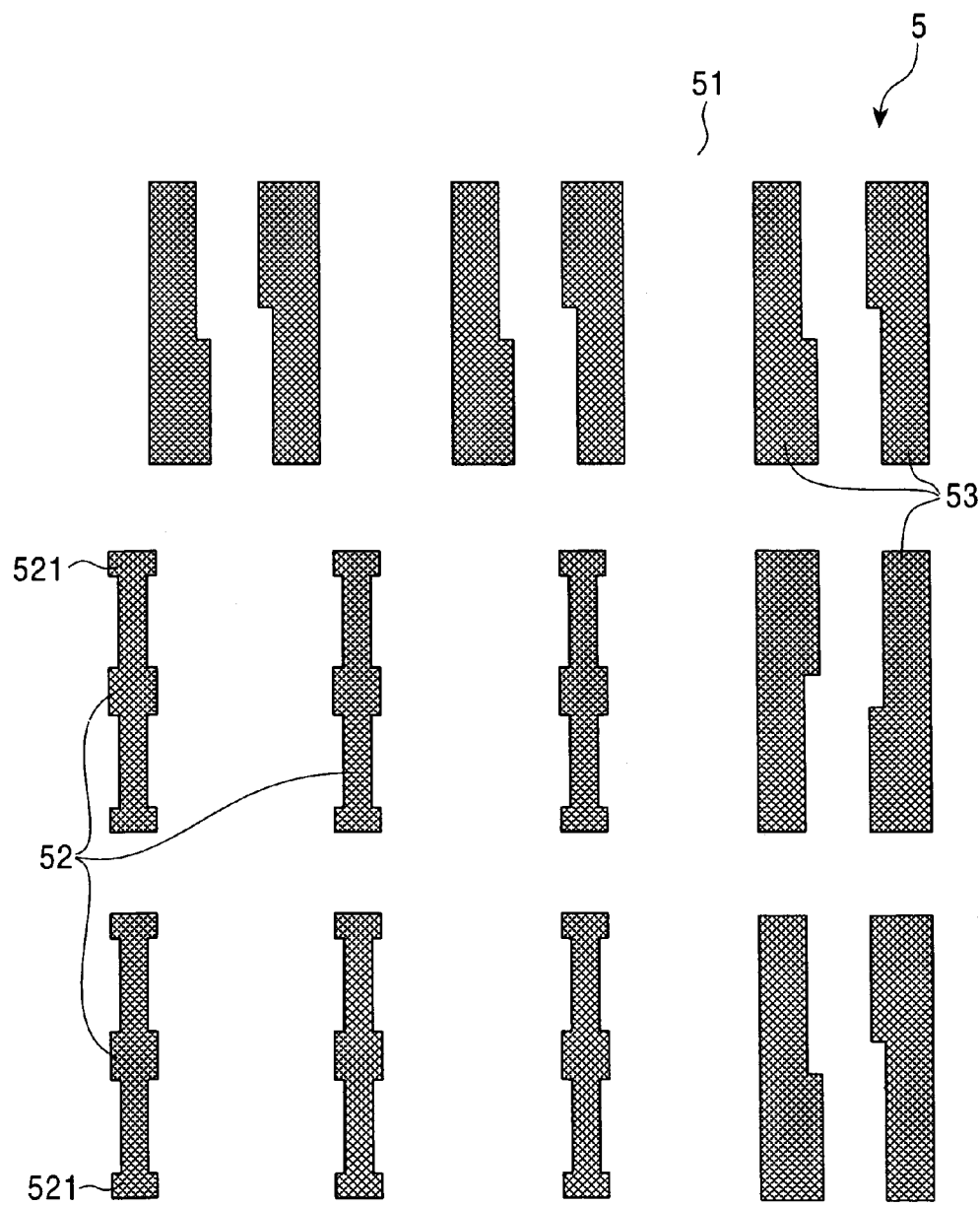
FIG. 14 is a diagram illustrating am exemplary photomask produced based upon the exemplary layout structure of semiconductor integrated circuit shown in FIG. 11 according to an exemplary embodiment of this invention.

Next, description of a photomask used for manufacturing a semiconductor integrated circuit according to this invention is made. FIG. 14 is a diagram illustrating a part of one of the exemplary photomasks formed based upon the layout structure of semiconductor integrated circuit shown in FIG. 11.

The exemplary photomask shown in FIG. 14 is used for exposing a positive resist layer, and is used for forming the gate layer pattern in the layout structure of semiconductor integrated circuit shown in FIG. 11. As described above, portions of the gate layer pattern 112 of the standard cell 10 shown in FIG. 11 has a dimension less than a critical dimension (see the portions denoted by L1 in FIG. 3). An optical proximity correction (OPC) is performed on the portions of the pattern having a dimension less than the critical dimension in order to correct the deformation of the pattern that will occur when the pattern is transferred on a semiconductor substrate.

The critical dimension is determined appropriately and corresponds to the photolithographic technique employed in manufacturing the semiconductor integrated circuit. In general, the critical dimension of less than the wavelength λ of the exposing light is practically and preferably employed. In the photolithographic technique for manufacturing 0.13 μm generation semiconductor integrated circuits, deep ultraviolet light with a wavelength of 248 nm is used as the exposing light, and the critical dimension is determined to be 0.20 μm, for example.

On the other hand, any portion of the gate layer patterns 212 and 312 of the proximity dummy cells 20 and 30 shown in FIG. 11 are formed with dimensions that are not smaller than the critical dimension. That is, the minimum dimension (the width denoted by L4 in FIG. 6) of the pattern is equal to or greater than the critical dimension. Accordingly, the OPC is not performed on the gate layer patterns of the proximity dummy cells.

The photomask 5 shown in FIG. 14 includes a mask pattern 52 corresponding to the gate patterns 112 within the standard cells 10 forming the standard cell array 1, and a mask pattern 53 corresponding to the gate patterns 212 and 312 within the proximity dummy cells 20 and 30 forming the proximity dummy bands 2 and 3. The mask patterns are formed of a masking film of chromium, for example, on a quartz-glass substrate 51.

The combination of the mask patterns 52 and 53 has generally the same layout structure as with the combination of the gate patterns 112, 212, and 312 shown in FIG. 11. The difference between them is that the mask pattern 52, which corresponds to the gate pattern 112 having portions with a dimension less than the critical dimension, contains correction patterns 521 for collecting the deformation of the resist pattern. The layout structure shown in FIG. 11 does not contain such a correction pattern. In the step for creating the mask pattern data based upon the pattern data of the layout structure, the correction pattern is added. More specifically, in the step for creating the mask pattern, portions having dimensions less than the critical dimension that require the correction are extracted, and the correction pattern is designed in a shape so as to correct the pattern deformation during the transferring of the mask pattern to the resist pattern. On the other hand, the mask pattern 53 corresponding to the gate patterns of the proximity dummy cells 20 and 30 does not contain such a correction pattern.

In a mask for the 1/n reduction projection exposure, portions of the mask patterns 52 and 53 containing no correction pattern have generally the dimensions of n times the dimensions of corresponding portions of the pattern in the layout structure shown in FIG. 11. In some cases, so called "mask-biasing" is performed for the mask pattern of some of the layers. That is, the dimension of the mask pattern of a particular layer is increased or reduced by a certain amount giving consideration to dimensional changes occurring in the photolithographic process and/or in the etching process.

For the gate layer, mask-biasing may be performed with different biasing amounts for the gate patterns of P-channel MOSFETs and for the gate patterns of N-channel MOSFETs in order to balance the properties of the P-channel MOSFETs and the N-channel MOSFETs. It should be noted that the mask-biasing thus described is different from the OPC performed for the portions having dimensions less than the critical dimension.

In the exemplary embodiment illustrated in FIG. 14, so-called "hammer-head" type correction is performed to the mask pattern 52 of the photomask 5 in which collection patterns 521 for correcting deformation of the resist pattern around the tips of line patterns are added. The correction may be made in various other ways. For example, so-called "Scattering bar" type correction may be performed in which narrow patterns having a dimension less than the resolution of the photolithographic technique are added near the main patterns. Furthermore, so-called "simulation-based OPC" may be performed in which shapes and arrangements of correction patterns are determined based upon the simulation of the deformation of the resist pattern.

The mask patterns for masks of other layers are designed the same way. In some cases, however, the layer in the logical layout structure created using a CAD tool and the mask layers do not correspond to each other. For example, the layout structure shown in FIG. 11 has P+ active regions and N+ active regions. At the time of creating the mask data on the CAD tool, both the pattern data of the P+ active regions and N+ active regions are merged, whereby a common active region mask pattern is formed. In addition, a P+ implantation mask and an N+ implantation mask are formed based upon the pattern data of the P+ active pattern and the N+ active pattern. The implantation masks are used to make portions of the active regions formed using the common active region mask into P+ active regions, and the other portions into N+ active regions. Furthermore, a P-well layer mask for forming the P-well regions (which are not shown in the layout pattern in FIG. 11) is produced based upon the pattern data created by inverting the data of N-well patterns.

As described above, the layout structure according to the exemplary embodiment of this invention includes the proximity dummy bands 2 and 3 along the sides of the standard cell array 1 by arranging the proximity dummy cells 20 and 30. The layout structure according to this exemplary embodiment improves the uniformity of pattern density and the pattern regularity. As a result, patterns in a semiconductor integrated circuit are formed with improved processing precision and dimensional controllability.

The effect of the layout structure, in which the first proximity dummy cells 20 and the second proximity dummy cells 30 are arranged along the sides of the standard cell array 1 without forming gaps between them, for improving dimensional controllability in the resist pattern formed on a semiconductor substrate, is evaluated. Three different types of proximity dummy cells are arranged to form the first proximity dummy bands along the left and right sides of a standard cell array. Then, the effect for improving dimensional controllability is evaluated for the gate pattern in the standard cell shown in FIG. 3. The gate pattern in the logical layout structure on the CAD tool has a dimension (width) of 0.12 µm. The wavelength of the exposing light is 248 nm.

Figure 15:
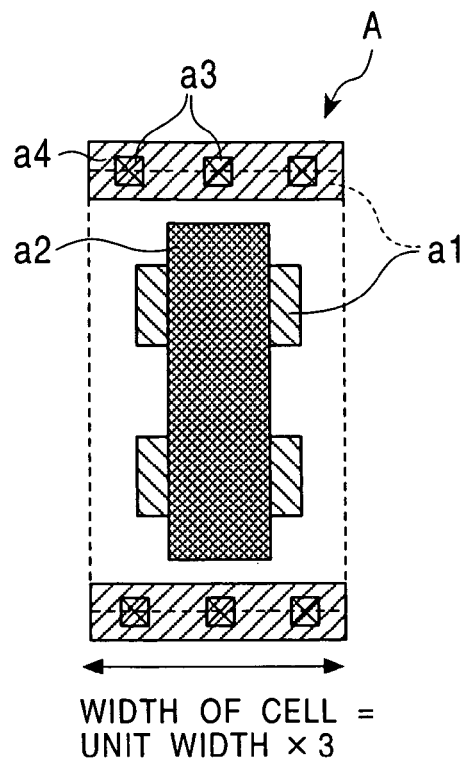
FIG. 15 is a diagram illustrating a pattern layout of proximity dummy cell A used for evaluating the suppressing effect on the pattern size variation according to an exemplary embodiment of this invention.
Figure 16:
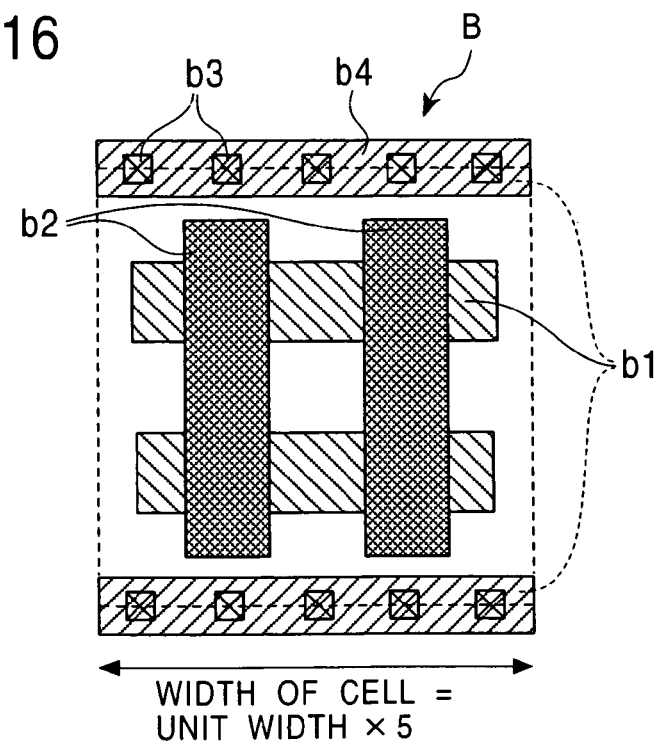
FIG. 16 is a diagram illustrating a pattern layout of proximity dummy cell B used for evaluating the suppressing effect of the pattern size variation according to an exemplary embodiment of this invention.
Figure 17:
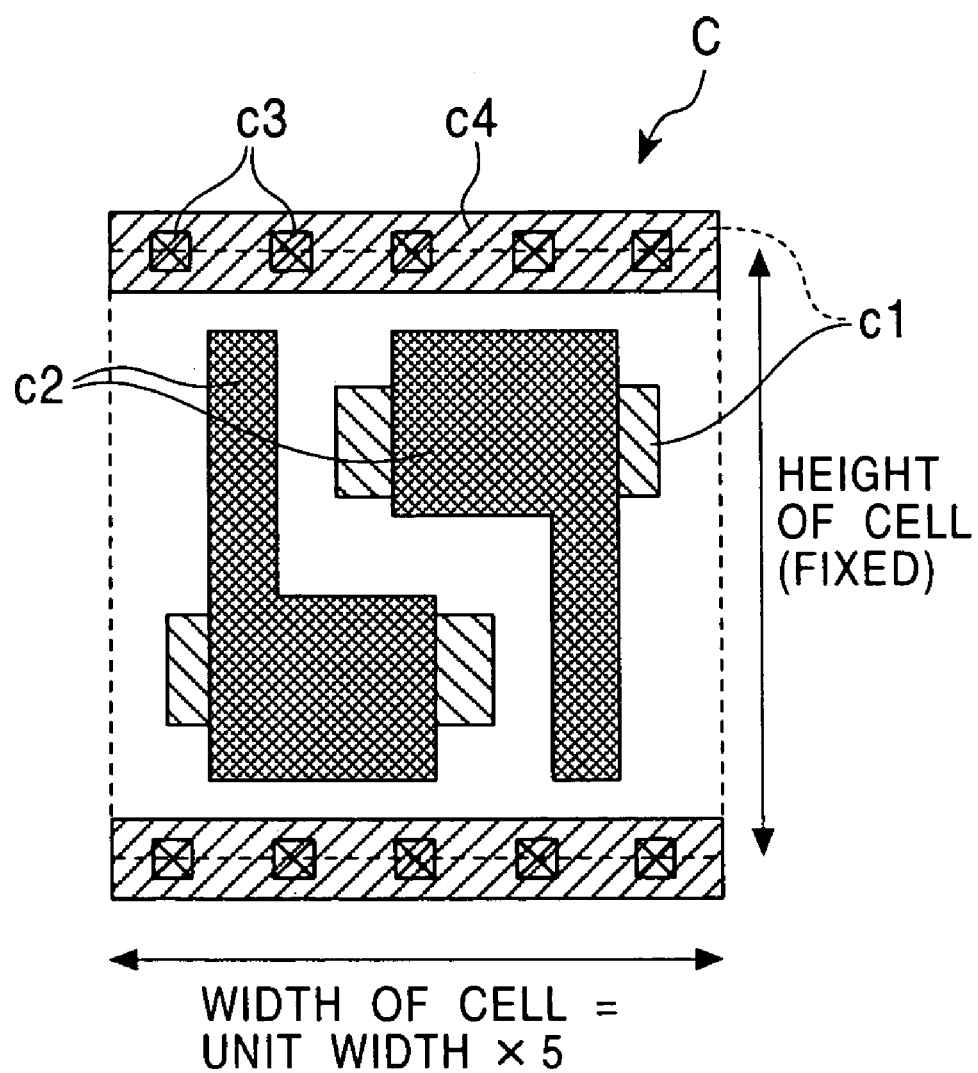
FIG. 17 is a diagram illustrating a pattern layout of proximity dummy cell C used for evaluating the suppressing effect on the pattern size variation according to an exemplary embodiment of this invention.

FIGS. 15 through 17 show the proximity dummy cells used for the evaluation. The proximity dummy cell A shown in FIG. 15 has a width of three times the unit width of the standard cells. Each of the proximity dummy cells B and C shown in FIGS. 16 and 17 has a width of five times the unit width of the standard cells. Each of these proximity dummy cells A, B, and C, has the same height equal to the common height of the standard cells.

These proximity dummy cells A, B, and C, include active region patterns a1, b1, and c1, gate patterns a2, b2, and c2; contact patterns a3, b3, and c3 and power-supply wiring patterns a4, b4, and c4, respectively. The active region patterns in each of these proximity dummy cells include P+ active region patterns and N+ active region patterns, although these two types of active region patterns are illustrated in the drawings by the same hatching pattern. Furthermore, although not shown in the drawings, each of these proximity dummy cells includes an N-well pattern and a P-well pattern.

Table 1 shows the result of the evaluation.

TABLE 1

| Types of proximity dummy cells | Process performance index (Cp) | |
|---|---|---|
| | Layout in which sides of proximity dummy cells are in contact with sides of standard cell array | Layout in which sides of proximity dummy cells are not in contact with sides of standard cell array |
| None | 0.52 | |
| A | 1.41 | 0.66 |
| B | 1.47 | 0.58 |
| C | 1.25 | 0.61 |

Table 1 shows evaluation results with the process performance index Cp as a scale. The deviation of the size of the resist pattern for the gate pattern of the standard cell at the left- and right-most portions of the standard cell array is evaluated. The first proximity dummy bands are formed by arranging the proximity dummy cells A (FIG. 15), B (FIG. 16), or C (FIG. 17) along the left and right sides of the standard cell array such that the sides of the proximity dummy cells are in contact with the sides of the standard cell array. As comparative examples, Table 1 further shows evaluation results for the cases where no proximity dummy band is formed, and that the proximity dummy bands are formed by arranging the proximity dummy cells such that the sides of the proximity dummy cells are not in contact with the sides of the standard cell array.

In general, it is known that the process performance index Cp of 1 or more represents sufficient process performance, and that the index Cp of less than 1 represents insufficient process performance (see, for example, p. 118, New Edition of Quality Handbook, 2nd ed., Japan Quality Association, Edited by Teshuichi Asaka, et al.).

As shown in Table 1, when the proximity dummy cells of any of A, B, and C are arranged such that the left or right sides of the proximity dummy cells are in contact with the left or right side of the standard cell array, the process performance index exhibits 1 or more. Accordingly, a determination is made that the photolithographic process for forming the resist pattern for the gate layer is performed with a sufficient process performance, or a sufficient processing precision.

On the other hand, in a case where no proximity dummy cells are arranged, the process performance index Cp exhibits a value that is less than 1. Accordingly, a determination is made that the photolithographic process for forming the resist pattern for the gate layer is performed with an insufficient process performance, or a processing precision. Furthermore, in a case where the proximity dummy cells of any of A, B, and C are arranged such that the left or right sides of the proximity dummy cells are not in contact with the left or right side of the standard cell array, the process performance index Cp exhibits a value that is less than 1. Accordingly, a determination is made that the process performance (processing precision) is insufficient. It should be noted that the gap between the sides of the proximity dummy cells and the side of the standard cell array is set to be 0.2 µm, which is the minimum permissible space according to the layout design rule for the 0.13 µm generation semiconductor integrated circuit.

As can be understood from the results described above, it is confirmed that the proximity dummy cells should be arranged such that the sides of the proximity dummy cells are in contact with the side of the standard cell array for obtaining a sufficient process performance.

Figure 18:
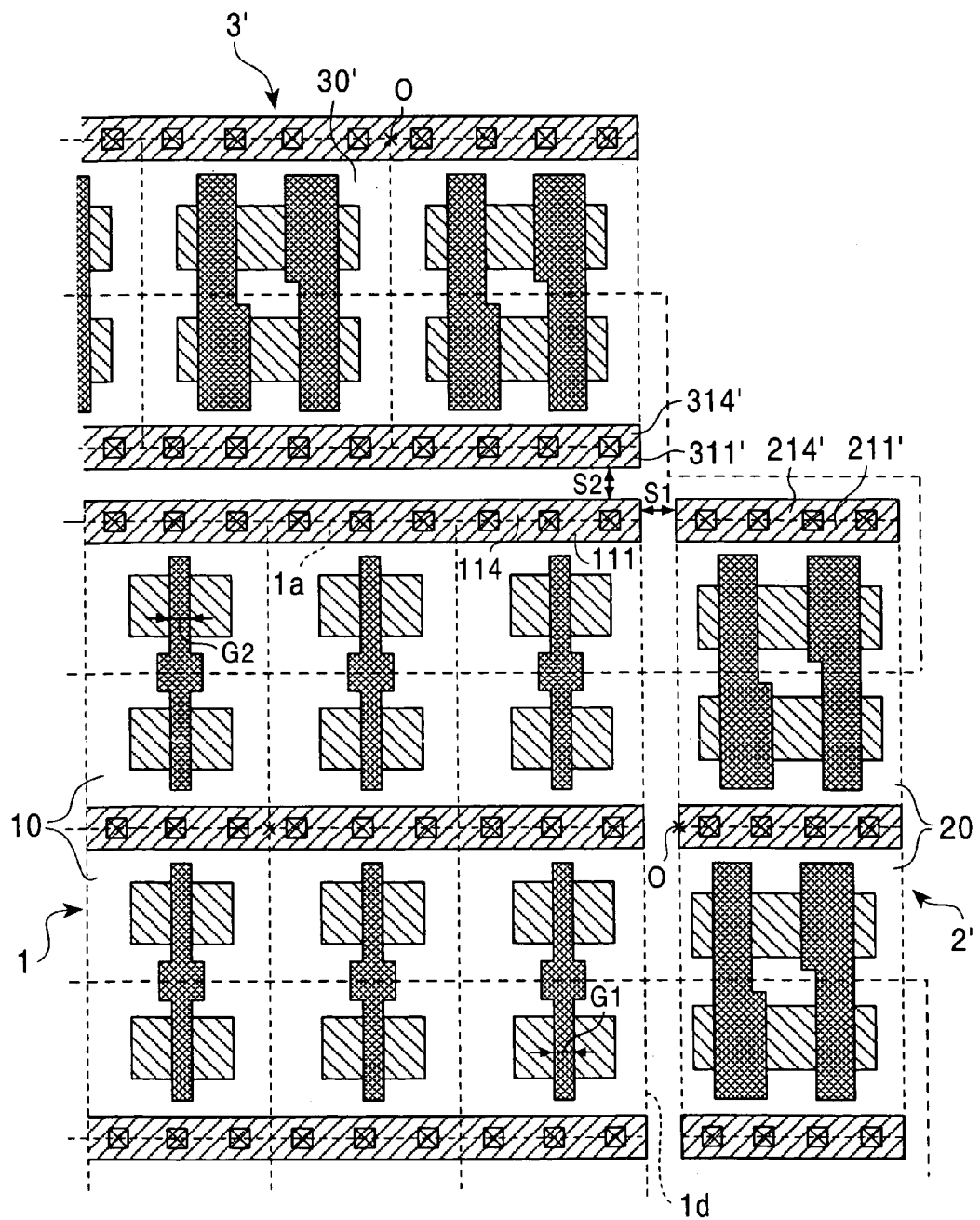
FIG. 18 is a diagram illustrating an exemplary layout structure of semiconductor integrated circuit in which the proximity dummy bands are formed along the sides of the standard cell array with gaps.

Next, further detailed description of the comparative examples in which the proximity dummy cells are arranged such that a gap is formed between the sides of the proximity dummy cells and the side of the standard cell array with reference to the drawings is made. FIG. 18 is a diagram showing an exemplary layout structure of semiconductor integrated circuit in which the first and second proximity dummy bands are formed along the sides of the standard cell array. In contrast to the layout structure shown in FIG. 11, in this exemplary layout structure, the sides of the proximity dummy cells forming the proximity dummy bands are not in contact with the side of the standard cell array. In other words, the proximity dummy bands are arranged along the sides of the standard cell array with gaps between them.

FIG. 18 shows an upper-right portion of the standard cell array 1, an upper-right portion of the first proximity dummy band 2', and an upper-right portion of the second proximity dummy band 3'. In the layout structure of a semiconductor integrated circuit, patterns such as power-supply wiring patterns and active region patterns adjacent with each other must be separated by a space equal to or greater than a minimum space determined by the layout design rule in order to ensure the electrical isolation between them.

For example, the power-supply wiring pattern 114 of the standard cell array 1 and the power-supply wiring pattern 214' of the first proximity dummy cell 20' must be separated from each other by a space equal to or greater than the minimum space (see arrow S1 in the drawing) determined by the layout design rule. Similarly, the active region pattern 111 and 211' arranged underneath the power-supply wiring patterns 114 and 214' must be separated with each other by a space equal to or greater than the minimum space.

Similarly, the power-supply wiring pattern 114 arranged along the upper side of the standard cell array 1 and the power-supply wiring pattern 314' arranged along the side of the second proximity dummy cell 30' facing the upper side of the standard cell array 1 must be separated with a space equal to or greater than the minimum space (see arrow S2 in the drawing) determined by the pattern layout rule. Similarly, the active region patterns 111 and 311' arranged underneath the power-supply wiring patterns 114 and 314' must be separated from each other by a space equal to or greater than the minimum space.

FIG. 18 illustrates an example of the layout structure of a 0.13 μm generation semiconductor integrated circuit in which the minimum spaces S1 and S2 are determined to be 0.2 μm. As described above, when forming the first and second proximity dummy bands along the sides of the standard cell array with gaps between them, the gaps cannot be made to be smaller than a certain value because the layout structure must be designed according to the layout design rule. Therefore, the gaps between the patterns of the standard cells arranged in the outer-most portion of the standard cell array and the proximity dummy patterns in the proximity dummy band cannot be made too small. As a result, the formation of the standard cell pattern at the outer-most portion of the standard cell by the photolithographic process cannot be made with a high dimensional controllability, because the processing is affected by the scattering of exposing light passing through the gaps.

For example, in the photolithographic process for forming the resist pattern corresponding to the gate pattern having a dimension (width) in the logical layout structure of 0.12 μm, denoted by the reference character G1 in FIG. 18, in the standard cell at the right-most portion of the standard cell array, the process performance index exhibits 0.66. Similarly, in the photolithographic process for forming the resist pattern corresponding to the gate pattern with the same dimension of 0.12 μm, denoted by the reference character G2 in the drawing, in the standard cell arranged at the upper-most portion of the standard cell array, the process performance index exhibits 0.73. As described above, such a layout structure leads to an insufficient level of the process performance.

Furthermore, in the comparative layout structure shown in FIG. 18, the spaces S1 and S2 are not equal to the pitch of the grid lines Gw and Gh shown in FIG. 13. Therefore, the origins of the proximity dummy cells 20' and 30' are not placed on any of the intersections of the horizontal and vertical grid lines. Thus, the proximity dummy cells 20' and 30' cannot be arranged by using the automatic placing/routing function of the CAD tool using the grid lines Gw and Gh as a scale. In order to make it possible to arrange the proximity dummy cells using the grid lines as a scale, it is necessary to make the spaces S1 and S2 further larger.

Furthermore, in the layout structure shown in FIG. 18, the power-supply wiring pattern 114 in the standard cells 10 and the power-supply wiring pattern 214' in the first proximity dummy cell 20' do not merge to form a continuous pattern simply by arranging the proximity dummy cell. The same can be said for the power-supply wiring pattern 314' in the second proximity dummy cell 30'. Accordingly, there is a need to arrange additional wiring patterns so as to connect the different power-supply wiring patterns.

As described above, it has been confirmed that the first proximity dummy cell needs to be arranged so as to be in contact with the vertical side 1c or 1d of the standard cell array 1, and the second proximity dummy cell needs to be arranged so as to be in contact with the horizontal side 1a or 1b of the standard cell array 1, for allowing the user to make automatic layout while suppressing the deviation in the pattern dimension.

As another comparative example, effects of the first proximity dummy cell having a height not equal to k times the common height of the standard cells (k is an integer not less than one) is evaluated. Description of the result of the evaluation is made below.

Figure 19:
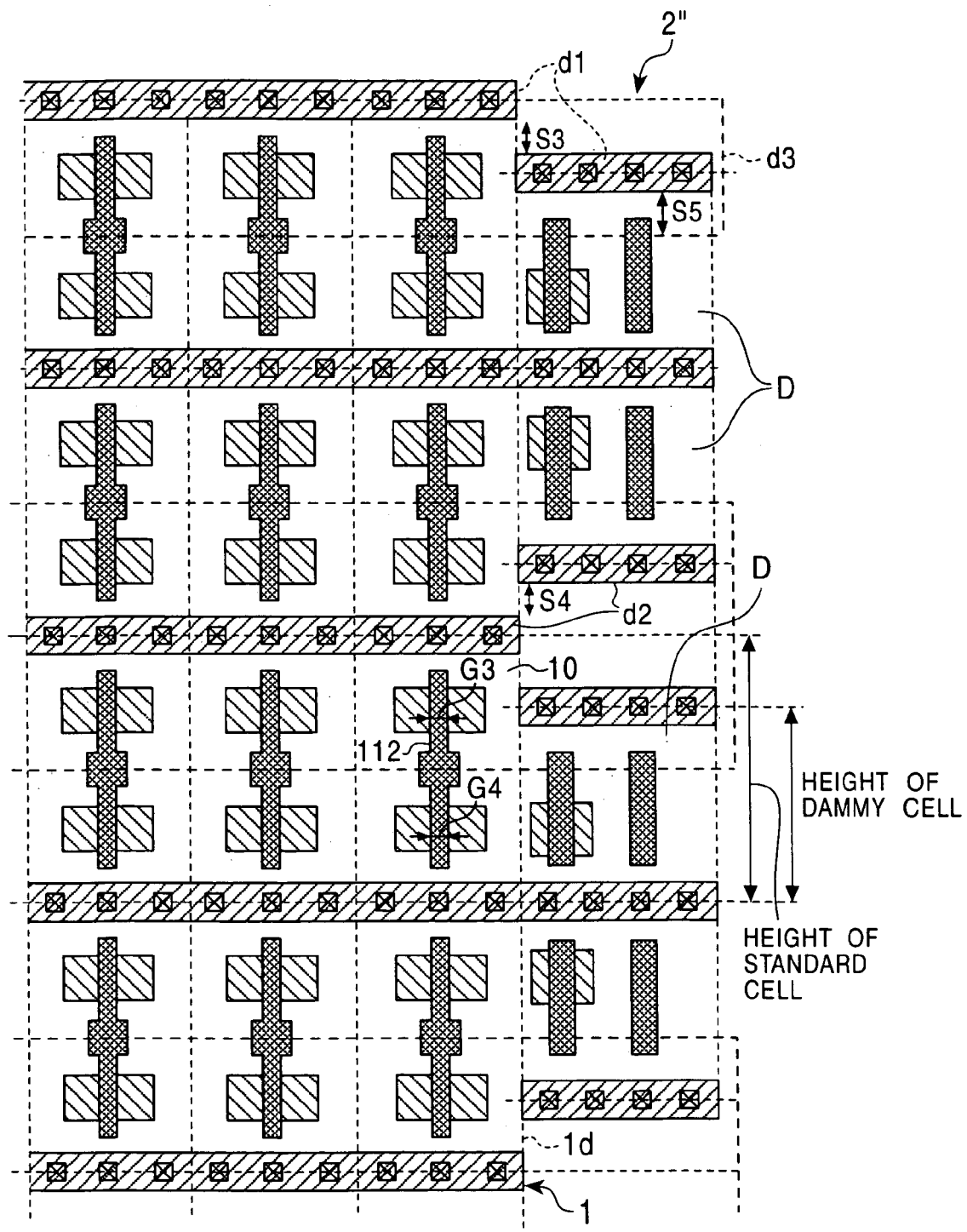
FIG. 19 is a diagram illustrating an exemplary layout structure of semiconductor integrated circuit in which the proximity dummy cells having a height less than the common height of the standard cell are arranged such that the sides of the proximity dummy cells are in contact with the vertical side of the standard cell array.

FIG. 19 is a diagram showing an example of the layout structure in which proximity dummy cells having a height less than the common height of the standard cells are arranged along the vertical side of the standard cell array. Specifically, FIG. 19 shows a right portion of the standard cell array 1, and a portion of the first proximity dummy band 2" formed by arranging proximity dummy cells D along the right side of the standard cell array 1.

In such a layout structure, the space (see the arrow S3 in FIG. 19) between the active region patterns d1 in the standard cell and that in the proximity dummy cell, the space (see the arrow S4 in FIG. 19) between the power-supply wiring patterns d2 in the standard cell and that in the proximity dummy cell, and the space (see the arrow S5 in FIG. 19) between the active region pattern d3 and the N-well pattern in the proximity dummy cell, must satisfy the pattern layout rule. Accordingly, the height of the proximity dummy cell is restricted to be within certain ranges.

In the layout structure of the semiconductor integrated circuit shown in FIG. 19, certain portions of the right side 1d of the standard cell array 1 are not in contact with any of the proximity dummy cells. Thus, large spaces where no dummy pattern is arranged are formed along these portions along the right side. This leads to deterioration in the uniformity of pattern density and the pattern regularity.

In the layout structure of the semiconductor integrated circuit shown in FIG. 19, the dimensions (widths) of two portions of the resist pattern, which correspond to the gate pattern in the standard cell in the right-most portion of the standard cell array 1, denoted by G3 and G4 in the drawing, are measured. The portion denoted by G3 is positioned near the aforementioned space, leading to deterioration in the uniformity of pattern density and the pattern regularity. On the other hand, the portion denoted by G4 faces the proximity dummy cell D. Therefore, the uniformity of the pattern density and the pattern regularity are maintained.

Figure 20:
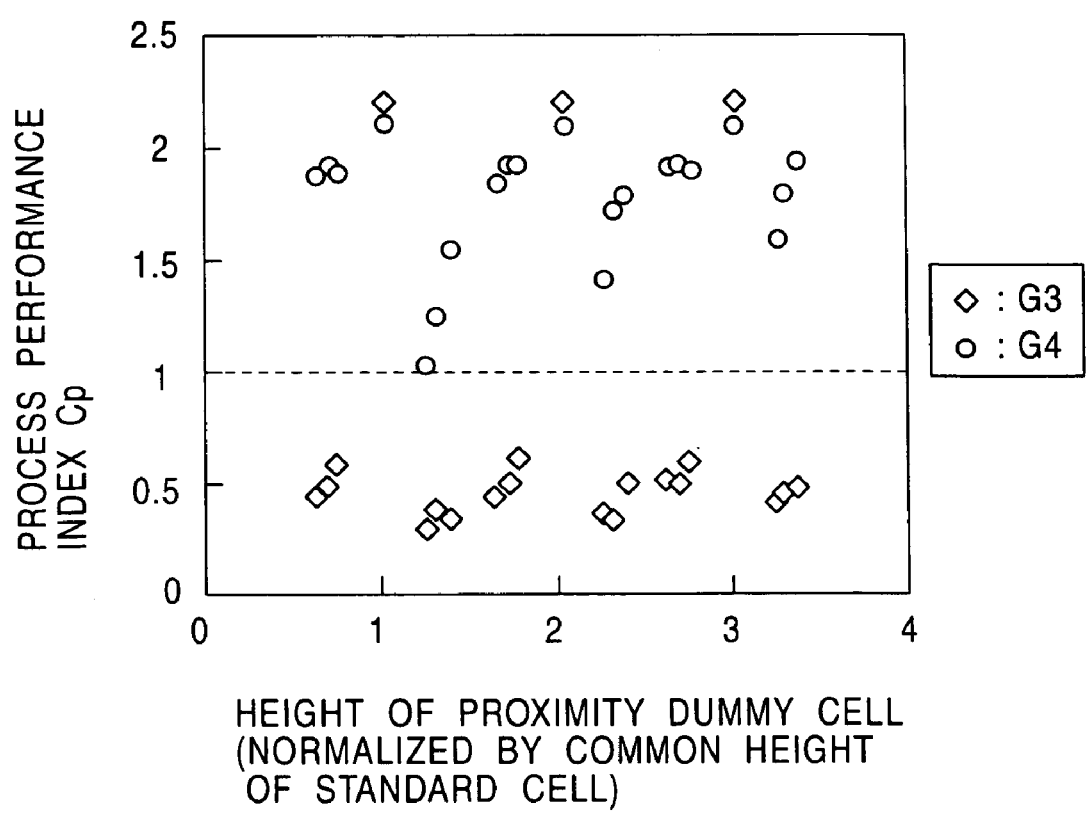
FIG. 20 is a graph illustrating evaluation results of gate pattern size variation represented by process performance index Cp, in relation to the height of the proximity dummy cells arranged along the vertical sides of the standard cell array.

FIG. 20 is a graph showing the evaluation results of the deviation of the resist pattern dimension corresponding to the gate pattern, represented by the process performance index Cp. The evaluation results are shown in relation to the height of the proximity dummy cells arranged so as to be in contact with the left and right sides of the standard cell array 1.

The horizontal axis of the graph shown in FIG. 20 represents the height of the proximity dummy cell normalized by the height of the standard cell. That is, "1" represents the height equal to the common height of the standard cells, and "2" represents twice the height of the common height of the standard cells. As described above, the height of the proximity dummy cell is restricted by the layout design rule to be within certain ranges. The vertical axis of the chart shown in FIG. 20 represents the process performance index Cp of the photolithographic process for forming the resist pattern for the gate layer.

As shown in FIG. 20, the process performance index Cp for the portion of the gate pattern denoted by G4 exhibits a value exceeding 1 regardless of the height of the proximity dummy cell. For the portion of the gate pattern denoted by G3, the process performance index Cp exhibits a value exceeding 1 when the height of the proximity dummy cell is k times the height of the standard cell (k is an integer not less than one). However, when the height of the proximity dummy cell is not equal to k times the height of the standard cell (k is an integer not less than one), the process performance index Cp exhibits a value that is less than 1. Accordingly, it is confirmed that the photolithographic process exhibits insufficient process performance when the height of the proximity dummy cell is not equal to k times the height of the standard cell (k is an integer not less than one).

Figure 21:
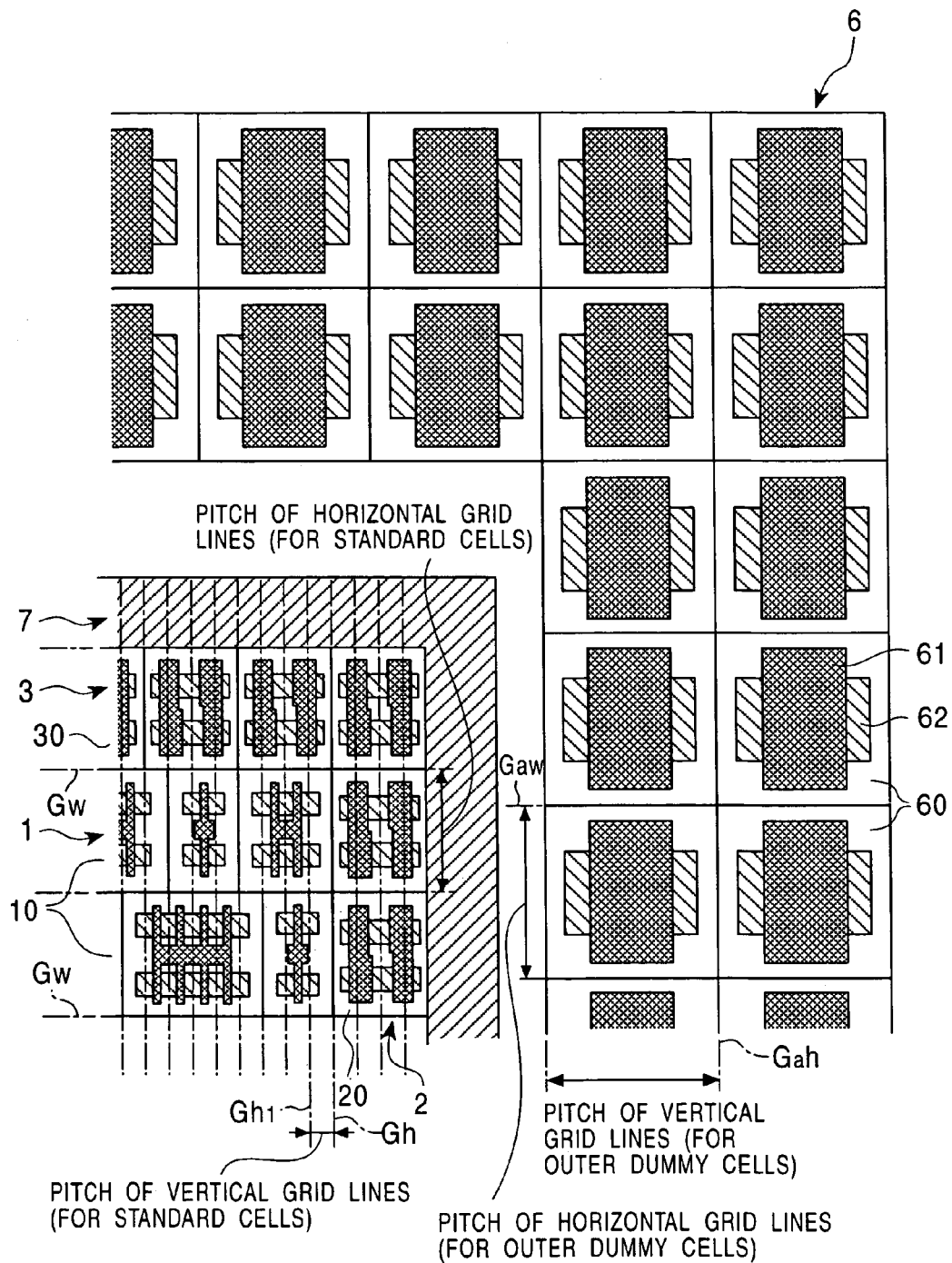
FIG. 21 is a diagram illustrating an exemplary layout structure of semiconductor integrated circuit in which outer dummy cells are arranged outside of the first and the second proximity dummy bands according to an exemplary embodiment of this invention.

Next, a description of outer dummy cells arranged outside of the first and the second proximity dummy bands is made. FIG. 21 is a diagram illustrating an exemplary layout structure in which outer dummy cells are arranged outside of the first and the second proximity dummy bands. FIG. 21 shows a portion of an exemplary layout structure of a semiconductor integrated circuit including an upper-right portion of the standard cell array 1. Specifically, FIG. 21 shows the standard cell array 1 formed of the standard cells 10, the first and second proximity dummy bands 2 and 3 formed of the first and second proximity dummy cells 20 and 30, and a outer dummy region 6 formed of outer dummy cells 60.

The standard cell array 1 shown in FIG. 21 includes three types of standard cells: ones having a width of three times the unit width, ones having a width of four times the unit width, and ones having a width of six times the unit width. On the other hand, in the layout structure shown in FIG. 21, the proximity dummy bands 2 and 3 are formed with the same proximity dummy cells 20 and 30 having the same height equal to the common height of the standard cells 10 and a width of four times the unit width of the standard cells.

The standard cells 10 and the proximity dummy cells 20 and 30 are arranged along the common grid lines Gw and Gh. That is, the standard cells 10 and the proximity dummy cells 20 and 30 are arranged such that the origins of these cells are placed on the intersections of the horizontal grid lines Gw (arranged with a pitch equal to the common height of the standard cells) and the vertical grid lines Gh (arranged with the pitch equal to the unit width of the standard cells). Thus, each of the standard cells 10 and the proximity dummy cells 20 and 30 are arranged such that the upper, lower, left, and right sides of their frames are in contact with the common grid lines Gw and Gh.

The proximity dummy cells 20 and 30 are arranged such that their frames are in contact with the sides of the standard cell array 1. A forbidden region 7 is made so as to be in contact with the outer sides of the proximity dummy bands 2 and 3. The forbidden region 7 is provided in order to arrange the outer dummy cells 60 using logical synthesizing described later.

The outer dummy cells 60 are arranged outside the forbidden region 7 so as to fill the area outside the proximity dummy bands. Thereby the outer dummy region 6 is formed. The outer dummy cell 60 includes a gate pattern 61 and an active region pattern 62 arranged underneath the gate pattern 61. As shown in FIG. 21, the outer dummy cell 60 has a simple structure, leading to a small data size per unit area, as compared with the proximity dummy cell. Accordingly, the outer dummy cells 60 are suitably used for filling the large area with a dummy pattern.

The outer dummy cells 60 are arranged along the horizontal grid lines Gaw and the vertical grid lines Gah, which are arranged with pitches independent of the pitches of the grid lines Gw and Gh used for arranging the standard cells 10 and the proximity dummy cells 20 and 30. Accordingly, the arrangement of the outer dummy cells 60 is performed using the logical synthesizing described below.

Figure 22:
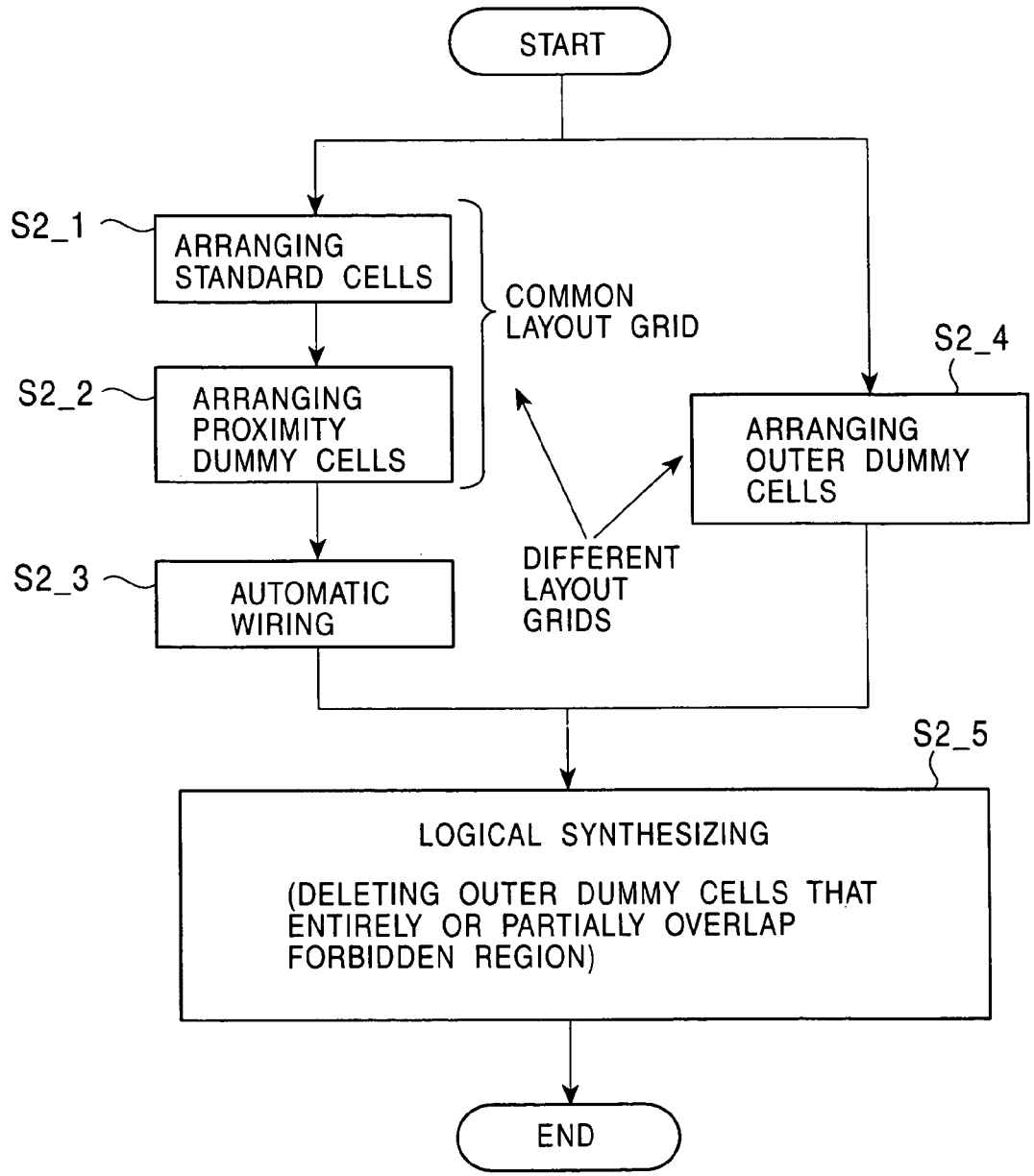
FIG. 22 is a flowchart illustrating an exemplary layout method of a semiconductor integrated circuit in which outer dummy cells, as well as the standard cells and the proximity dummy cells, are arranged according to an exemplary embodiment of this invention.

Next, a description of a method for designing the layout structure of semiconductor integrated circuit shown in FIG. 21 on a CAD tool is made. FIG. 22 is a flowchart illustrating an exemplary method for designing a layout structure of a semiconductor integrated circuit. The exemplary method arranges the outer dummy cells as well as the standard cells and the proximity dummy cells. In the layout method shown in FIG. 22, the standard cells and the proximity dummy cells are automatically arranged, using an automatic placing/routing function of a CAD tool, on a chip area according to a predetermined algorithm and a program using a common layout grids as a scale. Furthermore, the outer dummy cells are arranged by logical synthesizing, independently of the arrangement using the automatic placing and routing function.

At first, in step S2_1, standard cells required for the logical functions of the integrated circuit are selected from the library, and are arranged in the chip area using the common layout grid lines Gw and Gh shown in FIG. 21 as a scale. Subsequently, in step S2_2, the proximity dummy cells are arranged using the common layout grid lines Gw and Gh as a scale in the same way. Next, in step S2_3), automatic wiring is performed. It should be noted that wiring patterns are not shown in FIG. 21. Then, in step S2_4, the outer dummy cells are arranged over the entire chip area with dedicated layout grid lines Gaw and Gah shown in FIG. 21 as a scale, independently of the aforementioned steps. Finally, logical synthesizing is performed. The logical synthesizing in Step S2_5 is performed as follows, for example.

First, in the chip area on the CAD tool, regions where the standard cells and the proximity dummy cells have been arranged by the automatic placing/routing function are two-dimensionally expanded by ±1.0 μm. The expanded regions are merged into a "forbidden region" where arrangement of the outer dummy cell is forbidden. Then, among the outer dummy cells arranged over the entire chip area, ones that entirely or partially overlap the forbidden region are deleted. Subsequently, the layout data of the remaining outer dummy cells and the layout data of the standard cell array and the proximity dummy bands, created by the automatic placing/routing function, are merged into a layout data of the semiconductor integrated circuit.

In the exemplary layout method shown in FIG. 22, a description has been made wherein outer dummy cells that entirely or partially overlap the forbidden region are deleted. The layout method according to this invention is not restricted to this example. For example, while deleting the outer dummy cells that entirely overlap the forbidden region, it is also possible to modify the dummy pattern of the outer dummy cell that partially overlap the forbidden region using a predetermined logical expression. In the exemplary layout method shown in FIG. 22, only the standard cells and the proximity dummy cells are automatically arranged. However, macro cells such as memory macro cells, analog macro cells, and so on, may be also automatically arranged as well as the standard cells, and the wiring may be automatically made for the layout thus automatically designed.

Although not shown in FIG. 22, a practical semiconductor integrated circuit has a layout structure in which a plurality of input/output circuit cells for inputting/outputting signals from/to an external circuit outside of the semiconductor integrated circuit are also arranged as well as the standard cells, macro cells, and so on. Furthermore, wiring is made between the standard cells, the macro cells, and the like, and the input/output circuit cells.

Figure 23:
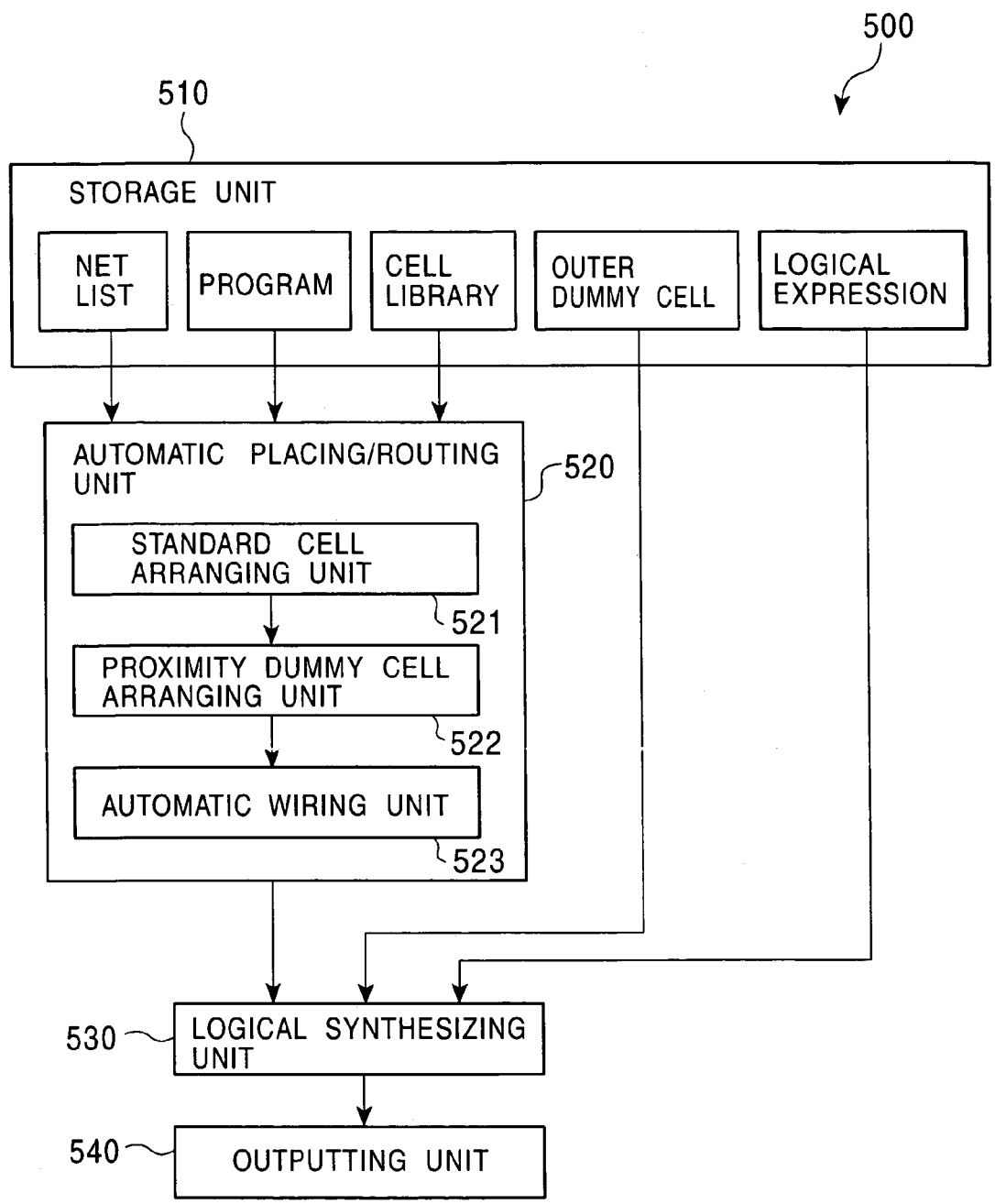
FIG. 23 is a functional block diagram of an exemplary layout design system for executing processing according to the flowchart shown in FIG. 22 according to an exemplary embodiment of this invention.

FIG. 23 shows an exemplary functional block diagram of the CAD tool (layout design system) for executing processing according to the flowchart shown in FIG. 22. The exemplary layout design system 500 shown in FIG. 23 includes a storage unit 510, an automatic placing/routing unit 520, a logical synthesizing unit 530, and an outputting unit 540.

The exemplary storage unit 510 stores a net list, a layout program, a cell library, an outer dummy cell, and a logical expression. The net list stores connection information, i.e., the information with regard to the connection between circuit devices such as MOS transistors, resistors, capacitors, and the like, and characteristics of the circuit devices such as on-state current, resistance, capacitance, and the like. The layout program stores pad-layout information, power-supply layout information, layout design rule, and the like.

The cell library stores a plurality of types of standard cells, and one or more types of proximity dummy cells. Each of the plurality of types of standard cells stored in the cell library have a function of an inverter, buffer, XOR gate, AND gate, multiplexer, or the like. Furthermore, the plurality of types of standard cells includes standard cells having the same function and different driving capabilities, such as one, two, and five time the unit driving capability. That is, the cell library stores the standard cells such as is shown in FIGS. 2 through 5.

The exemplary automatic placing/routing unit 520 has functions for reading out the net list, the layout program, and the cell library that is stored in the storage unit 510, and executing automatic placing/routing according to the net list and the layout program. The automatic placing/routing unit 520 includes a standard cell arranging unit 521 for executing the processing in Step S2_1 shown in FIG. 22, a proximity dummy cell arranging unit 522 for executing the processing in Step S2_2, and an automatic wiring unit 523 for executing the processing in Step S2_3. The standard cell arranging unit 521 selects the standard cells required for realizing the logical functions of the semiconductor integrated circuit based upon the net list, and then arranges the standard cells thus selected.

The logical synthesizing unit 530 reads out the outer dummy cell, and arranges the outer dummy cells on a chip area. Subsequently, the logical synthesizing unit 530 merges the layout data of the outer dummy cells thus arranged and the layout data of the standard cell array and the proximity dummy bands created by the automatic placing/routing unit 520, according to the logical expression stored in the storage unit 510. That is, the logical synthesizing unit 530 performs the processing in Steps S2_4 and S2_5 shown in FIG. 22. The exemplary outputting unit 540 outputs the layout data thus created in a certain layout format such as gdsII or the like.

Figure 24:
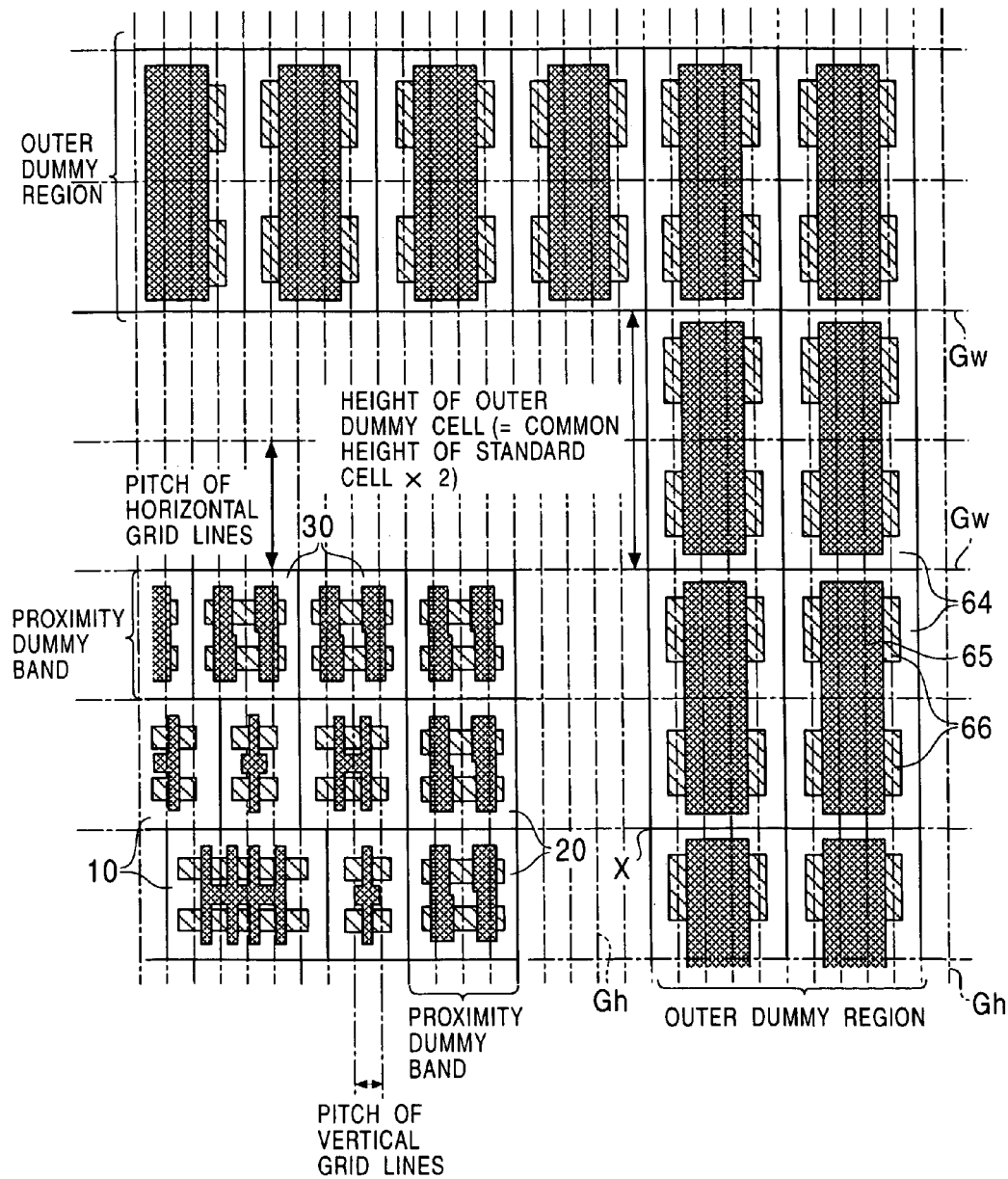
FIG. 24 is a diagram illustrating a part of an exemplary layout structure of semiconductor integrated circuit in which the outer dummy cells having a height of $k_1$ times the common height of the standard cell and with a width of $m_1$ times the unit width of the standard cells are arranged outside of the first and the second proximity dummy bands according to an exemplary embodiment of this invention.

FIG. 24 is a diagram illustrating a part of an exemplary layout structure of semiconductor integrated circuit in which outer dummy cells that are different from the outer dummy cells shown in FIG. 21 are arranged. The layout structure shown in FIG. 24 includes the same standard cells 10, the same first and second proximity dummy cells 20 and 30, as in FIG. 21. The outer dummy cell 64 shown in FIG. 24 includes a gate pattern 65 and an active region pattern 66 arranged underneath the gate pattern 65 in the same way as with the outer dummy cell 60 shown in FIG. 21. However, the outer dummy cell 64 has a height of $k_1$ times the common height of the standard cells 10 ($k_1$ is an integer not less than one), specifically, twice the height of the standard cell 10, and a width of $m_1$ times the unit width of the standard cells ($m_1$ is an integer not less than one), specifically, five times the unit width of the standard cells 10.

The outer dummy cells 64 are arranged in a chip area using the horizontal grid lines Gw and the vertical grid lines Gh, which are used to arrange the standard cells and the first and the second proximity dummy cells, as common layout grid lines. That is, the outer dummy cell 64 is arranged such that the origin X positioned at the corner of the frame is placed at one of the intersections of the grid lines Gw and Gh. Accordingly, the arrangement of the outer dummy cells 64 is performed without logical synthesizing.

For example, the automatic placing/routing processing unit 520 of the layout design system such as the one shown in FIG. 23, which automatically arranges the standard cells 10 and the proximity dummy cells 20 and 30, further automatically arranges the outer dummy cells 64. Specifically, the outer dummy cells may be automatically arranged with a grid point, which is distanced from the outer corner of the proximity dummy bands by certain numbers of grid steps in the vertical and horizontal directions, as the origin, for example.

Figure 25:
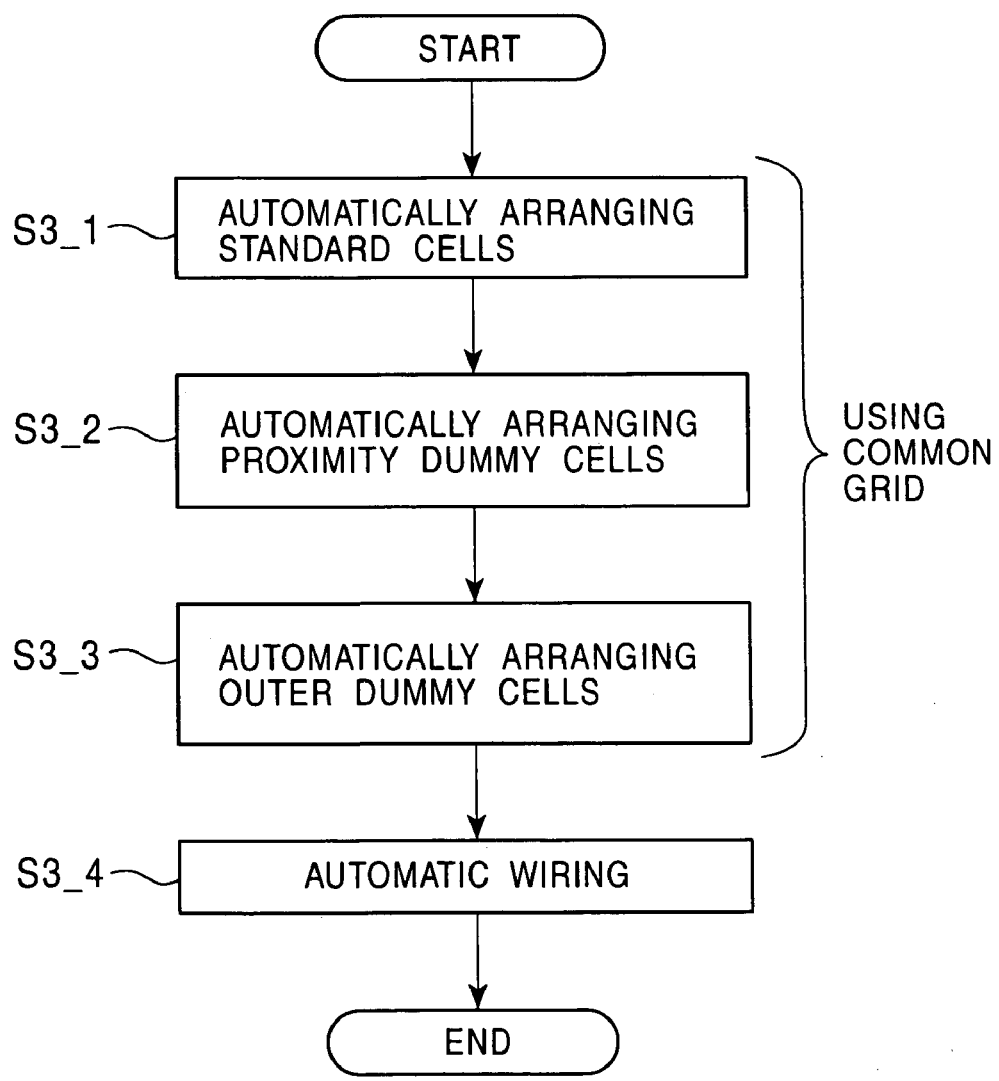
FIG. 25 is a flowchart illustrating an exemplary layout method for designing the layout structure of semiconductor integrated circuit shown in FIG. 24 according to an exemplary embodiment of this invention.

Next, a description of a method for designing the layout structure of semiconductor integrated circuit shown in FIG. 24 on a CAD tool is made. FIG. 25 is a flowchart illustrating an exemplary layout method for designing the layout structure of semiconductor integrated circuit shown in FIG. 24. The layout method includes preparing the standard cell, the first and second proximity dummy cells, and the outer dummy cell having a height of $k_1$ times the common height of the standard cells ($k_1$ is an integer not less than one) and a width of $m_1$ times the unit width of the standard cells ($m_1$ is an integer not less than one), and forming the standard cell array, the first and second proximity dummy bands, and the outer dummy region by arranging these cells.

In the exemplary layout method shown in FIG. 25, all the standard cells, the first and second proximity dummy cells, and the outer dummy cells, are automatically arranged and wired by the function of automatic placing/routing unit of a layout design system using the common layout grids as a scale. That is, in Step S3_1, the standard cells are automatically arranged using the common grid lines Gw and Gh shown in FIG. 24 as a scale to form the standard cell array. Next, in Step S3_2, the proximity dummy cells are automatically arranged to form the proximity dummy bands using the common grid lines as a scale. Then, in step S3_3, the outer dummy cells are automatically arranged to form the outer dummy region also using the common grid lines as a scale. Finally, in Step S3_4, automatic wiring is performed (Step S3_4).

The exemplary layout method shown in FIG. 25 may be performed using a layout design system similar to the system 500 shown in FIG. 23, except for including no logical synthesizing means such as the logical synthesizing unit 530, and further including an outer dummy cell arranging unit in the automatic placing/routing unit 520 for executing the processing in Step S3_3.

FIG. 25 shows an exemplary layout method in which the standard cells, the proximity dummy cells, and the outer dummy cells are prepared beforehand, and the automatic placing/routing is performed. According to this example, however, other macros such as memory macro, analog macro, and so on, which are not formed by arranging the standard cells, may also be prepared and then the automatic placing/routing is performed.

The difference in variations in the gate delay time between the layout structures with and without the outer dummy region is examined below. Description will be made below regarding the results with reference to Table 2.

TABLE 2

|  | Without outer dummy region | With outer dummy region |
| --- | --- | --- |
| Variation in gate delay time between central portion and four-corners (%) | 20.1 | 6.1 |

This table shows variations in the delay time measured by gate-delay measurement circuits provided within the semiconductor integrated circuit having the layout structure with and without the outer dummy region. The semiconductor integrated circuit includes a total of five gate-delay measurement circuits at the central portion and at the four corners of the standard cell array. It should be noted that in either cases, the layout structure includes the proximity dummy bands.

The semiconductor integrated circuit without the outer dummy region exhibits a large variation in the delay time, as much as approximately 20%, between the values measurement by the measurement circuit provided at the central portion and those provided at the four corners of the standard cell array. On the other hand, the semiconductor integrated circuit with the outer dummy region exhibits a much smaller variation in the delay time, as small as approximately 6%.

It can be understood that, in the exemplary layout structures shown in FIGS. 21 and 24, i) the proximity dummy patterns arranged in the proximity dummy bands improve the uniformity of pattern density and the pattern regularity over a short range (around 1 μm) and suppress the deviation in the pattern size of the resist pattern formed by the photolithographic process, and ii) the outer dummy patterns arranged in the outer dummy region improve the uniformity of pattern density over a longer range (around 100 μm) and suppress the variation in the etching process that uses the resist pattern as a mask. Accordingly, the dimensional variation in the device pattern (in particular, gate pattern) is suppressed. As a result, the variation in gate delay time is suppressed.

It should be noted that in order to suppress the dimensional deviation occurring in the photolithographic process, the dummy pattern in the proximity dummy cell needs to be arranged without creating a large space between the dummy pattern and the pattern of the standard cell. That is, it is confirmed that, in the layout structure in which the proximity dummy cells are arranged without making the sides of the proximity dummy cells in contact with the side of the standard cell array, such as shown in FIG. 18, the effect on suppression of the dimensional deviation is insufficient.

The reason is that the photolithographic process is susceptible to the non-uniformity of pattern density and the pattern irregularity over a short range. On the other hand, the etching process is greatly affected by the non-uniformity of pattern density over a relatively long range, but is not greatly affected by the non-uniformity of pattern density over a short range. Accordingly, even in the layout structure such as shown in FIGS. 21, 24, the deviation occurring in the etching process is significantly suppressed due to the improved uniformity of pattern density over a long range by the outer dummy region 6, even though a gap is formed between the proximity dummy bands 2 and 3 and the outer dummy region 6.

Finally, description of examples of the layout structure of the semiconductor integrated circuit, different from the one shown in FIG. 1 is made. An actual layout structure of semiconductor integrated circuit according to this invention is not restricted to the one having the standard cell array formed in the shape of a rectangle. The standard cell array may have various shapes such as the shapes of "L", "U", or the like, when the standard cell array is combined with macro cells such as memory macro or the like.

Figure 26:
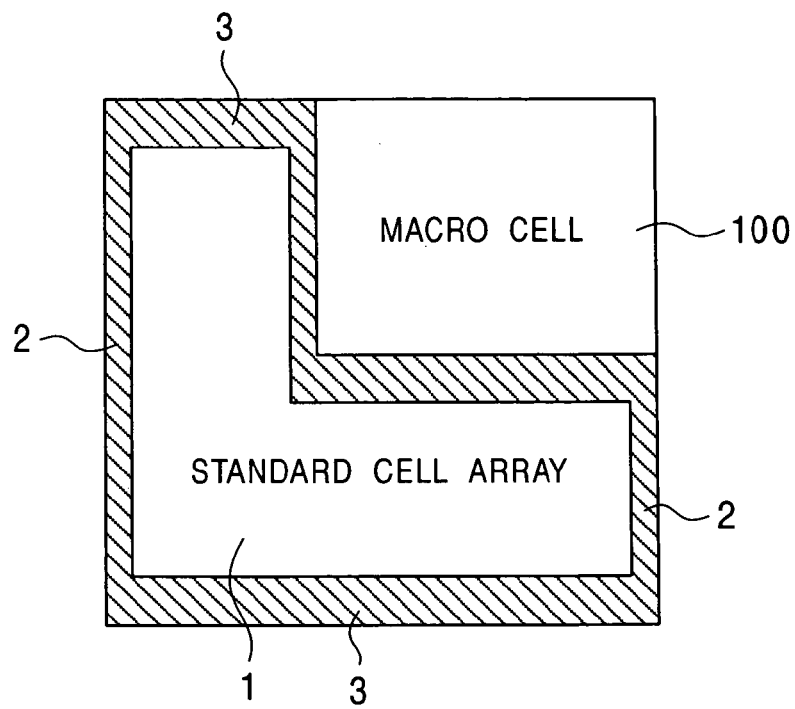
FIG. 26 is a schematic diagram illustrating an exemplary layout structure of semiconductor integrated circuit having a standard cell array formed in the shape of "L" according to an exemplary embodiment of this invention.
Figure 27:
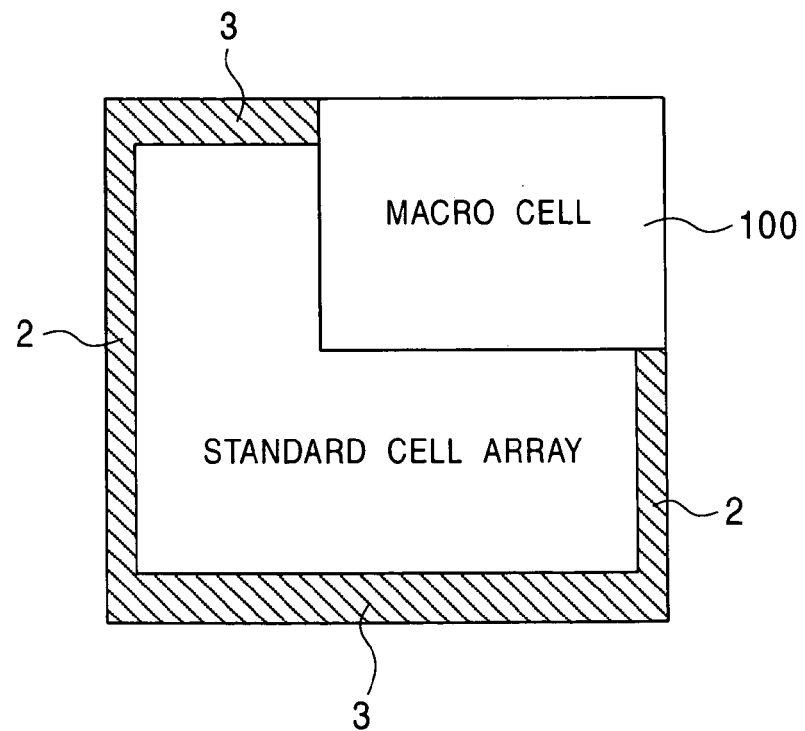
FIG. 27 is a schematic diagram illustrating another exemplary layout structure of semiconductor integrated circuit having a standard cell array formed in the shape of "L" according to an exemplary embodiment of this invention.

FIG. 26 is a schematic diagram showing an exemplary layout structure of semiconductor integrated circuit having a standard cell array formed in the shape of "L". FIG. 27 is a schematic diagram showing another exemplary layout structure of a semiconductor integrated circuit having a standard cell array formed in the shape of "L".

The standard cell array such as the standard cell array 1 formed in the shape of "L" shown in FIG. 26 or FIG. 27, the standard cell array formed in the shape of "U", or the like, has three or more vertical sides and three or more horizontal sides. In such a case, the proximity dummy bands 2 and 3 are preferably formed along all the sides of the standard cell array as shown in FIG. 26 for improving the uniformity of pattern size. However, in some cases such as shown in FIG. 27, formation of the proximity dummy bands 2 and 3 along the sides of the standard cell array except for the sides facing a macro cell 100, exhibits sufficient effects.

For example, when the macro cell 100 has fine patterns with high pattern density, the pattern in the macro cell improves the uniformity of pattern density and the pattern regularity in the portions of the standard cell array around the sides facing the macro cell 100. Accordingly, deviation in the pattern size may be suppressed without forming the proximity dummy band along one or some of the sides facing the macro cell 100.

As such, according to this invention, it is not always necessary to form the proximity dummy bands along all of the sides of the standard cell. In other words, there are cases where it is sufficient to form the proximity dummy bands along some, but not all, of the sides of the standard cell array. It should be noted that, even in the layout structure shown in FIG. 27, one of the first proximity dummy bands is formed along an entire length of one of the vertical sides (the left side) of the standard cell array that extends over the entire height of the standard cell array. Also in the layout structure shown in FIG. 27, one of the second proximity dummy bands is formed along an entire length of one of the horizontal sides (the lower side) of the standard cell array that extends over the entire width of the standard cell array.

While this invention has been described in conjunction with the specific embodiments thereof, it is evident that many alternatives, modification, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A method of forming, on a computer system, a layout structure of a semiconductor integrated circuit, comprising:
preparing a first plurality of types of standard cells having respective logical functions, a first proximity dummy cell, and a second proximity dummy cell in a library;
each of the first plurality of types of standard cells including standard cell patterns in a plurality of layers arranged in a standard cell frame having an upper, a lower, a left, and a right side, the first plurality of types of standard cells having a common height defined by distances between the upper and the lower sides of the standard cell frames;
the first proximity dummy cell including a first proximity dummy pattern, which does not contribute to a logical function of the semiconductor integrated circuit, in at least one of the plurality of layers arranged in a first proximity dummy cell frame having an upper, a lower, a left, and a right side, the first proximity dummy cell having a height defined by a distance between the upper and the lower sides of the first proximity dummy cell frame of $k_1$ times the common height of the standard cells, where $k_1$ is an integer not less than one;
the second proximity dummy cell including a second proximity dummy pattern, which does not contribute to the logical function of the semiconductor integrated circuit, in the at least one of the plurality of layers arranged in a second proximity dummy cell frame having an upper, a lower, a left, and right side;
selecting a second plurality of types of standard cells required for realizing the logical function of the semiconductor integrated circuit from the first plurality of types of standard cells;
forming a channel-less type standard cell array by arranging one or more of each of the second plurality of types of standard cells in rows and columns, an outer perimeter of the standard cell array having vertical and horizontal sides each formed with the sides of the frames of the standard cells arranged in an outer-most portion of the standard cell array;
forming first proximity dummy bands by arranging a plurality of the first proximity dummy cells along each of at least some of the vertical sides of the standard cell array such that the upper and the lower sides of the frames of the plurality of first proximity dummy cells are in contact with each other and such that one of the left and the right sides of the frame of each of the plurality of first proximity dummy cells is in contact with a corresponding portion of the vertical sides of the standard cell array; and
forming second proximity dummy bands along each of at least some of the horizontal sides of the standard cell array by arranging a plurality of the second proximity dummy cells such that one of the upper and the lower sides of the frame of each of the plurality of second proximity dummy cells is in contact with a corresponding portion of the horizontal sides of the standard cell array.

2. The method according to claim 1, wherein the preparing prepares the same proximity dummy cell as both of the first and the second proximity dummy cells.

3. The method according to claim 1, wherein:
the forming of the standard cell array is performed such that at least one of the vertical sides of the standard cell array extends over an entire height of the standard cell array; and
the forming of the first proximity dummy bands is performed by arranging the plurality of first proximity dummy cells along an entire length of the at least one of the vertical sides of the standard cell array.

4. The method according to claim 1, wherein:
the forming of the standard cell array is performed such that at least one of the horizontal sides of the standard cell array extends over an entire width of the standard cell array; and
the forming of the second proximity dummy bands is performed by arranging the plurality of second proximity dummy cells along an entire length of the at least one of the horizontal sides of the standard cell array.

5. The method according to claim 1, wherein the forming of the first and the second proximity dummy bands are performed such that the first and the second proximity dummy bands surrounds an entirety of the outer perimeter of the standard cell array.

6. The method according to claim 1, wherein:
the preparing further prepares an auxiliary cell so that the preparing prepares the first and the second proximity dummy cells separately from the auxiliary cell; and
the forming of the standard cell array includes adjusting a length of at least one of the rows of the standard cells along the horizontal direction by arranging the auxiliary cell in addition to the standard cells.

7. The method according to claim 1, wherein:
the standard cell patterns include internal portions arranged within the standard cell frame and external portions arranged outside of the standard cell frame; and
the forming of the standard cell array is performed such that the external portions of the standard cell patterns in each of the standard cells arranged in the standard cell array merge with the internal portions of the standard cell patterns in adjacent ones of the standard cells arranged in the standard cell array.

8. The method according to claim 1, wherein:
each of the standard cells prepared in the library includes an N-well pattern in an N-well layer and a P-well pattern in a P-well layer arranged in the vertical direction;
the first proximity dummy cell includes a first dummy N-well pattern in the N-well layer and a first dummy P-well pattern in the P-well layer;
the second proximity dummy cell includes at least one of a second dummy N-well pattern in the N-well layer and a second dummy P-well pattern in the P-well layer;
the forming of the first proximity dummy bands is performed such that the first dummy N-well pattern and the first P-well dummy pattern in each of the plurality of first proximity dummy cells, which is arranged adjacent to one of the standard cells arranged in the outer-most portion of the standard cell array, merge with the N-well pattern and the P-well pattern, respectively, in the one of the standard cells; and
the forming of the second proximity dummy bands is performed such that the one of the second dummy N-well pattern and the second dummy P-well pattern in each of the plurality of second proximity dummy cells, which is arranged adjacent to one of the standard cells arranged in the outer-most portion of the standard cell array, merges with the one of the N-well pattern and the P-well pattern in the one of the standard cells.

9. The method according to claim 1, wherein:
each of the standard cells prepared in the library includes a pair of power-supply wiring patterns in a wiring layer extending along the upper and the lower sides, respectively, of the standard cell frame and passing through the standard cell frame in the horizontal direction;

the second proximity dummy cell includes a dummy power-supply wiring pattern in the wiring layer; and the forming of the second proximity dummy bands is performed such that the dummy power-supply wiring pattern in each of the plurality of second proximity dummy cells, which is arranged adjacent to one of the standard cells arranged in the outer-most portion of the standard cell array, merges with one of the pair of power-supply wiring patterns in the one of the standard cells.

10. The method according to claim 9, wherein:

each of the standard cells prepared in the library further includes a pair of active region patterns in an active layer underneath the respective power-supply wiring patterns, and contact patterns in a contact layer that connect the active region patterns with the respective power-supply wiring patterns, the contact patterns are arranged along the upper and the lower sides of the standard cell frame;

the second proximity dummy cell further includes dummy contact patterns in the contact layer; and the forming of the second proximity dummy bands is performed such that the contact patterns in each of the plurality of second proximity dummy cells, which is arranged adjacent to one or more of the standard cells arranged in the outer-most portion of the standard cell array, merge with the contact patterns of the one or more of the standard cells.

11. The method according to claim 1, wherein:

each of the standard cells prepared in the library includes a pair of power-supply wiring patterns in a wiring layer, a pair of active region patterns in an active layer underneath the respective power-supply wiring patterns, and contact patterns in a contact layer that connect the active region patterns with the respective power-supply wiring patterns; and the first and the second proximity dummy cells do not include a pattern in the contact layer.

12. The method according to claim 1, wherein:

the layout structure formed on the computer system is used to produce photomasks for forming the layout structure on a semiconductor substrate by utilization an optical proximity correction (OPC) ;

the standard cell patterns include, in the at least one of the plurality of layers, portions having dimensions that require the OPC; and the first and the second proximity dummy patterns have minimum dimensions that do not require the OPC.

13. The method according to claim 12, wherein:

the layout structure is formed on the semiconductor substrate by a photolithographic process using an exposing light having a wavelength of $\lambda$; and the first proximity dummy pattern includes a pattern extending in the vertical direction having a dimension in the horizontal direction not larger than about $\lambda$.

14. The method according to claim 1, further comprising:

preparing an outer dummy cell in the library, the outer dummy cell including an outer dummy pattern, which does not contribute to the logical function of the semiconductor integrated circuit and which is different from each of the first and the second proximity dummy patterns, in the at least one of the plurality of layers arranged in an outer dummy cell frame having an upper, a lower, a left, and a right side; and forming an outer dummy region outside of the standard cell array and the first and the second proximity dummy bands by arranging a plurality of the outer dummy cells in rows and columns, wherein:

each of the first plurality of types of standard cells has a width defined by a distance between the left and the right sides of the standard cell frame of $m_s$ times a unit width, where $m_s$ is an integer not less than one;

the outer dummy cell has a height defined by a distance between the upper and the lower sides of the outer dummy cell frame of $k_o$ times the common height of the standard cells, where $k_o$ is an integer not less than one, and a width defined by a distance between the left and right sides of the outer dummy cell frame of $m_o$ times the unit width of the standard cells, where $m_o$ is an integer not less than one.

15. A layout structure of a semiconductor integrated circuit, comprising:

a channel-less type standard cell array formed by arranging one or more of each of a plurality of types of standard cells having respective logical functions in rows and columns, an outer perimeter of the standard cell array having vertical and horizontal sides;

first proximity dummy bands formed by arranging a plurality of first proximity dummy cells along each of at least some of the vertical sides of the standard cell array; and second proximity dummy bands formed by arranging a plurality of second proximity dummy cells along each of at least some of the horizontal sides of the standard cell array; wherein:

each of the plurality of types of standard cells includes standard cell patterns in a plurality of layers arranged in a standard cell frame having an upper, a lower, a left, and a right side, the plurality of types of standard cells have a common height defined by distances between the upper and the lower sides of the standard cell frames;

each of the vertical and horizontal sides of the standard cell array is formed with the sides of the frames of the standard cells arranged in an outer-most portion of the standard cell array;

each of the first proximity dummy cells includes a first proximity dummy pattern, which does not contribute to a logical function of the semiconductor integrated circuit, in at least one of the plurality of layers arranged in a first proximity dummy cell frame having an upper, a lower, a left, and a right side, each of the first proximity dummy cells has a height defined by a distance between the upper and the lower sides of the first proximity dummy cell frame of $k_1$ times the common height of the standard cells, where $k_1$ is an integer not less than one;

each of the second proximity dummy cells includes a second proximity dummy pattern, which does not contribute to the logical function of the semiconductor integrated circuit, in the at least one of the plurality of layers arranged in a second proximity dummy cell frame having an upper, a lower, a left, and a right side;

each of the first proximity dummy bands is formed such that the upper and the lower sides of the frames of the plurality of first proximity dummy cells are in contact with each other and such that one of the left and right sides of the frame of each of the plurality of first proximity dummy cells is in contact with a corresponding portion of the vertical sides of the standard cell array; and each of the second proximity dummy bands is formed such that one of the upper and the lower sides of the frame of each of the plurality of second proximity dummy cells is in contact with a corresponding portion of the horizontal sides of the standard cell array.

16. The layout structure according to claim 15, wherein:
at least one of the vertical sides of the standard cell array extends over an entire height of the standard cell array; and
at least one of the first proximity dummy bands is formed by arranging the plurality of first proximity dummy cells along an entire length of the at least one of the vertical sides of the standard cell array.

17. The layout structure according to claim 15, wherein:
at least one of the horizontal sides of the standard cell array extends over an entire width of the standard cell array; and
at least one of the second proximity dummy bands is formed by arranging the plurality of second proximity dummy cells along an entire length of the at least one of the horizontal sides of the standard cell array.

18. The layout structure according to claim 15, wherein the first proximity dummy bands and the second proximity bands are formed such that the first and the second proximity dummy bands surround an entirety of the outer perimeter of the standard cell array.

19. The layout structure according to claim 15, wherein the standard cell array includes at least one auxiliary cell that adjusts a length of at least one of the rows of the standard cells along the horizontal direction, each of the first and the second proximity dummy cells is different from any of the at least one auxiliary cell.

20. The layout structure according to claim 15, wherein:
each of the standard cells includes a pair of power-supply wiring patterns in a wiring layer, a pair of active region patterns in an active layer underneath the respective power-supply wiring patterns, and contact patterns in a contact layer that connect the active region patterns with the respective power-supply wiring patterns; and
the first and the second proximity dummy cells do not include a pattern in the contact layer.

21. The layout structure according to claim 15, wherein:
the standard cells in the standard cell array are arranged such that the upper and the lower sides of the standard cell frames are in contact with imaginary horizontal grid lines arranged in the vertical direction with a pitch equal to the common height of the standard cells; and
each of the first proximity dummy bands is formed such that the upper and the lower sides of the frames of the plurality of first proximity dummy cells are in contact with the imaginary horizontal grid lines.

22. The layout structure according to claim 15, wherein:
the layout structure is formed on a semiconductor substrate by using a photolithographic process that utilizes an optical proximity correction (OPC) ;
the standard cell patterns include, in the at least one of the plurality of layers, portions having dimensions that require the OPC; and
the first and the second proximity dummy patterns have minimum dimensions that do not require the OPC.

23. The layout structure according to claim 22, wherein:
the photolithographic process uses an exposing light having a wavelength of $\lambda$; and
the first proximity dummy pattern includes a pattern extending in the vertical direction having a dimension in the horizontal direction not larger than about $\lambda$.

24. A photomask comprising a mask pattern for forming one of a plurality of layers in a layout structure of a semiconductor integrated circuit by producing a reduced image of the mask pattern on a semiconductor substrate using an exposing light having a wavelength of $\lambda$, the layout structure comprising:
a channel-less type standard cell array formed by arranging one or more of each of a plurality of types of standard cells having respective logical functions in rows and columns, an outer perimeter of the standard cell array having vertical and horizontal sides;
first proximity dummy bands formed by arranging a plurality of first proximity dummy cells along each of at least some of the vertical sides of the standard cell array; and
second proximity dummy bands formed by arranging a plurality of second proximity dummy cells along each of at least some of the horizontal sides of the standard cell array; wherein:
each of the plurality of types of standard cells includes standard cell patterns in the plurality of layers arranged in a standard cell frame having an upper, a lower, a left, and a right side, the plurality of types of standard cells have a common height defined by distances between the upper and the lower sides of the standard cell frames;
each of the vertical and horizontal sides of the standard cell array is formed with the sides of the frames of the standard cells arranged in an outer-most portion of the standard cell array;
each of the first proximity dummy cells includes a first proximity dummy pattern, which does not contribute to a logical function of the semiconductor integrated circuit, in at least one of the plurality of layers arranged in a first proximity dummy cell frame having an upper, a lower, a left, and a right side, each of the first proximity dummy cells has a height defined by a distance between the upper and lower sides of the first proximity dummy cell frame of $k_1$ times the common height of the standard cells, where $k_1$ is an integer not less than one;
each of the second proximity dummy cells includes a second proximity dummy pattern, which does not contribute to the logical function of the semiconductor integrated circuit, in the at least one of the plurality of layers arranged in a second proximity dummy cell frame having an upper, a lower, a left, and a right side;
each of the first proximity dummy bands is formed such that the upper and the lower sides of the frames of the plurality of first proximity dummy cells are in contact with each other and such that one of the left and the right sides of the frame of each of the plurality of first proximity dummy cells is in contact with a corresponding portion of the vertical sides of the standard cell array; and
each of the second proximity dummy bands is formed such that one of the upper and the lower sides of the frame of each of the plurality of second proximity dummy cells is in contact with a corresponding portion of the horizontal sides of the standard cell array.

25. The photomask according to claim 24, wherein an optical proximity correction (OPC) is performed for first portions of the mask pattern for forming the standard cell array in the layout structure, but is not performed for second portions of the mask pattern for forming the first and the second proximity dummy bands in the layout structure.

26. The photomask according to claim 25, wherein:
$\lambda$ is not longer than 248 nm; and
the OPC is performed for, within the first portions, third portions of the mask pattern for forming portions of the standard cell patterns having dimensions less than a critical dimension which is less than about $\lambda$.

27. The photomask according to claim 25, wherein minimum dimensions of the first and the second proximity dummy patterns are not larger than about $2\times\lambda$.

28. The photomask according to claim 25, wherein minimum dimensions of the first and the second proximity dummy patterns are not larger than about $\lambda$.

* * * * *